United States Patent
Nomura et al.

(10) Patent No.: US 8,053,980 B2
(45) Date of Patent: Nov. 8, 2011

(54) LIGHT-EMITTING DEVICE AND ELECTRONIC DEVICE

(75) Inventors: Ryoji Nomura, Kanagawa (JP); Satoshi Seo, Kanagawa (JP); Nobuharu Ohsawa, Kanagawa (JP); Tsunenori Suzuki, Kanagawa (JP); Sachiko Kawakami, Kanagawa (JP); Harue Osaka, Kanagawa (JP); Hideko Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 737 days.

(21) Appl. No.: 12/048,516

(22) Filed: Mar. 14, 2008

(65) Prior Publication Data

US 2008/0231177 A1    Sep. 25, 2008

(30) Foreign Application Priority Data

Mar. 23, 2007  (JP) .................................. 2007-077833

(51) Int. Cl.
*H01J 1/62* (2006.01)
*H01J 63/04* (2006.01)

(52) U.S. Cl. ........ 313/506; 313/504; 313/500; 313/505; 313/512

(58) Field of Classification Search .................. 313/504, 313/506, 512, 500, 505
See application file for complete search history.

(56) References Cited

U.S. PATENT DOCUMENTS

| | | | |
|---|---|---|---|
| 6,734,457 B2 | 5/2004 | Yamazaki et al. | |
| 6,803,720 B2 | 10/2004 | Kwong et al. | |
| 7,173,370 B2 | 2/2007 | Seo et al. | |
| 7,196,360 B2 | 3/2007 | Seo et al. | |
| 7,238,806 B2 | 7/2007 | Inoue et al. | |
| 7,239,081 B2 | 7/2007 | Tsutsui | |
| 7,339,317 B2 | 3/2008 | Yamazaki | |

(Continued)

FOREIGN PATENT DOCUMENTS

EP    1 565 041 A1    8/2005

(Continued)

OTHER PUBLICATIONS

Zhou, X. et al, "High-Efficiency Electrophosphorescent Organic Light-Emitting Diodes with Double Light-Emitting Layers," Applied Physics Letters, vol. 81, No. 21, Nov. 18, 2002, pp. 4070-4072.

(Continued)

*Primary Examiner* — Peter Macchiarolo
*Assistant Examiner* — Thomas A Hollweg
(74) *Attorney, Agent, or Firm* — Husch Blackwell LLP

(57) ABSTRACT

The present invention provides a light-emitting device includes first, second and third light-emitting elements, emitting light having different color. The first light-emitting element includes a first anode; a first cathode; and first and second light-emitting layers therebetween, wherein the first light-emitting layer includes a first high light-emitting substance and a first organic compound, and the second light-emitting layer includes the first high light-emitting substance and a second organic compound. The second light-emitting element includes a second anode; a second cathode; and a third light-emitting layer and a layer for controlling carrier transfer therebetween, wherein the third light-emitting layer includes a second high light-emitting substance, wherein the layer for controlling carrier transfer includes third and fourth organic compounds. The third light-emitting element includes a third anode; a third cathode; and a fourth light-emitting layer, wherein the fourth light-emitting layer includes fifth and sixth organic compounds, and a third high light-emitting substance.

19 Claims, 24 Drawing Sheets

U.S. PATENT DOCUMENTS

| | | | |
|---|---|---|---|
| 7,615,925 B2 * | 11/2009 | Suzuki et al. | 313/506 |
| 7,649,211 B2 * | 1/2010 | Ohsawa | 257/103 |
| 2002/0074935 A1 | 6/2002 | Kwong et al. | |
| 2002/0086180 A1 | 7/2002 | Seo et al. | |
| 2002/0093283 A1 | 7/2002 | Seo et al. | |
| 2002/0109136 A1 | 8/2002 | Seo et al. | |
| 2002/0113546 A1 | 8/2002 | Seo et al. | |
| 2002/0121860 A1 | 9/2002 | Seo et al. | |
| 2002/0139303 A1 | 10/2002 | Yamazaki et al. | |
| 2002/0155632 A1 | 10/2002 | Yamazaki et al. | |
| 2003/0010288 A1 | 1/2003 | Yamazaki et al. | |
| 2004/0154542 A1 | 8/2004 | Yamazaki et al. | |
| 2005/0100760 A1 | 5/2005 | Yokoyama | |
| 2005/0179378 A1 | 8/2005 | Oooka et al. | |
| 2005/0221121 A1 | 10/2005 | Ishihara et al. | |
| 2005/0221123 A1 * | 10/2005 | Inoue et al. | 428/690 |
| 2005/0233170 A1 | 10/2005 | Yamazaki | |
| 2005/0242715 A1 | 11/2005 | Inoue et al. | |
| 2005/0260440 A1 | 11/2005 | Seo et al. | |
| 2006/0043859 A1 | 3/2006 | Fukuoka et al. | |
| 2006/0063031 A1 | 3/2006 | Brown et al. | |
| 2006/0105201 A1 | 5/2006 | Lee et al. | |
| 2006/0158102 A1 | 7/2006 | Kawamura et al. | |
| 2006/0158104 A1 | 7/2006 | Iijima et al. | |
| 2006/0210828 A1 * | 9/2006 | Nakayama et al. | 428/690 |
| 2006/0243970 A1 | 11/2006 | Seo et al. | |
| 2007/0159083 A1 | 7/2007 | Matsuura et al. | |
| 2007/0161793 A1 | 7/2007 | Murata et al. | |
| 2007/0213527 A1 | 9/2007 | Inoue et al. | |
| 2008/0006821 A1 | 1/2008 | Suzuki et al. | |
| 2008/0007164 A1 * | 1/2008 | Suzuki et al. | 313/504 |
| 2008/0149923 A1 * | 6/2008 | Ohsawa et al. | 257/40 |

FOREIGN PATENT DOCUMENTS

| | | |
|---|---|---|
| EP | 1 670 083 A2 | 6/2006 |
| EP | 1 690 866 A1 | 8/2006 |
| EP | 1 718 122 A1 | 11/2006 |
| JP | 6-158038 | 6/1994 |
| JP | 2000-68057 | 3/2000 |
| JP | 2001-319779 | 11/2001 |
| JP | 2002-62824 | 2/2002 |
| JP | 2004-515895 | 5/2004 |
| JP | 2004-221045 | 8/2004 |
| JP | 2004-273163 | 9/2004 |
| JP | 2005-11734 | 1/2005 |
| JP | 2005-11735 | 1/2005 |
| JP | 2005-235403 | 9/2005 |
| JP | 2005-285708 | 10/2005 |
| JP | 2005-314414 | 11/2005 |
| JP | 2006-49057 | 2/2006 |
| JP | 2006-156888 | 6/2006 |
| JP | 3810789 | 8/2006 |
| WO | WO 02/47457 A2 | 6/2002 |
| WO | WO 2004/047499 A1 | 6/2004 |
| WO | WO 2005/054261 A1 | 6/2005 |
| WO | WO 2005/079118 A1 | 8/2005 |
| WO | WO 2006/043678 A1 | 4/2006 |
| WO | WO 2006/046678 A1 | 5/2006 |
| WO | WO 2006049334 A1 * | 5/2006 |
| WO | WO 2006/059512 A1 | 6/2006 |

OTHER PUBLICATIONS

Meerheim, R. et al, "Highly Efficient Organic Light Emitting Diodes (OLED) for Displays and Lighting," Proc. of SPIE, vol. 6192, 2006, pp. 61920P-1-61920P-16.

Lee, G.Y. et al, "Fabrication of Highly Efficient and Stable Doped Red Organic Light-Emitting Device Using 2-Methyl-9, 10-di(2-napthyl)Anthracene and Tris(8-Hydroxyquinolinato)Aluminum as Cohost Materials," Applied Physics Letters, vol. 89, No. 18, Nov. 2, 2006, pp. 183515-1-183515-3.

European Search Report re application No. EP 08004409.2, dated Nov. 4, 2009.

Baldo, M.A. et al., "Highly Efficient Phosphorescent Emission from Organic Electroluminescent Devices," Nature, vol. 395, 1998, pp. 151-154.

Baldo, M.A. et al., "Very High-Efficiency Green Organic Light-Emitting Devices Based on Electrophosphorescence," Applied Physics Letters, vol. 75, No. 1, 1999, pp. 4-6.

Nishi, T. et al., "High Efficiency TFT-OLED Display with Iridium-Complex as Triplet Emissive Center," Proceedings of the 10th International Workshop on Inorganic and Organic Electroluminescence (EL '00), 2000, pp. 353-356.

Chung, H.K. et al., "Designing AMOLEDs for Mobile Displays," Information Display, vol. 21, No. 12, 2005, pp. 22-26.

Thompson, M.E. et al., "Phosphorescent Materials and Devices," Proceedings of the 10th International Workshop on Inorganic and Organic Electroluminescence (EL '00), 2000, pp. 35-38.

Seo, S. et al., "P-132: Long-Lived Deeply Red Phosphorescent OLEDs Based on Electrochemically Stable Ir Complexes," 2005 SID International Symposium Digest of Technical Papers, vol. 36, 2005, pp. 806-809.

D'Andrade, B.W. et al., "White Light Emission Using Triplet Excimers in Electrophosphorescent Organic Light-Emitting Devices," Advanced Materials, vol. 14, No. 15, 2002, pp. 1032-1036.

Ma, Y. et al., "Electroluminescence From Triplet Metal-Ligand Charge-Transfer Excited State of Transition Metal Complexes," Synthetic Metals, vol. 94, 1998, pp. 245-248.

Tsuboi, T. et al. "Temperature Dependence of Photoluminescence Decay Time of Ir(ppy)3," IEICE Trans. Electron., vol. E87-C, No. 12, 2004, pp. 2028-2032.

Tao, X.T. et al., "Metal Complex Polymer for Second Harmonic Generation and Electroluminescence Application," Applied Physics Letters, vol. 70, No. 12, Mar. 24, 1997, pp. 1503-1505.

Tsutsui, T. et al., "High Quantum Efficiency in Organic Light-Emitting Devices with Iridium-Complex as a Triplet Emissive Center," Japanese Journal of Applied Physics, vol. 38, Part 2, No. 12B, Dec. 15, 1999, pp. L1502-L1504.

Adachi, C. et al., "High-Efficiency Red Electrophosphorescence Devices," Applied Physics Letters, vol. 78, No. 11, Mar. 12, 2001, pp. 1622-1624.

Goldsmith, C. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Seo, S. et al., "64.4: High-Performance OLEDS Based on a New Class of IR Complexes Bearing Pyrazine Structures in Their Ligands," SID Digest '07 : SID International Symposium Digest of Technical Papers, 2007, pp. 1776-1779.

Onishi.T. et al., "Method of Measuring an Energy Level," *High Molecular EL Materials—Development of Light-Emitting High Molecular Compounds*, Kyoritsu Shuppan, 2004, pp. 64-67 (with English translation, pp. 1-3).

International Search Report re application No. PCT/JP2007/060940, dated Aug. 21, 2007.

Written Opinion re application No. PCT/JP2007/060940, dated Aug. 21, 2007.

International Search Report re application No. PCT/JP2007/072699, dated Feb. 19, 2008.

Written Opinion re application No. PCT/JP2007/072699, dated Feb. 19, 2008.

\* cited by examiner

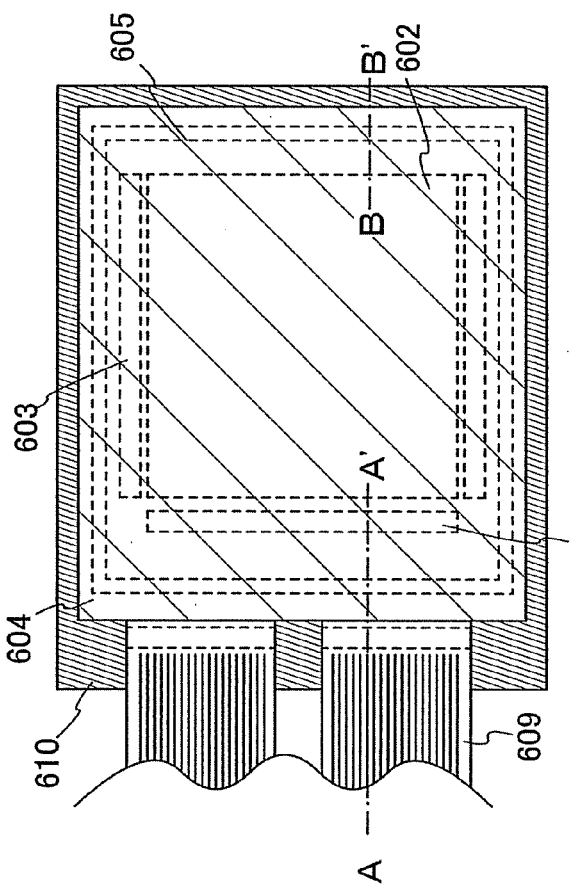
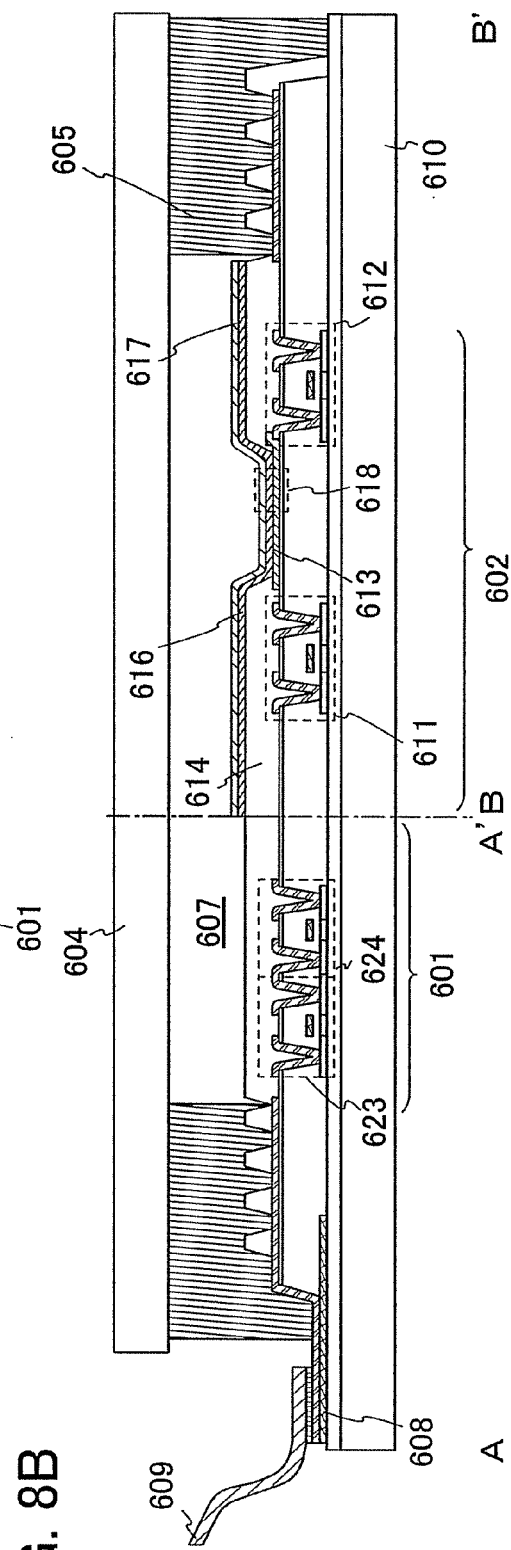
FIG. 8A
FIG. 8B

LIGHT-EMITTING DEVICE AND ELECTRONIC DEVICE

BACKGROUND OF THE INVENTION

1. Field of the Invention

The present invention relates to light-emitting devices and electronic devices having a light-emitting element which utilizes electroluminescence.

2. Description of the Related Art

In recent years, research and development have been actively conducted on light-emitting elements using electroluminescence. In a basic structure of such a light-emitting element, a layer including a substance having a light-emitting property (also referred to as a light-emitting substance) is interposed between a pair of electrodes. By voltage application to this element, light emission can be obtained from the substance having a light-emitting property.

Since such light-emitting elements is of self-light-emitting type, it is considered that the light-emitting elements have advantages over liquid crystal display devices in that visibility of pixels is high, backlight is not required, and so on and is therefore suitable as flat panel display elements. In addition, other advantages of such light-emitting elements are that the elements can be manufactured to be thin and lightweight and the response speed is very high.

Since such light-emitting elements can be formed into a film shape, plane light emission can be easily obtained by forming a large-area element. This is a feature which is difficult to be obtained by point light sources typified by an incandescent lamp and an LED or linear light sources typified by a fluorescent lamp. Accordingly, the light-emitting element is extremely effective for use as a planar light source applicable to illumination and the like.

Light-emitting elements using electroluminescence are classified broadly according to whether they use an organic compound or an inorganic compound as a substance having a light-emitting property.

When an organic compound is used as a light-emitting substance, electrons and holes are injected into a layer including a light-emitting organic compound from a pair of electrodes by voltage application to a light-emitting element, so that current flows therethrough. The electrons and holes (i.e., carriers) are recombined, and thus the light-emitting organic compound is excited. The light-emitting organic compound returns to a ground state from the excited state, thereby emitting light. Based on this mechanism, such a light-emitting element is called current excitation type light-emitting element.

It is to be noted that the excited state generated by an organic compound can be a singlet excited state or a triplet excited state, and luminescence from the singlet excited state is referred to as fluorescence, and luminescence from the triplet excited state is referred to as phosphorescence.

In improving element characteristics of such a light-emitting element, there are a lot of problems which depend on a material used, and in order to solve the problems, improvement of an element structure, development of a material, and the like have been carried out.

For example, when a light-emitting element is used as a display element, performance of a display device may be damaged, unfortunately, because characteristics of the light-emitting element for each color are different.

In order to solve the problem, Reference 1 (Japanese Published Patent Application No. 2002-62824) discloses a light-emitting device in which a triplet compound is used for a light-emitting layer of an EL element which emits red light, and singlet compounds are used for a light-emitting layer of an EL element which emits green light and a light-emitting layer of an EL element which emits blue light.

SUMMARY OF THE INVENTION

However, there is room for improvement in characteristics of a light-emitting device, and it is expected to develop a light-emitting device having excellent characteristics.

Therefore, it is an object of the present invention to provide light-emitting devices having excellent characteristics. Further, it is another object of the present invention to provide electronic devices having such light-emitting elements having excellent characteristics.

An aspect of the present invention is a light-emitting device for multiple-color display, which includes a plurality of light-emitting elements whose emission color is different from each other and in which structures including light-emitting layers of the light-emitting elements for respective colors are different from each other.

Specifically, in a light-emitting device for color display, a light-emitting element which emits blue light (hereinafter, also referred to as a light-emitting element for blue color or a blue-light-emitting element) preferably has a structure as described below.

The present inventors have found that a substantial light-emitting region of a light-emitting layer in a blue-light-emitting element is set in the vicinity of the center of the light-emitting layer. In other words, a light-emitting layer is constituted by combination of layers having different carrier transport properties so that the light-emitting region is set in the vicinity of the center of the light-emitting layer, instead of at the interface between the light-emitting layer and a hole-transporting layer or at the interface between the light-emitting layer and an electron-transporting layer, so that a blue-light-emitting element having long lifetime can be obtained.

Therefore, a preferable structure is as follows: a first light-emitting layer and a second light-emitting layer are provided between an anode and a cathode; the first light-emitting layer includes a first organic compound, and an organic compound having a hole-transporting property; the second light-emitting layer includes the first organic compound, and an organic compound having an electron-transporting property; and the first light-emitting layer is in contact with the anode side of the second light-emitting layer.

Further, another preferable structure is as follows: a first light-emitting layer and a second light-emitting layer are provided between an anode and a cathode; the first light-emitting layer includes a first organic compound, and an organic compound having a hole-transporting property; the highest occupied molecular orbital level (HOMO level) of the organic compound having a hole-transporting property is greater than or equal to −6.0 eV and less than or equal to −5.0 eV, and the lowest unoccupied molecular orbital level (LUMO level) of the organic compound having a hole-transporting property is greater than or equal to −3.0 eV and less than or equal to −2.0 eV; the second light-emitting layer includes the first organic compound, and an organic compound having an electron-transporting property; the highest occupied molecular orbital level (HOMO level) of the organic compound having an electron-transporting property is greater than or equal to −6.0 eV and less than or equal to −5.0 eV, and the lowest unoccupied molecular orbital level (LUMO level) of the organic compound having an electron-transporting property is greater than or equal to −3.0 eV and less than or equal to −2.0 eV; and the first light-emitting layer is in contact with the anode side of the second light-emitting layer.

Another preferable structure is as follows: a first light-emitting layer and a second light-emitting layer are formed between an anode and a cathode; the first light-emitting layer includes a first organic compound, and an organic compound having a hole-transporting property; the second light-emitting layer includes the first organic compound and an organic compound having an electron-transporting property; the first light-emitting layer is in contact with the anode side of the second light-emitting layer; and the organic compound having a hole-transporting property and the organic compound having an electron-transporting property are each preferably one of a tricyclic condensed aromatic compound, a tetracyclic condensed aromatic compound, a pentacyclic condensed aromatic compound, and a hexacyclic condensed aromatic compound.

Another preferable structure is as follows: a first light-emitting layer and a second light-emitting layer are provided between an anode and a cathode; the first light-emitting layer includes a first organic compound, and an organic compound having a hole-transporting property; the second light-emitting layer includes the first organic compound and an organic compound having an electron-transporting property; the first light-emitting layer is in contact with the anode side of the second light-emitting layer; the difference between the highest occupied molecular orbital level of the organic compound having a hole-transporting property and the highest occupied molecular orbital level of the organic compound having an electron-transporting property is 0.3 eV or less; and the difference between the lowest unoccupied molecular orbital level of the organic compound having a hole-transporting property and the lowest unoccupied molecular orbital level of the organic compound having an electron-transporting property is 0.3 eV or less.

Another preferable structure is as follows: a first light-emitting layer and a second light-emitting layer are provided between an anode and a cathode; the first light-emitting layer includes a first organic compound and an organic compound having a hole-transporting property; the second light-emitting layer includes the first organic compound, and an organic compound having an electron-transporting property; the first light-emitting layer is in contact with the anode side of the second light-emitting layer; and in the organic compound having a hole-transporting property and the compound having an electron-transporting property, oxidation reaction and reduction reaction are reversible.

Another preferable structure is as follows: a first light-emitting layer and a second light-emitting layer are formed between an anode and a cathode; the first light-emitting layer includes a first organic compound and an organic compound having a hole-transporting property; the second light-emitting layer includes the first organic compound and an organic compound having an electron-transporting property; the first light-emitting layer is in contact with the anode side of the second light-emitting layer; and the organic compound having a hole-transporting property and the compound having an electron-transporting property are anthracene derivatives.

More preferably in the above structure, the difference between the highest occupied molecular orbital level of the organic compound having a hole-transporting property and the highest occupied molecular orbital level of the organic compound having an electron-transporting property is 0.1 eV or less, and the difference between the lowest unoccupied molecular orbital level of the organic compound having a hole-transporting property and the lowest unoccupied molecular orbital level of the organic compound having an electron-transporting property is 0.1 eV or less.

Moreover, a light-emitting element which emits green light (hereinafter, also referred to as a light-emitting element for green color or a green-light-emitting element) preferably has a structure as described below.

As a result of diligent study, the present inventors have found that changes over time in carrier balance can be suppressed by provision of a layer for controlling carrier transfer by trapping carriers. The present inventors have also found that a long-lifetime light-emitting element can be obtained by the provision of such a layer.

Thus, a preferable structure is as follows: a light-emitting layer and a layer for controlling carrier transfer are provided between an anode and a cathode; the layer for controlling carrier transfer includes a third organic compound and a fourth organic compound; the layer for controlling carrier transfer is provided between the light-emitting layer and the cathode; the third organic compound is an organic compound having an electron-transporting property; the fourth organic compound is an organic compound having an electron-trapping property; and the third organic compound is included more than the fourth organic compound in the layer for controlling carrier transfer.

In addition, a specific value which exhibits an electron-trapping property is preferably 0.3 eV or deeper in trapping depth. That is to say, another preferable structure is as follows: a light-emitting layer and a layer for controlling carrier transfer are provided between an anode and a cathode; the layer for controlling carrier transfer includes a third organic compound and a fourth organic compound; the layer for controlling carrier transfer is formed between the light-emitting layer and the cathode; the third organic compound has an electron-transporting property; the lowest unoccupied molecular orbital level of the fourth organic compound is lower than the lowest unoccupied molecular orbital level of the third organic compound by 0.3 eV or more; and the third organic compound is included more than the fourth organic compound in the layer for controlling carrier transfer.

In the above structures, the light-emitting layer preferably has an electron-transporting property. For example, preferably, the light-emitting layer includes a substance having a high light-emitting property (also referred to as a high light-emitting substance) and a seventh organic compound, the seventh organic compound is included more than the substance having a high light-emitting property, and the seventh organic compound has an electron-transporting property. In addition, preferably, the substance having a high electron-transporting property and the third organic compound are different compounds from each other.

In the above structures, the third organic compound is preferably a metal complex.

In addition, in the above structures, the fourth compound is preferably a coumarin derivative.

In the above structures, the thickness of the layer for controlling carrier transfer is preferably from 5 nm to 20 nm, inclusive.

In the above structures, the layer for controlling carrier transfer and the light-emitting layer are preferably in contact with each other.

Furthermore, the present inventors have found that an energy gap of the substance having an electron-trapping property is made larger than an energy gap of a light-emitting substance, so that light emission from the substance having an electron-trapping property can be prevented and the light-emitting element can have excellent color purity.

Another preferable structure is as follows: a light-emitting layer and a layer for controlling carrier transfer are formed between an anode and a cathode; the light-emitting layer includes a substance having a high light-emitting property; the layer for controlling carrier transfer includes a third organic compound and a fourth organic compound; the layer for controlling carrier transfer is provided between the light-emitting layer and the cathode; the third organic compound is an organic compound having an electron-transporting property; the fourth organic compound is an organic compound having an electron-trapping property; the third organic compound is included more than the fourth organic compound in the layer for controlling carrier transfer; and an energy gap of the fourth organic compound is larger than an energy gap of the substance having a high light-emitting property.

In addition, a specific value which exhibits an electron trapping property is preferably 0.3 eV or deeper in trapping depth. Therefore, another preferable structure is as follows: a light-emitting layer and a layer for controlling carrier transfer are provided between an anode and a cathode; the light-emitting layer includes a substance having a high light-emitting property; the layer for controlling carrier transfer includes a third organic compound and a fourth organic compound; the layer for controlling carrier transfer is formed between the light-emitting layer and the cathode; the third organic compound has an electron-transporting property; the lowest unoccupied molecular orbital level of the fourth organic compound is lower than the lowest unoccupied molecular orbital level of the third organic compound by 0.3 eV or more; the third organic compound is included more than the fourth organic compound in the layer for controlling carrier transfer; and an energy gap of the fourth organic compound is larger than an energy gap of the substance having a high light-emitting property.

Further, light-emitting elements which emit visible light of blue to red are effective for wide variety of applications, such as display devices. Since the fourth organic compound has a higher energy gap than that of visible light, light-emission from the fourth organic compound can be prevented, so that the light-emitting element can have excellent color purity. Accordingly, in the above light-emitting element, the energy gap of the fourth organic compound is preferably 3.0 eV or higher. In addition, when light emission of the fourth organic compound is in a region of ultraviolet to purple, energy can transfer to the light-emitting substance even if the fourth organic compound is excited; accordingly, the light-emitting element can have excellent color purity Therefore, in the above light-emitting element, the emission peak of the wavelength of the fourth organic compound is preferably in the range of from 350 nm to 450 nm, inclusive. Therefore, it is more preferable that the energy gap of the fourth organic compound is 3.0 eV or more and the emission peak wavelength is in the range of from 350 nm to 450 nm, inclusive.

In the above light-emitting element, when the light-emitting layer has an electron-transporting property, an effect of long lifetime is remarkable in particular. Therefore, in the light-emitting element, the light-emitting layer preferably has an electron-transporting property, more preferably, the light-emitting layer includes a substance having a high light-emitting property and a seventh organic compound, the seventh organic compound is included more than the light-emitting substance, and the seventh organic compound has an electron-transporting property. Also at this time, in order to avoid rise of driving voltage, the seventh organic compound preferably has not only an electron-transporting property but also a hole-accepting property. In view of this, the seventh organic compound is preferably an anthracene derivative.

In addition, the effect of excellent color purity is remarkable when the layer for controlling carrier transfer and the light-emitting layer are in contact with each other. Therefore, in the light-emitting element, the layer for controlling carrier transfer and the light-emitting layer are preferably arranged to be in contact with each other.

Note that the third organic compound has an electro-transporting property, and the third organic compound is preferably a metal complex in terms of electric stability and appropriate electron-transporting property.

In addition, the present inventors have found that a quinoxaline derivative is particularly preferable as a substance which satisfies the condition of the fourth organic compound. Therefore, in the light-emitting element, the fourth organic compound is preferably a quinoxaline derivative. The quinoxaline derivative is preferably 2,3-diphenylquinoxaline derivative, in terms of chemical stability. Further, among 2,3-diphenylquinoxaline derivatives, in particular, 2,3,2'3'-tetraphenyl-6,6'-biquinoxaline derivative, which has a relatively high molecular weight and high heat resistance, is preferable.

As for the 2,3,2'3'-tetraphenyl-6,6'-biquinoxaline derivative, the present inventors have found that a 2,3,2'3'-tetraphenyl-6,6'-biquinoxaline derivative whose phenyl group is substituted by an electron-withdrawing group (a fluoro group, a cyano group, a trifluoromethyl group, a nitro group, an acyl group, an acyloxy group or the like) has a relatively high electron-trapping property and molecular weight. Therefore, in the light-emitting element, the fourth organic compound is preferably a quinoxaline derivative represented by a general formula (G101).

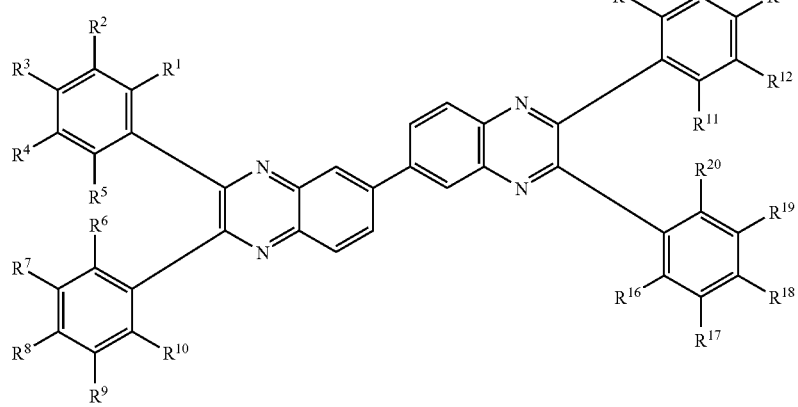

In the formula, at least one of $R^1$ to $R^{20}$ is any of a fluoro group, a cyano group, a trifluoromethyl group, a nitro group, an acyl group, and an acyloxy group, and the others are hydrogen.

In particular, among quinoxaline derivatives represented by the general formula (G101), a quinoxaline derivative represented by a general formula (G102) is preferable. Therefore, in the light-emitting element, the fourth organic compound is preferably a quinoxaline derivative represented by the general formula (G102).

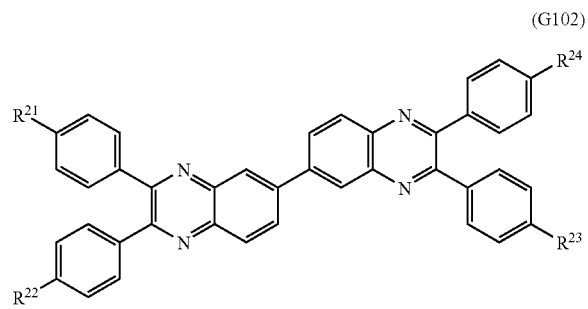

(G102)

In the formula, at least one of $R^{21}$ to $R^{24}$ is any of a fluoro group, a cyano group, a trifluoromethyl group, a nitro group, an acyl group and an acyloxy group, and the others are hydrogen.

In the general formula (G102), a case is preferable in which $R^{21}$ to $R^{24}$ are all substituted, since a high electron-trapping property is obtained. In other words, preferably, $R^{21}$ to $R^{24}$ independently represent at least one of a fluoro group, a cyano group, a trifluoromethyl group, a nitro group, an acyl group and an acyloxy group. Furthermore, a case is more preferable for synthesis, in which $R^{21}$ to $R^{24}$ independently represent at least one of a fluoro group, a cyano group, a trifluoromethyl group, a nitro group, an acyl group and an acyloxy group, and $R^{21}$ to $R^{24}$ are all the same substituent.

Further, since the layer for controlling carrier transfer has an electron-trapping property, a driving voltage is increased if the thickness is too large, on the other hand, if the thickness is too small, the effect of long lifetime is little. Therefore, in the above light-emitting element, the thickness of the layer for controlling carrier transfer is preferably from 5 nm to 20 nm, inclusive.

Moreover, a light-emitting element which emits red light (hereinafter, also referred to as a light-emitting element for red color or a red-light-emitting element) preferably has a structure as described below.

As a result of diligent study, the present inventors have found that in a red-light-emitting element, a light-emitting layer includes both a hole-transporting compound and an electron-transporting compound, and thus the red-light-emitting element can have long lifetime.

A preferable structure is as follows: a light-emitting layer is provided between an anode and a cathode; the light-emitting layer includes a fifth organic compound, a sixth organic compound, and a substance having a high light-emitting property; the fifth organic compound is an organic compound having a hole-transporting property; the sixth organic compound is an organic compound having an electron-transporting property; and the third substance having a high light-emitting property is a substance which emits phosphorescence.

More specifically, a preferable structure is as follows: a light-emitting layer is formed between an anode and a cathode; the light-emitting layer including a fifth organic compound, a sixth organic compound, and an organometallic complex; the fifth organic compound is an organic compound having a hole-transporting property; the sixth organic compound is an organic compound having an electron-transporting property; a ligand of the organometallic complex is a ligand having a pyrazine skeleton; and a central metal of the organometallic complex is an element belonging to Group 9 or an element belonging to Group 10.

Another preferable structure is as follows: a light-emitting layer is formed between an anode and a cathode; the light-emitting layer includes a fifth organic compound, a sixth organic compound, and an organometallic complex; the fifth organic compound is an organic compound having a hole-transporting property; the sixth organic compound is an organic compound having an electron-transporting property; a ligand of the organometallic complex is a 2-arylpyrazine derivative; and a central metal of the organometallic complex is an element belonging to Group 9 or an element belonging to Group 10.

As the above 2-arylpyrazine derivative, a 2-phenylpyrazine derivative is preferable. Thus, a structure is preferred in which a light-emitting layer is provided between an anode and a cathode, the light-emitting layer includes a fifth organic compound, a sixth organic compound, and an organometallic complex. The fifth organic compound has a hole-transporting property, and the sixth organic compound has an electron-transporting property. A ligand of the organometallic complex is a 2-phenylpyrazine derivative, and a central metal of the organometallic complex is an element belonging to Group 9 or an element belonging to Group 10.

For the 2-arylpyrazine derivative, in particular, a 2,5-diphenylpyrazine derivative is preferable. Thus, a structure is preferred in which a light-emitting layer is formed between an anode and a cathode; the light-emitting layer includes a fifth organic compound, a sixth organic compound, and an organometallic complex; the fifth organic compound is an organic compound having a hole-transporting property; the sixth organic compound is an organic compound having an electron-transporting property; a ligand of the organometallic complex is a 2,5-diphenylpyrazine derivative; and a central metal of the organometallic complex is an element belonging to Group 9 or an element belonging to Group 10.

Note that in the above structures, the central metal is preferably iridium or platinum in terms of emission efficiency. In particular, iridium is preferable since iridium can provide extremely high efficiency.

The organometallic complex using the 2,5-diphenylpyrazine derivative as a ligand is preferably an organometallic complex having a structure represented by the following general formula (G1). Thus, a structure is preferable in which a light-emitting layer is provided between an anode and a cathode; the light-emitting layer includes a fifth organic compound, a sixth organic compound and an organometallic complex. The fifth organic compound has a hole-transporting property, the sixth organic compound has an electron-transporting property, and the organometallic complex has a structure represented by a general formula (G1).

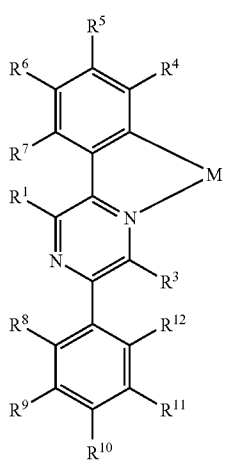

(G1)

In the formula, $R^1$ represents either an alkyl group or a phenyl group. $R^3$ represents either hydrogen or an alkyl group. $R^4$ to $R^{12}$ independently represent hydrogen, an alkyl group, a halogen group, a haloalkyl group, an alkoxy group, or an alkoxycarbonyl group. M is a central metal, and represents either an element belonging to Group 9 or an element belonging to Group 10.

Specifically, the organometallic complex having a structure represented by the general formula (G1) is an organometallic complex represented by a general formula (G2). Thus, a structure is preferable in which a light-emitting layer is provided between an anode and a cathode; the light-emitting layer includes a fifth organic compound, a sixth organic compound, and an organometallic complex. The fifth organic compound has a hole-transporting property, the sixth organic compound has an electron-transporting property, and the organometallic complex is an organometallic complex represented by the general formula (G2).

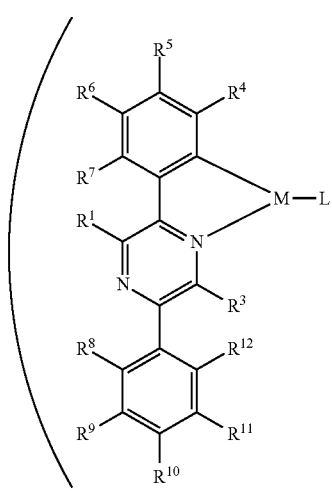

(G2)

In the formula, $R^1$ represents either an alkyl group or a phenyl group. $R^3$ represents either hydrogen or an alkyl group. $R^4$ to $R^{12}$ independently represent hydrogen, an alkyl group, a halogen group, a haloalkyl group, an alkoxy group, or an alkoxycarbonyl group. M is a central metal, and represents either an element belonging to Group 9 or an element belonging to Group 10. In addition, L is a monoanionic ligand. When the M is an element belonging to Group 9, n is 2 (n=2) and when the M is an element belonging to Group 10, n is 1 (n=1).

In addition, in the above general formulae (G1) to (G2), the M is preferably iridium or platinum in terms of emission efficiency. In particular, iridium is preferable since iridium can provide extremely high efficiency.

In the above light-emitting elements, the fifth organic compound is preferably an aromatic amine compound or a carbazole derivative. The sixth organic compound is preferably a heteroaromatic compound or a metal complex. More preferably, the fifth organic compound is an aromatic amine compound or a carbazole derivative, and the sixth organic compound is a heteroaromatic compound or a metal complex.

In the above light-emitting elements, an amount of the fifth organic compound and/or an amount of the sixth organic compound is/are preferably larger than that of the organometallic complex. In other words, the fifth organic compound and/or the sixth organic compound preferably function as a host of the organometallic complex. More preferably, an amount of the organometallic complex in the light-emitting layer is greater than or equal to 1 percent by mass and less than or equal to 10 percent by mass.

In the above light-emitting elements, the ratio between the fifth organic compound and the sixth organic compound is also important. Therefore, the mass ratio of the sixth organic compound to the fifth organic compound is preferably greater than or equal to 1/20 to less than or equal to 20. In particular, the mass ratio of the sixth organic compound to the fifth organic compound is preferably greater than or equal to 1 to less than or equal to 20.

The above structures of the present invention are made in view of a strong electron-trapping property of the organometallic complexes. Thus, in the above light-emitting elements, a LUMO level of the organometallic complex is deeper than a LUMO level of the fifth organic compound and a LUMO level of the sixth organic compound by 0.2 eV or more.

Note that the "light-emitting device" in this specification includes image display devices, light-emitting devices, and light sources (including illumination devices). In addition, a module in which a connector, for example, an FPC (Flexible Printed Circuit), TAB (Tape Automated Bonding) tape, or a TCP (Tape Carrier Package), is attached to a panel where a light-emitting element is formed; a module in which a printed circuit board is provided ahead of a TAB tape or a TCP; and a module in which an integrated circuit (IC) is directly mounted on a light-emitting element by a COG (Chip On Glass) method are all included in the "light-emitting device".

Furthermore, electronic devices having light-emitting devices of the present invention are also included in the sprit of the present invention.

Since a light-emitting device of the present invention has a suitable structure for a light-emitting element for each color, the light-emitting device can have excellent characteristics.

Thus, by applying a light-emitting device of the present invention, electronic devices having excellent characteristics can be provided.

BRIEF DESCRIPTION OF THE DRAWINGS

In the accompanying drawings:

FIGS. 8A and 8B show a light-emitting device according to an aspect of the present invention;

DETAILED DESCRIPTION OF THE INVENTION

Hereinafter, Embodiment Modes will now be explained in detail with reference to the accompanied drawings. It is easily understood by those skilled in the art that modes and details disclosed herein can be modified in various ways without departing from the spirit and scope of the present invention. Therefore, the present invention should not be interpreted as being limited to the description of the embodiment modes to be given below.

Note that in this specification, the term "composition" indicates not only a state in which two materials are simply mixed, but also a state in which a plurality of materials are mixed and thus charge transfer is conducted between the plurality of materials.

Embodiment Mode 1

One mode of a light-emitting device of the present invention will now be described with reference to FIG. 1.

A light-emitting device of the present invention includes a plurality of light-emitting elements that have an emission color which is different from each other. Each light-emitting element has a plurality of layers between a pair of electrodes. In this specification, the plurality of layers formed between the pair of electrodes are collectively referred to as an EL layer.

Figure 1:
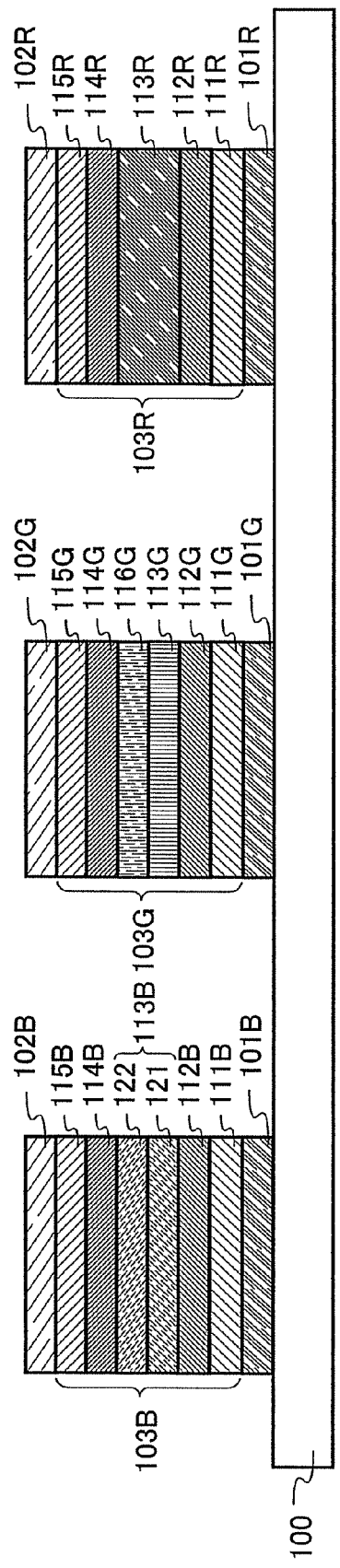
FIG. 1 illustrates a light-emitting device according to an aspect of the present invention.

In FIG. 1, a substrate 100 is used as a support of the light-emitting element. The substrate 100 can be glass, plastic or the like, for example. Any material that can serve as a support of the light-emitting element can be used, in addition to the above materials.

In this embodiment mode, the light-emitting element includes a first electrode, a second electrode, and an EL layer provided between the first electrode and the second electrode. Note that description is made below, on the assumption that the first electrode serves as an anode and the second electrode serves as a cathode. In other words, description is made below, on the assumption that light is emitted when voltage is applied to the first electrode and the second electrode such that a potential of the first electrode is higher than that of the second electrode.

A structure of each light-emitting element will now be described.

<Blue-Light-Emitting Element>

An anode 101B is preferably formed of a metal, an alloy, an electrically conductive compound, a mixture thereof, or the like each having a high work function (specifically, a work function of 4.0 eV or higher). Specifically, for example, indium oxide-tin oxide (ITO: Indium Tin Oxide), indium oxide-tin oxide including silicon or silicon oxide, indium oxide-zinc oxide (IZO: Indium Zinc Oxide), indium oxide including tungsten oxide and zinc oxide (IWZO), and the like are given. Films of these conductive metal oxides are generally formed by sputtering; however, a sol-gel method or the like may also be used. For example, indium oxide-zinc oxide (IZO) can be formed by a sputtering method using a target in which 1 to 20 wt % of zinc oxide with respect to indium oxide is included. Moreover, indium oxide (IWZO) including tungsten oxide and zinc oxide can be formed by a sputtering method using a target in which 0.5 to 5 wt % of tungsten oxide and 0.1 to 1 wt % of zinc oxide with respect to indium oxide are included. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride (TiN)), or the like can be used.

When a layer including a composite material which will be described later is used as a layer in contact with the anode 101B, the anode 101B can be formed using a wide variety of metals, alloys, electrically conductive compound, a mixture of them, or the like regardless of their work functions. For example, aluminum (Al), silver (Ag), an aluminum alloy (e.g., AlSi), or the like can be used. Besides, an element belonging to Group 1 or 2 of the periodic table which has a low work function, i.e., alkali metals such a lithium (Li) and cesium (Cs) and alkaline earth metals such as magnesium (Mg), calcium (Ca), and strontium (Sr); alloys of them (e.g., MgAg and AlLi); rare earth metals such as europium (Eu) and ytterbium (Yb); alloys of them; and the like can also be used. A film made of an alkali metal, an alkaline earth metal, or an alloy of them can be formed by a vacuum evaporation method. Further, a film made of an alloy including an alkali metal or an alkaline earth metal can be formed by a sputtering method. It is also possible to deposit a silver paste or the like by an inkjet method or the like.

There are no particular limitations on the stacked structure of the EL layer 103B, and layers formed of a substance with a high electron-transporting property, a substance with a high hole-transporting property, a substance with a high electron-injecting property, a substance with a high hole-injecting property, a bipolar substance (a substance with high electron-transporting and hole-transporting properties) and/or the like may be combined with a light-emitting layer of this embodiment mode as appropriate. For example, a hole-injecting layer, a hole-transporting layer, a light-emitting layer, an electron-transporting layer, an electron-injecting layer, and/or the like can be combined as appropriate to constitute the EL layer 103B. Specific materials to form each of the layers will be given below.

A hole-injecting layer 111B is a layer including a substance having a high hole-injecting property. As the substance with a high hole-injecting property, molybdenum oxide, vanadium oxide, ruthenium oxide, tungsten oxide, manganese oxide, or the like may be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonic acid) (PEDOT/PSS), or the like to form the hole-injecting layer.

Further, as the hole-injecting layer, a composite material of a substance with a high hole-transporting property containing an acceptor substance can be used. It is to be noted that, by using such a substance with a high hole-transporting property containing an acceptor substance, a material used to form an electrode may be selected regardless of its work function. In other words, besides a material with a high work function, a material with a low work function may also be used as the anode 101. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable since it is stable in the air and its hygroscopic property is low and is easily treated.

As a substance having a high hole-transporting property which can be used for the composite material, various compounds such as an aromatic amine compound, carbazole derivatives, aromatic hydrocarbon, and a high molecular compound (such as oligomer, dendrimer, or polymer) can be used. The substance having a high hole-transporting property which can be used for the composite material is preferably a substance having a hole mobility of $10^{-6}$ cm$^2$/Vs or higher.

However, other substances than the above described substances may also be used as long as the substances have higher hole-transporting properties than electron-transporting properties. Organic compounds which can be used for the composite material will be specifically shown below.

For example, the following can be given as the aromatic amine compound which can be used for the composite material: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As carbazole derivatives which can be used for the composite material, the following can be given specifically: 3-[N-(9-phenylcarbazol-3-yl)-N-phenylamino]-9-phenylcarbazole (abbreviation: PCZPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, as carbazole derivatives which can be used for the composite material, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthracenyl)phenyl]-9H-carbazole (abbreviation: CZPA); 1,4-bis[4-(N-carbazolyl)phenyl]-2,3,5,6-tetraphenylbenzene; or the like can also be used.

As aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. In particular, the aromatic hydrocarbon which has a hole mobility of $1 \times 10^{-6}$ cm$^2$/Vs or higher and which has 14 to 42 carbon atoms is particularly preferable.

The aromatic hydrocarbon which can be used for the composite material may have a vinyl skeleton. As aromatic hydrocarbons having a vinyl group, the following are given as examples: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

For the hole-injecting layer 111B, high molecular compounds (e.g., oligomer, dendrimer, or polymer) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine (abbreviation: Poly-TPD). Further, high molecular compounds mixed with acid such as poly(3,4- ethylenedioxythiophene)/poly(styrenesulfonic acid) (PEDOT/PSS) and polyaniline/poly(styrenesulfonic acid) (PAni/PSS) can also be used.

Note that it is also possible to form the hole-injecting layer 111B using a composite material which is formed from the above-described high molecular compound such as PVK, PVTAP, PTPDMA, or Poly-TPD and the above-described substance having an acceptor property.

A hole-transporting layer 112B is a layer containing a substance having a high hole-transporting property. As a substance having a high hole-transporting property, the following aromatic amine compounds can be used: aromatic amine compounds such as 4,4'-bis[N-(1-naphthyl)-N-phenylamino]biphenyl (abbreviation: NPB or α-NPD), N,N'-bis(3-methylphenyl)-N,N'-dipheny-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation MTDATA), N,N'-bis(spiro-9,9'-bifluoren-2-yl)-N,N'-diphenylbenzidine (abbreviation BSPB). The substances described here are mainly substances having a hole mobility of $10^{-6}$ cm$^2$/Vs or higher. Further, other substances may also be used as long as the hole-transporting properties thereof are higher than the electron-transporting properties thereof. Note that the layer containing a substance having a high hole-transporting property is not limited to a single layer but may have a stacked structure of two or more layers made of the above-described substances.

Further, the hole-transporting layer 112B may also be formed with high molecular compounds such as PVK, PVTPA, PTPDMA, and Poly-TPD.

The light-emitting layer 113B is a layer including a substance having a high light-emitting property. In the light-emitting element described in this embodiment mode, the light-emitting layer includes a first light-emitting layer 121 and a second light-emitting layer 122. The first light-emitting layer 121 includes a first organic compound having a high light-emitting property and an organic compound having a hole-transporting property, and the second light-emitting layer 122 includes the first organic compound having a high light-emitting property and an organic compound having an electron-transporting property. The first light-emitting layer is provided on the anode side, in other words, on the anode side of the second light-emitting layer.

The first organic compound is a substance having a high light-emitting property, and various materials can be used. Specifically, materials can be used, such as 4-(9H-carbazol-9-yl)-4'-(10-phenyl-9-anthryl)triphenylamine (abbreviation: YGAPA), 4,4'-(2-tert-butylanthracen-9,10-diyl)bis{N-[4-(9H-carbazol-9-yl)phenyl]-N-phenylaniline}(abbreviation: YGABPA), N,9-diphenyl-N-[4-(10-phenyl-9-anthryl) phenyl]-9H-carbazol-3-amine (abbreviation: PCAPA), N,N''-(2-tert-butylanthracene-9,10-diyldi-4,1-phenylene)bis[N,N',N'-triphenyl-1,4-phenylenediamine] (abbreviation: DPABPA), N,N'-bis[4-(9H-carbazol-9-yl)phenyl]-N,N-diphenylstilbene-4,4'diamine (abbreviation: YGA2S), N-[4-(9H-carbazol-9-yl)phenyl]-N-phenylstilbene-4-amine (abbreviation: YGAS), N,N'-diphenyl-N,N'-bis(9-phenylcarbazol-3-yl)stilbene-4,4'-diamine (abbreviation: PCA2S), 4,4'-bis(2,2-diphenylvinyl)biphenyl (abbreviation: DPVBi), 2,5,8,11-tetra(tert-butyl)perylene (abbreviation: TBP), perylene, rubrene, 1,3,6,8-tetraphenylpyrene or the like.

The organic compound having a hole-transporting property included in the first light-emitting layer 121 is a substance which exhibits a hole-transporting property higher than an electron-transporting property. The organic compound having an electron-transporting property included in the second light-emitting layer 122 is a substance which exhibits an electron-transporting property higher than a hole-transporting property.

Figure 2:
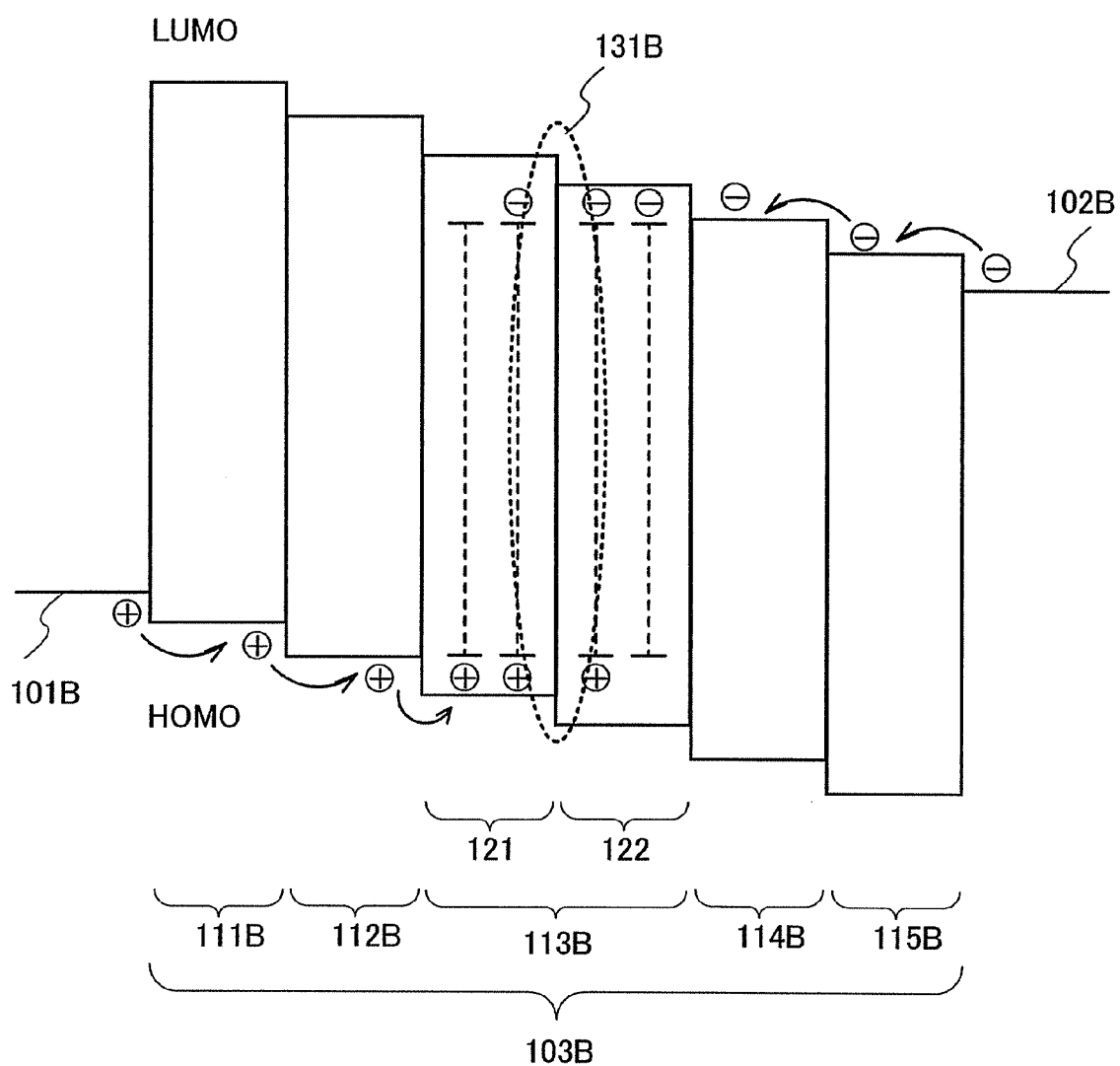
FIG. 2 illustrates a light-emitting device according to an aspect of the present invention.

Here, FIG. 2 illustrates an example of a band diagram of the blue-light-emitting element illustrated in FIG. 1. In FIG. 2, holes injected from the anode 101B are injected into the first light-emitting layer 121 through the hole-injecting layer 111B and the hole-transporting layer 112B. The holes injected into the first light-emitting layer 121 are transported through the first light-emitting layer 121 and further, into the second light-emitting layer 122. Here, the organic compound having an electron-transporting property included in the second light-emitting layer 122 is a substance which exhibits an electron-transporting layer higher than a hole-transporting layer, and thus, the holes injected into the second light-emitting layer 122 are difficult to move. Consequently, a large number of holes are present near the interface between the first light-emitting layer 121 and the second light-emitting layer 122. In addition, occurrence of a phenomenon in which holes and electrons reach an electron-transporting layer 114B without being recombined can be suppressed.

On the other hand, electrons injected from the cathode 102B are injected into the second light-emitting layer 122 through the electron-injecting layer 115B and the electron-transporting layer 114B. The electrons injected into the second light-emitting layer 122 are transported through the second light-emitting layer 122, and further, injected into the first light-emitting layer 121. Here, the organic compound having a hole-transporting property included in the first light-emitting layer 121 is a substance which exhibits a hole-transporting property higher than an electron-transporting property, and thus, the electrons injected into the first light-emitting layer 121 are difficult to move. Consequently, a large number of electrons are present near the interface between the first light-emitting layer 121 and the second light-emitting layer 122. In addition, occurrence of a phenomenon in which holes and electrons reach the hole-transporting layer 112B without being recombined can be suppressed.

As described above, a large number of holes and electrons are present in a region in the vicinity of the interface between the first light-emitting layer 121 and the second light-emitting layer 122, so that the degree of recombination can be increased in the vicinity of the interface. In other words, a light-emitting region 131B is formed in the vicinity of the center of the light-emitting layer 113B. As a result, occurrence of a phenomenon in which holes reaches the electron-transporting layer 113 and electrons reach the hole-transporting layer 112B without being recombined can be suppressed, so that reduction in the degree of recombination can be prevented. Thus, the reduction of carrier balance over time can be prevented, which leads to increase of reliability.

In order that holes and electrons are injected into the first light-emitting layer 121, it is necessary that the organic compound having a hole-transporting property is an organic compound which can be oxidized and reduced. Thus, the highest occupied molecular orbital level (HOMO level) of the organic compound having a hole-transporting property is preferably greater than or equal to −6.0 eV and less than or equal to −5.0 eV. In addition, the lowest unoccupied molecular orbital level (LUMO level) of the organic compound having a hole-transporting property is preferably greater than or equal to −3.0 eV and less than or equal to −2.0 eV.

Similarly, in order that holes and electrons are injected into the second light-emitting layer 122, it is necessary that the organic compound having an electron-transporting property is an organic compound which can be oxidized and reduced. Thus, the highest occupied molecular orbital level (HOMO level) of the organic compound having an electron-transporting property is preferably greater than or equal to −6.0 eV and less than or equal to −5.0 eV. In addition, the lowest unoccupied molecular orbital level (LUMO level) of the organic compound having an electron-transporting property is preferably greater than or equal to −3.0 eV and less than or equal to −2.0 eV.

As the measuring method of the highest occupied molecular orbital level (HOMO level) and the lowest unoccupied molecular orbital level (LUMO level), there is a calculation method using the cyclic voltammetry (CV) measurement. Further, the ionization potential in a thin film state is measured with a photoelectron spectroscopy device and the HOMO level can be calculated. Then, the LUMO level can be calculated from the result and an energy gap obtained from an absorption spectrum in a thin film state.

As such an organic compound which can be oxidized and reduced, a tricyclic condensed aromatic compound, a tetracyclic condensed aromatic compound, a pentacyclic condensed aromatic compound, and a hexacyclic condensed aromatic compounds are given. Specifically, an anthracene derivative, a phenanthrene derivative, a pyrene derivative, a chrysene derivative, a dibenzo[g,p]chrysene derivative, and the like are given. For example, as a compound having a hole-transporting property which can be used for the first light-emitting layer, 9,10-diphenylanthracene (abbreviation: DPAnth), N,N-diphenyl-9-[4-(10-phenyl-9-anthryl)phenyl]-9H-carbazol-3-amine (abbreviation: CZA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), 6,12-dimethoxy-5,11-diphenylchrysene, N,N,N',N',N'',N'',N''',N'''-octaphenyldibenzo[g,p]chrysene-2,7,10,15-tetraamine, and the like are given. As an compound having an electron-transporting property which can be used for the second light-emitting layer, 9-[4-(10-phenyl-9-antryl)phenyl]-9H-carbazole (abbreviation: CZPA), 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3) and the like can be given.

As described above with reference to FIG. 2, the light-emitting element described in this embodiment mode is structured such that holes are injected into the second light-emitting layer 122 from the first light-emitting layer 121. Thus, the difference between the highest occupied molecular orbital level (HOMO level) of the organic compound having a hole-transporting property and the highest occupied molecular orbital level (HOMO level) of the organic compound having an electron-transporting property is preferably small. Further, the light-emitting element is structured such that electrons are injected into the first light-emitting layer 121 from the second light-emitting layer 122. Thus, the difference between the lowest unoccupied molecular orbital level (LUMO level) of the organic compound having a hole-transporting property and the lowest unoccupied molecular orbital level (LUMO level) of the organic compound having an electron-transporting property is preferably small. If the difference between the highest occupied molecular orbital level (HOMO level) of the organic compound having a hole-transporting property and the highest occupied molecular orbital level (HOMO level) of the organic compound having an electron-transporting property is large, the light-emitting region comes closely to the first light-emitting layer side or the second light-emitting layer side. Similarly, if the difference between the lowest unoccupied molecular orbital (LUMO) level of the organic compound having a hole-transporting property and the lowest unoccupied molecular orbital (LUMO) level of the organic compound having an electron-transporting property is large, the light-emitting region comes closely to the first light-emitting layer side or the second light-emitting layer side. Accordingly, the difference between the highest occupied molecular orbital level (HOMO level) of the organic compound having a hole-transporting property and the highest occupied molecular orbital level (HOMO level) of the organic compound having an electron-transporting property is preferably 0.3 eV or less, more preferably, 0.1 eV. In addition, the difference between the lowest unoccupied molecular orbital (LUMO) level of the organic compound having a hole-transporting property and the lowest unoccupied molecular orbital (LUMO) level of the organic compound having an electron-transporting property is 0.3 eV or less, more preferably, 0.1 eV or less.

Further, the light-emitting element provides light emission by recombination of electrons and holes, and thus, the organic compound used in the light-emitting layer 113B is preferably stable even when an oxidative reaction and a reductive reaction are repeated. In other words, the organic compound preferably has reversible oxidation reduction characteristics. In particular, the organic compound having a hole-transporting property and the organic compound having an electron-transporting property are preferably stable even when an oxidative reaction and a reductive reaction are repeated. It can be confirmed by employing the cyclic voltammetry (CV) measurement whether the organic compounds are stable or not when an oxidative reaction and a reductive reaction are repeated.

Specifically, when an oxidative reaction and a reductive reaction are repeated in the CV measurement, changes of an oxidation peak potential ($E_{pa}$) in the oxidative reaction of the organic compound and a reduction peak potential ($E_{pc}$) in the reductive reaction are observed, thereby confirming whether the organic compounds are stable or not when the oxidative reaction and the reductive reaction are repeated. The number of repetition of the oxidative reaction and the reductive reaction is preferably large; however, when the reactions are repeated 50 to 200 times, substantial stability can be estimated. In the measurement like this, in the organic compound having a hole-transporting property and the organic compound having an electron-transporting property used for the light-emitting layer 113B, the changes in the intensity of the oxidation peak potential and the intensity of the reduction peak potential are preferably smaller than 50%, more preferably less than 30%. In other words, for example, the peak intensity of 50% or higher is preferably kept even when the oxidation peak potential decreases. More preferably, a peak intensity of 70% or higher is kept. In addition, the changes of the values of the oxidation peak potential and the reduction peak potential are preferably 0.05 V or lower. More preferably, the changes are 0.02 V or lower.

As an organic compound which can be stable even when an oxidative reaction and a reductive reaction are repeated, in other words, an organic compound which has reversible oxidation reduction characteristics, an anthracene derivative, is preferable, in particular. As an example of the organic compound having a hole-transporting property included in the first light-emitting layer 121, specifically, 9,10-diphenylanthracene (abbreviation: DPAnth), N,N-diphenyl-9-[4-(10- phenyl-9-antryl)phenyl]-9H-carbazol-3-amine (abbreviation: CzA1PA), 4-(10-phenyl-9-antryl)triphenylamine (abbreviation: DPhPA), N,9-diphenyl-N-[4-(10-phenyl-9-antryl)phenyl]-9H-carbazol-3-amine (abbreviation: PCAPA), N,9-diphenyl-N-{4-[4-(10-phenyl-9-antryl)phenyl]phenyl}-9H-carbazol-3-amine (abbreviation: PCAPBA), and the like can be given. As an example of the organic compound having an electron-transporting property included in the second light-emitting layer 122, specifically, 9-[4-(10-phenyl-9-antryl)phenyl]-9H-carbazole (abbreviation: CZPA), 3,6-diphenyl-9-[4-(10-phenyl-9-antryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9,9'-bianthryl (abbreviation: BANT), and the like are given. Such anthracene derivatives are preferable, since such anthracene derivatives are stable even when the oxidative reaction and the reductive reaction are repeated.

The same substance is used for the substance having a high light-emitting property included in the first light-emitting layer and the substance having a high light-emitting property included in the second light-emitting layer, thereby making it possible to emit light in the vicinity of the center of the light-emitting layer. On the other hand, if different substances having high light-emitting properties are used for the first light-emitting layer and the second light-emitting layer, there is a possibility that light is emitted from only one of the first light-emitting layer and the second light-emitting layer. If light is emitted from only one layer, it is difficult to emit light in the vicinity of the center of the light-emitting layer. Further, if the first layer and the second layer are formed using different substances having high light-emitting properties, the substances having high light-emitting properties both emit light, and thus, light emission having an excellent color purity cannot be obtained. In addition, there is a possibility that the color of the light emission is changed. Therefore, the substance having a high light-emitting property included in the first light-emitting layer and the substance having a high light-emitting property included in the second light-emitting layer are preferably the same.

The materials of the first light-emitting layer and the second light-emitting layer which serve as a light-emitting layer can be selected and combined as appropriate in view of the above perspective.

The electron-transporting layer 114B is a layer that contains a substance with a high electron-transporting property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here mainly are substances each having an electron mobility of $10^{-6}$ cm$^2$/Vs or higher. The electron-transporting layer may be formed of other materials than those described above as long as the substances have electron-transporting properties higher than hole-transporting properties. Furthermore, the electron-transporting layer is not limited to a single layer, and two or more layers made of the aforementioned substances may be stacked.

As the electron-transporting layer 114B, a high-molecular compound can be used. For example, poly[(9,9-dihexylfluorene-2,7-diyl)-co-(pyridin-3,5-diyl)] (abbreviation: PF-Py) or poly[(9,9-dioctyllfluorene-2,7-diyl)-co-(2,2'-pyridin-6,6'-diyl)] (abbreviation: PF-BPy) can be used.

In addition, an electron-injecting layer 115B may be provided. As the electron-injecting layer 115B, an alkali metal compound, or an alkaline earth metal compound such as lithium fluoride (LiF), cesium fluoride (CsF), or calcium fluoride (CaF$_2$) may be used. Further, a layer formed by combination of a substance having an electron-transporting property with an alkali metal or an alkaline earth metal can be used. For example, Alq which contains magnesium (Mg) may be used. By using a layer formed by combination of a substance having an electron-transporting property with an alkali metal or an alkaline earth metal as the electron-injecting layer, electron injection from the cathode 102B is performed efficiently, which is preferable.

The cathode 102B can be formed of a metal, an alloy, an electrically conductive compound, or a mixture of these, having a low work function (specifically, a work function of 3.8 eV or lower). As a typical example of such a cathode material, an element belonging to Group 1 or 2 in the periodic table, i.e., an alkali metal such as lithium (Li) or cesium (Cs), or an alkaline earth metal such as magnesium (Mg), calcium (Ca), or strontium (Sr); an alloy containing any of these (such as MgAg or AlLi); a rare earth metal such as europium (Er) or ytterbium (Yb); an alloy containing such a rare earth metal; or the like can be used. A film made of an alkali metal, an alkaline earth metal, or an alloy of them can be formed by a vacuum evaporation method. Further, a film made of an alloy of an alkali metal or an alkaline earth metal can be formed by a sputtering method. It is also possible to deposit a silver paste or the like by an inkjet method or the like.

When the electron-injecting layer 115B is provided between the cathode 102B and the electron-transporting layer 114B, the cathode 102B can be formed using various conductive materials such as Al, Ag, ITO, and indium tin oxide containing silicon or silicon oxide, regardless of their work functions. Further, such conductive materials can be deposited by a sputtering method, an ink-jet method, a spin coating method, or the like.

In the light-emitting element as described above, a light-emitting region is formed in the vicinity of the center of the light-emitting layer, without being formed at the interface between the light-emitting layer and the hole-transporting layer or at the interface between the light-emitting layer and the electron-transporting layer. Thus, there are almost no influences which would be caused when the light-emitting region is adjacent to the hole-transporting layer or the electron-transporting layer. Therefore, a light-emitting element having a longer lifetime which deteriorates less, can be obtained. In addition, the light-emitting layer of the light-emitting element as described above is formed using a compound which is stable even when an oxidative reaction and a reductive reaction are repeated, and thus, is difficult to deteriorate even when light emission by recombination of electrons and holes is repeated. Accordingly, a light-emitting element having a longer lifetime can be obtained.

<Green-Light-Emitting Element>

An anode 101G can have a similar structure to the anode 101B. The anode 101G may be formed using the same material as the anode 101B or a different material from the anode 101B. In the case where the anode 101G is formed using the same material as the anode 101B, a light-emitting device can be formed without increasing the number of steps, which is preferable.

There is no particular limitation on the stacked structure of the EL layer 103G, and layers formed of a substance with s high electron-transporting property, a substance with a high hole-transporting property, a substance with a high electron-injecting property, a substance with a high hole-injecting property, a bipolar substance (a substance with high electron-transporting and hole-transporting properties) and/or the like may be combined with a layer for controlling carrier transfer and a light-emitting layer shown in this embodiment mode as appropriate. For example, a hole-injecting layer, a hole-transporting layer, a light-emitting layer, an electron-transporting layer, an electron-injecting layer, and/or the like can be combined as appropriate to constitute the EL layer 103G. Specific materials to form each of the layers will be given below.

A hole-injecting layer 111G can have a similar structure to the hole-injecting layer 111B. The hole-injecting layer 111G may be formed using the same material as the hole-injecting layer 111B or a different material from the hole-injecting layer 111B. In the case where the hole-injecting layer 111G is formed using the same material as the hole-injecting layer 111B, a light-emitting device can be formed without increasing the number of steps, which is preferable.

A hole-transporting layer 112G can have a similar structure to the hole-transporting layer 112B. The hole-transporting layer 112G may be formed using the same material as the hole-transporting layer 112B or a different material from the hole-transporting layer 112B. In the case where the hole-transporting layer 112G is formed using the same material as the hole-transporting layer 112B, a light-emitting device can be formed without increasing the number of steps, which is preferable.

The light-emitting layer 113G is a layer including a high light-emitting substance, and can be formed using a variety of materials. As a light-emitting material which exhibits greenish light emission, the following can be used: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis (1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like.

Note that in this embodiment mode, a layer 116G for controlling carrier transfer is provided between the light-emitting layer 113G and the cathode 102G, the light-emitting layer 113G preferably has an electron-transporting property. Conventionally, when the light-emitting layer has an electron-transporting property, an electron-blocking layer is provided between the light-emitting layer and an anode in order to prevent electrons from passing through the light-emitting layer. However, when the electron-blocking layer deteriorates over time, a recombination region expands to the inside of the electron-blocking layer (or inside of the hold-transporting layer), which would result in a significant decrease in current efficiency (i.e., luminance decay). Meanwhile, in the present invention, the movement of electrons is controlled before the electrons reach the light-emitting layer (between the light-emitting layer and the cathode). Therefore, even if the balance of electrons is somewhat lost, the proportion of recombination in the light-emitting layer hardly changes, which is advantageous in that luminance does not easily decay.

Note that the light-emitting layer 113G may also have a structure in which the above-described light-emitting substance is dispersed in another substance. Various types of substances can be used for a material for dispersing the light-emitting substance, and it is preferable to use a substance whose lowest unoccupied molecular orbital (LUMO) level is higher than that of the light-emitting substance and whose highest occupied molecular orbital (HOMO) level is lower than that of the light-emitting substance.

Note that in this embodiment mode, the light-emitting layer 113G preferably has an electron-transporting property because the layer 116G for controlling the movement of carriers is provided between the light-emitting layer 113G and the cathode 102G. That is, the electron-transporting property of the light-emitting layer 113G is preferably higher than the hole-transporting property thereof. Therefore, the above-described material in which the high light-emitting substance is dispersed is preferably an organic compound having an electron-transporting property. Specifically, the following metal complexes can be used: tris(8-quinolinolato)aluminum (III) (abbreviation: Alq), tris(4-methyl-8-quinolinolato)aluminum(III) (abbreviation: Almq$_3$), bis(10-hydroxybenzo[h]-quinolinato)beryllium(II) (abbreviation: BeBq$_2$), bis(2-methyl-8-quinolinolato)(4-phenylphenolato)aluminum(III) (BAlq), bis(8-quinolinolato)zinc(II) (abbreviation: Znq), bis[2-(2-benzoxazolyl)phenolato]zinc(II) (Abbreviation: ZnPBO), and bis[2-(2-benzothiazolyl)phenolato]zinc(II) (abbreviation: Zn(BTZ)$_2$). Further, the following heterocyclic compounds can also be used: 2-(4-biphenylyl)-5-(4-tert-butylphenyl)-1,3,4-oxadiazole (abbreviation: PBD), 1,3-bis [5-(4-tert-buthylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP). Alternatively, the following condensed aromatic compounds can also be used: 9-[4-(10-phenyl-9-anthryl)phenyl]-9H-carbazole (abbreviation: CZPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), and 3,3',3"-(benzene-1,3,5-triyl)tripyrene (abbreviation: TPB3).

As a material in which the light-emitting substance is dispersed, a plurality of kinds of materials can be used. For example, a substance for controlling the crystallization of rubrene or the like can be further added in order to control the crystallization. In addition, NPB, Alq, or the like can be further added in order to efficiently transfer energy to the light-emitting substance.

When a structure in which a high light-emitting substance is dispersed in another compound is employed, the crystallization of the light-emitting layer 113G can be suppressed. Further, concentration quenching which results from the high concentration of the high light-emitting substance can also be suppressed.

Further, high molecular compounds can be used for the light-emitting layer 113G. As a light-emitting material which exhibits greenish light emission, the following can be used: poly(p-phenylenevinylene) (abbreviation: PPV), poly[(9,9-dihexylfluorene-2,7-diyl)-alt-co-(benzo[2,1,3]thiadiazol-4, 7-diyl)] (abbreviation: PFBT), poly[(9,9-dioctylfluorene-2, 7-divinylenefluorenylene)-alt-co-(2-methoxy-5-(2-ethylhexyloxy)-1,4-phenylene)], and the like.

The layer 116G for controlling carrier transfer includes two or more types of substances. In this embodiment mode, the layer 116G for controlling carrier transfer includes a third organic compound and a fourth organic compound, and the third organic compound is included more than the fourth organic compound in the layer 116G for controlling carrier transfer.

The layer 116G for controlling carrier transfer is formed closer to the cathode 102G than the light-emitting layer 113G, and thus the third organic compound is a compound having an electron-transporting property. In other words, the third organic compound is preferably a substance whose electron-transporting property is higher than its hole-transporting property. Typically, the following can be used: metal complexes such as Alq, Almq$_3$, BeBq$_2$, BAlq, Znq, BAlq, ZnPBO, and ZNBTZ; heterocyclic compounds such as PBD, OXD-7, TAZ, TPBI, BPhen, and BCP; and condensed aromatic compounds such as CzPA, DPCzPA, DPPA, DNA, t-BuDNA, BANT, DPNS, DPNS2, and TPB3. Further, the following high molecular compounds can also be used: poly[(9,9-dihexylfluorene-2,7-diyl)-co-(pyridin-3,5-diyl)] (abbreviation: PF-Py) and poly[(9,9-dioctyllfluorene-2,7-diyl)-co-(2,2'-bipyridine-6,6'-diyl)] (abbreviation: PF-BPy). Above all, metal complexes are preferably used in terms of electric stability (in particular, stability against electrons). In addition, the LUMO level of the fourth organic compound is preferably lower than the LUMO level of the third organic compound by 0.3 eV or more. Thus, depending on the type of the fourth organic compound used, the third organic compound may be selected as appropriated so as to satisfy the condition. For example, when DPQd or coumarin 6 is used as the fourth organic compound, Alq is used as the third organic compound, and at this time, the condition is satisfied.

The fourth organic compound is a compound having a function of trapping electrons. Specifically, the fourth organic compound is preferably an organic compound having a LUMO level which is lower than a LUMO level of the third organic compound by 0.3 eV or more. Since the fourth organic compound is included, the electron transfer speed of the whole layer is smaller than that of a layer including only the first organic compound. In other words, by addition of the fourth organic compound, the electron transfer can be controlled. Further, the concentration of the fourth organic compound is controlled so that the carrier transfer speed can be controlled.

It is preferable that the emission colors of the light-emitting layer 113G and the fourth organic compound be similar colors. Accordingly, the difference between a peak value of an emission spectrum of the substance having a high light-emitting property and a peak value of an emission spectrum of the fourth organic compound is preferably 30 nm or less. When the difference is 30 nm or less, emission color of the substance having a high light-emitting property and emission color of the fourth organic compound are similar colors. Accordingly, even in a case where the fourth organic compound emits light due to change in voltage or the like, change in emission color of the light-emitting element can be suppressed. However, the fourth organic compound has no necessity to emit light. For example, in a case where emission efficiency of the substance having a high light-emitting property is higher than that of the fourth organic compound, the concentration of the fourth organic compound in the layer 116G for controlling carrier transfer is preferably adjusted so that only light emitted from the substance having a high light-emitting property is substantially obtained (the concentration is slightly lowered so that light emission from the fourth organic compound is suppressed). In this case, emission color of the substance having a high light-emitting property and emission color of the fourth organic compound are similar colors (that is, the substance having a high light-emitting property and the fourth organic compound have almost the same energy gap). Accordingly, energy transfer from the substance having a high light-emitting property to the fourth organic compound does not easily occur, and thus high emission efficiency is obtained.

For example, when the organic compound contained in the light-emitting layer 113G is an organic compound which exhibits greenish light emission such as 2PCAPA, 2PCABPhA, 2DPAPA, 2DPABPhA, 2YGABPhA, or DPhAPhA, the fourth organic compound is preferably a compound which exhibits light emission in the range of bluish green to yellowish green such as N,N'-dimethylquinacridone (abbreviation: DMQd), N,N'-diphenylquinacridone (abbreviation: DPQd), 9,18-dihydro-benzo[h]benzo[7,8]quino[2,3-b]acridine-7, 16-dione (abbreviation: DMNQd-1), 9,18-dihydro-9,18-dimethyl-benzo[h]benzo[7,8]quino[2,3-b]acridine-7,16-dione (abbreviation: DMNQd-2), coumarin 30, coumarin 6, coumarin 545T, or coumarin 153. Note that the above compounds are compound having lower LUMO levels among compounds used in light-emitting elements, and when any of the above compounds is added to the third organic compound described later, it exhibits excellent electron-trapping property.

Note that among the above compounds exemplarily illustrated for the fourth organic compound, quinacridone derivatives such as DMQd, DPQd, DMNQd-1, and DMNQd-2 are chemically stable and thus preferable. That is, when quinacridone derivatives are used, the lifetime of the light-emitting element can be particularly prolonged. In addition, since quinacridone derivatives exhibit greenish light emission, the element structure of the light-emitting element is particularly effective for a light-emitting element of a greenish color. A green color requires the highest level of luminance in forming a full-color display, and there are cases where the deterioration speed of a green-light-emitting element is faster than those of light-emitting elements for other colors. However, such a problem can be ameliorated by applying the present invention.

Note that the fourth organic compound is preferably coumarin derivatives such as coumarin 102, coumarin 6H, coumarin 480D, coumarin 30, coumarin 6, coumarin 545T, and coumarin 153. Coumarin derivatives have low electron trapping properties. Therefore, the concentration of the fourth organic compound added into the third organic compound may be relatively high. That is, the concentration of the fourth organic compound can easily be controlled, and thus a layer for controlling carrier transfer which has desired properties can easily be obtained. Further, since coumarin derivatives have high luminous efficiency, decrease in luminous efficiency of the entire light-emitting element can be suppressed when the fourth organic compound emits light.

In order to keep color purity of the light-emitting element, it is also possible that the energy gap of the fourth organic compound included in the layer 116G for controlling carrier transfer is made larger than the energy gap of the substance having high light-emitting property included in the light-emitting layer 113G. Since the energy gap of the fourth organic compound is larger than the energy gap of the high light-emitting substance included in the light-emitting layer 113G, emission color of the fourth organic compound is not mixed and emission from the high light-emitting substance can be obtained; therefore, the light-emitting element has excellent color purity.

An energy gap which is larger than that of visible light is preferable for the energy gap of the fourth organic compound. Thus, the energy gap of the fourth organic compound is preferably 3.0 eV or more. In particular, the energy gap is preferably larger than that of green light. In addition, when emission of the fourth organic compound is light in ultraviolet to purple, energy can transfer to the high light-emitting substance included in the light-emitting layer 113G even if the fourth organic compound is excited; accordingly, the light-emitting element can have excellent color purity. Therefore, the emission peak of the wavelength of the fourth organic compound is preferably in the range of from 350 nm to 450 nm, inclusive.

As the fourth organic compound having such an energy gap described above, a quinoxaline derivative is preferable in particular. The quinoxaline derivative is preferably 2,3-diphenylquinoxaline derivative, in terms of chemical stability. For example, 2,3-diphenylquinoxaline (abbreviation: DPQ), 2,3-bis(4-fluorophenyl)quinoxaline (abbreviation: FDPQ), 2,3-bis (4-trifluoromethylphenyl)quinoxaline (abbreviation: $CF_3$-DPQ), and the like are given.

Further, among 2.3-diphenylquinoxaline derivatives, in particular, 2,3,2'3'-tetraphenyl-6,6'-biquinoxaline derivative, which has a relatively high molecular weight and high heat resistance, is preferable. As specific examples, in addition to 2,3,2',3'-tetraphenyl-6,6'-biquinoxaline (abbreviation: DPQ2), a quinoxaline derivative represented by the general formula (G101) is given.

eral formula (G101) has relatively high electron-trapping property and molecular weight.

In particular, among quinoxaline derivatives represented by the general formula (G101), a quinoxaline derivative represented by a general formula (G102) is preferable.

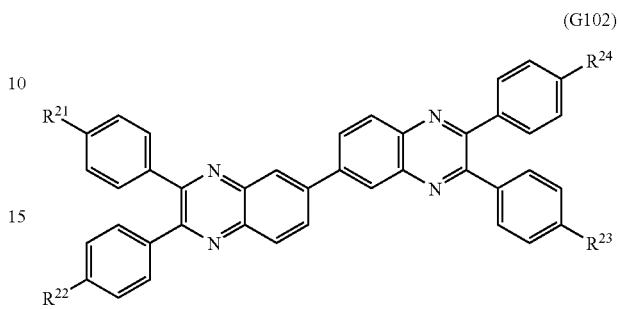

(G102)

In the formula, at least one of $R^{21}$ to $R^{24}$ is any of a fluoro group, a cyano group, a trifluoromethyl group, a nitro group, an acyl group, and an acyloxy group, and the others are hydrogen.

In the general formula (G102), a case is preferable in which $R^{21}$ to $R^{24}$ are all substituted, since a high electron-trapping property is obtained. In other words, preferably, $R^{21}$ to $R^{24}$ independently represent at least one of a fluoro group, a cyano group, a trifluoromethyl group, a nitro group, an acyl group and an acyloxy group. Furthermore, a case is preferable for systhesis, in which $R^{21}$ to $R^{24}$ are at least one of a fluoro group, a cyano group, a trifluoromethyl group, a nitro group, an acyl group and an acyloxy group, and $R^{21}$ to $R^{24}$ are all the same substituent.

Note that the acyl group is preferably an acyl group having 1 to 4 carbon atoms, such as acetyl group. However, a case

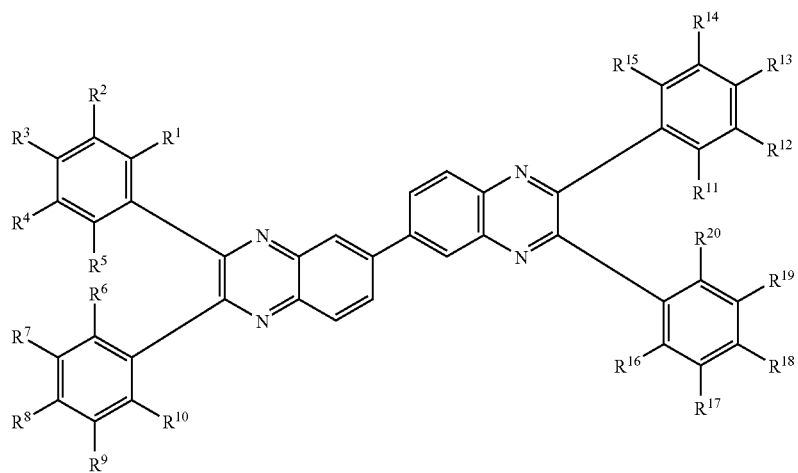

(G101)

In the formula, at least one of $R^1$ to $R^{20}$ is any of a fluoro group, a cyano group, a trifluoromethyl group, a nitro group, an acyl group, and an acyloxy group, and the others are hydrogen.

In the quinoxaline derivative represented by the general formula (G101), a phenyl group of 2,3,2',3'-tetraphenyl-6,6'-biquinoxaline is substituted by an electron-withdrawing group (such as a fluoro group, a cyano group, a trifluoromethyl group, a nitro group, an acyl group, an acyloxy group or the like). The quinoxaline derivative represented by the genwhere a light-emitting element is formed by a wet method is not limited to this. In addition, the acyloxy group is an acyloxy group having 1 to 4 carbon atoms such as acetoxy group. However, a case where a light-emitting element is formed by a wet method is not limited to this.

As specific structures of the quinoxaline derivative represented by the above general formula (G101) or (G102), the following structural formulae (101) to (211) are given. However, the quinoxaline derivative of the present invention is not limited to those formulae.

(101)
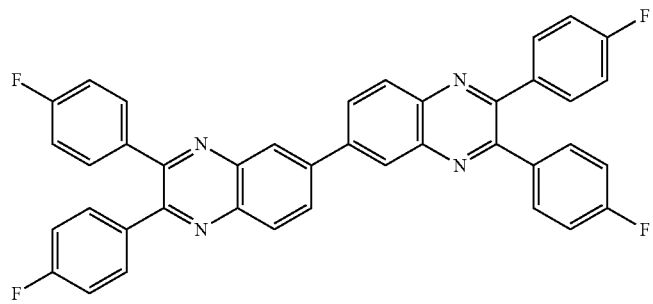
(102)
(103)
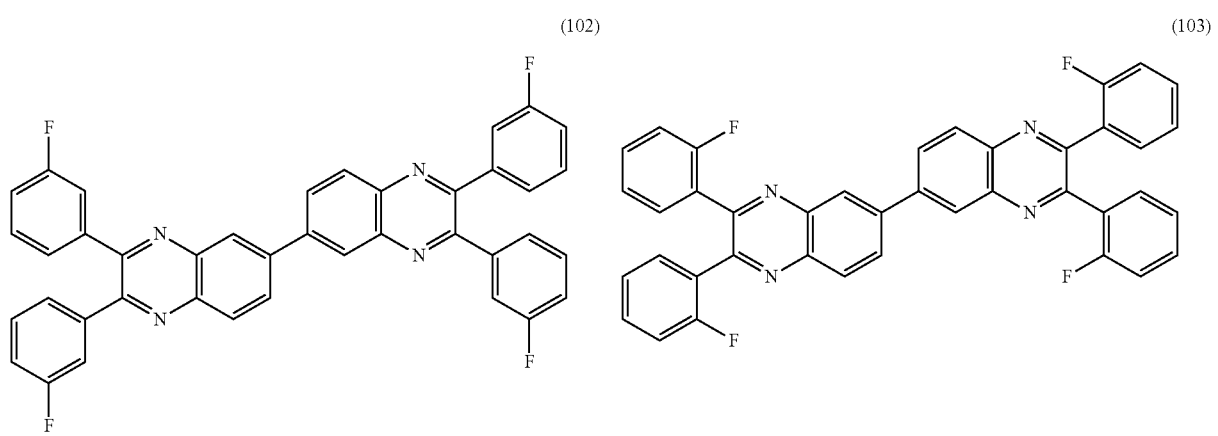
(104)
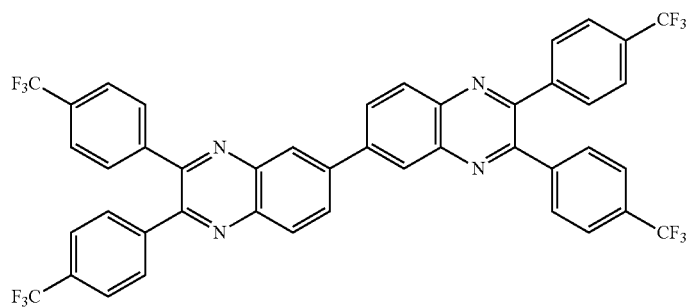
(105)
(106)
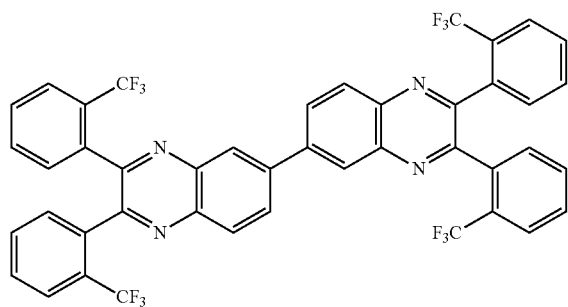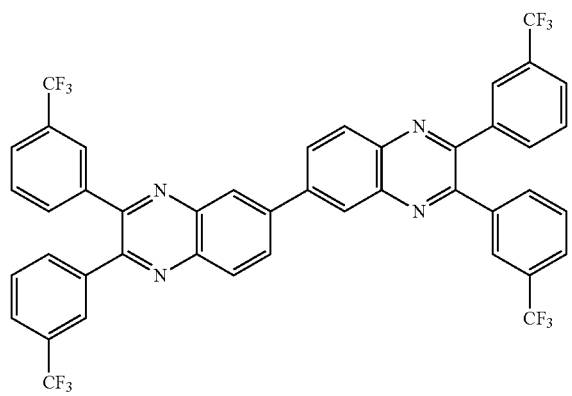

-continued
(107)
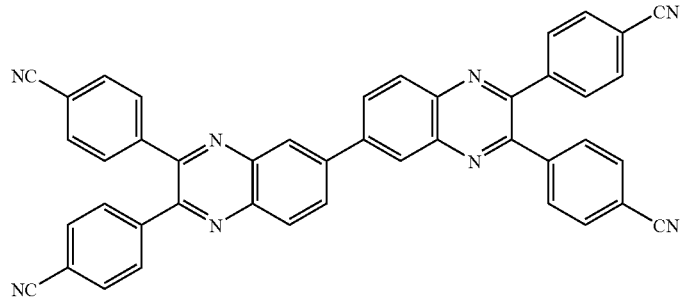
(108)
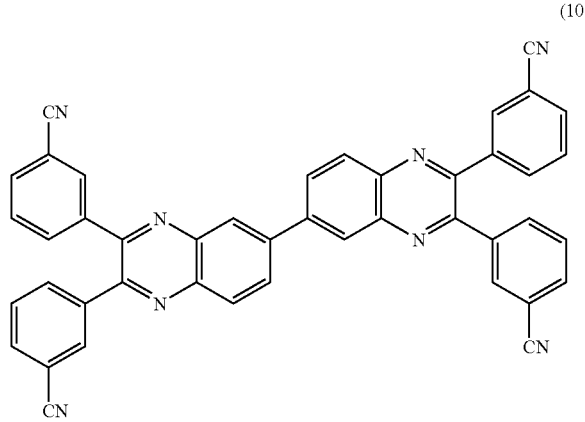
(109)
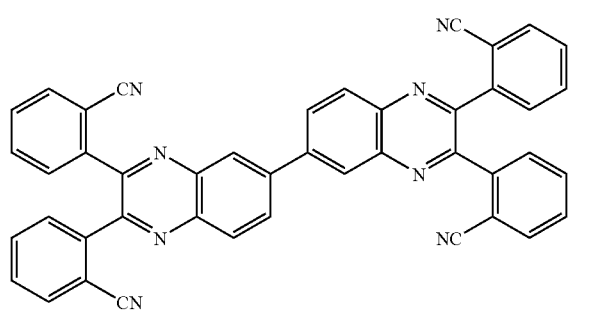
(110)
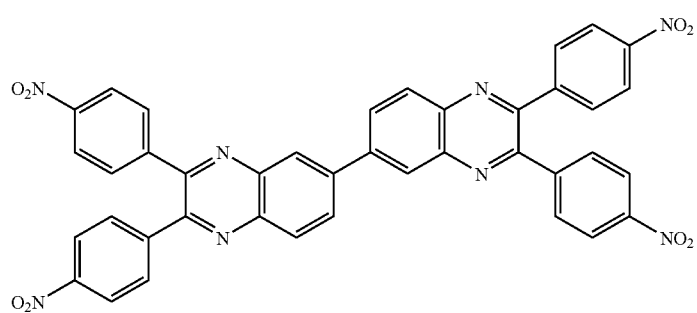
(111)
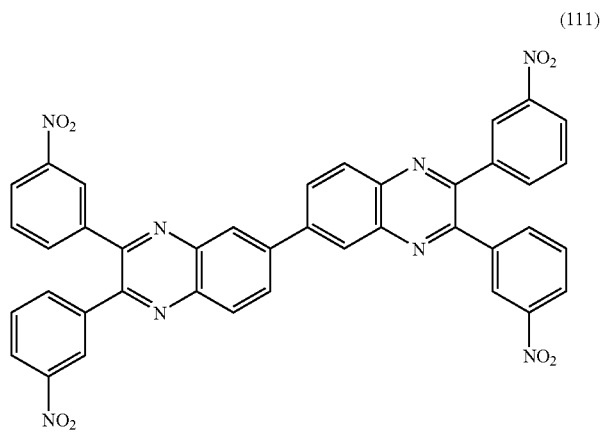
(112)
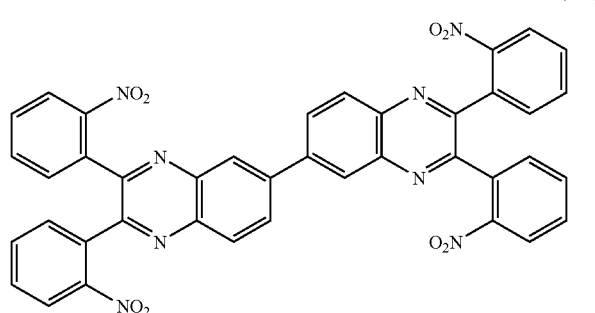

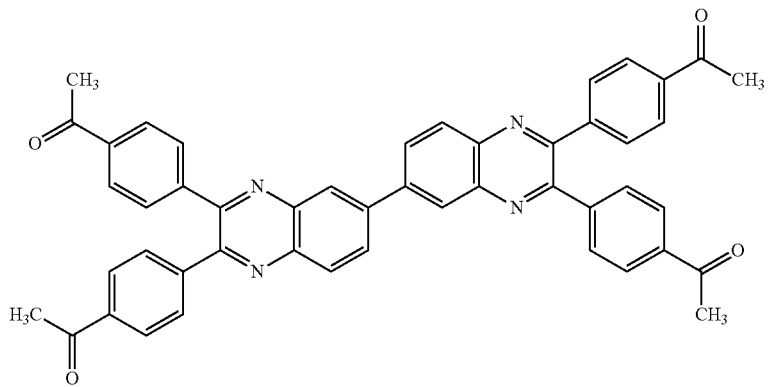
(113)
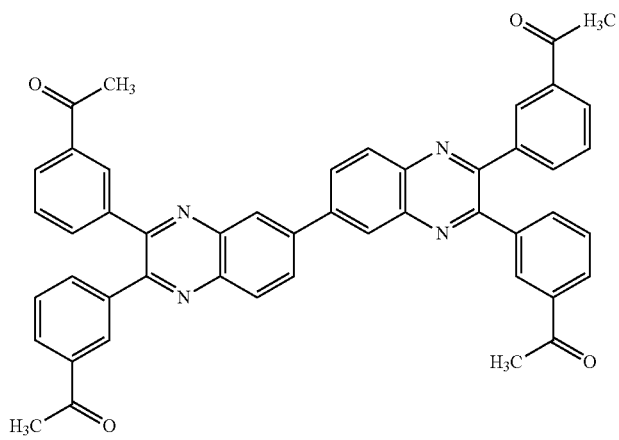
(114)
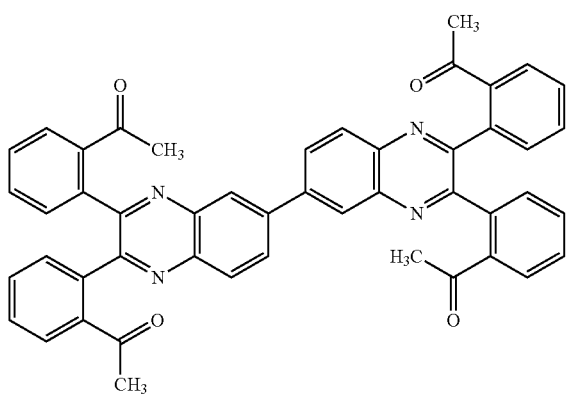
(115)
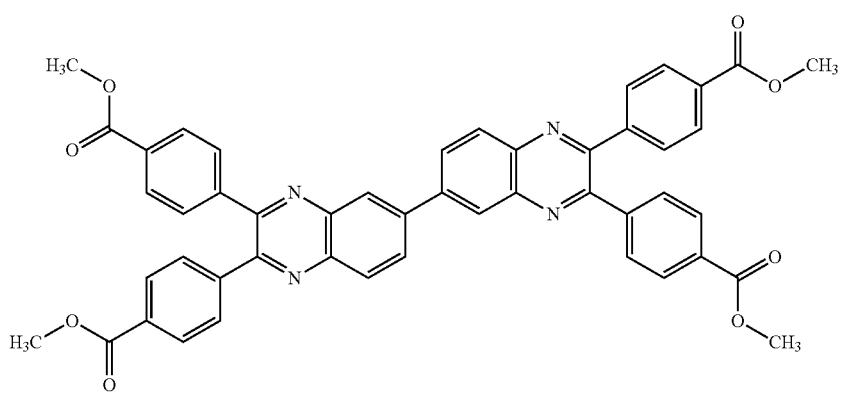
(116)

-continued
(117)
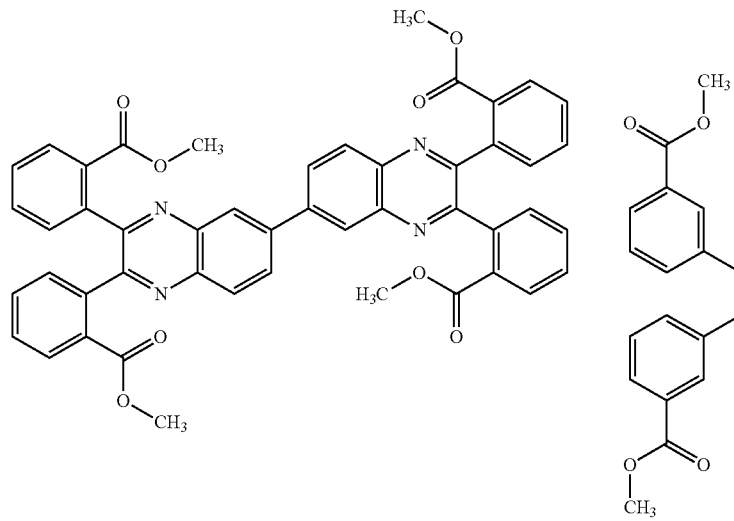
(118)
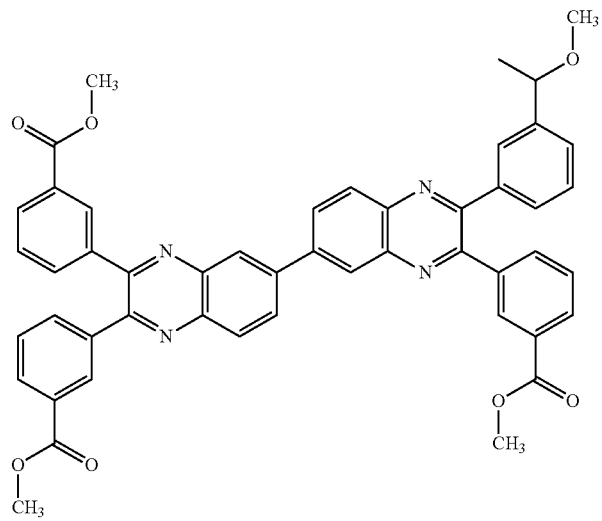
(119)
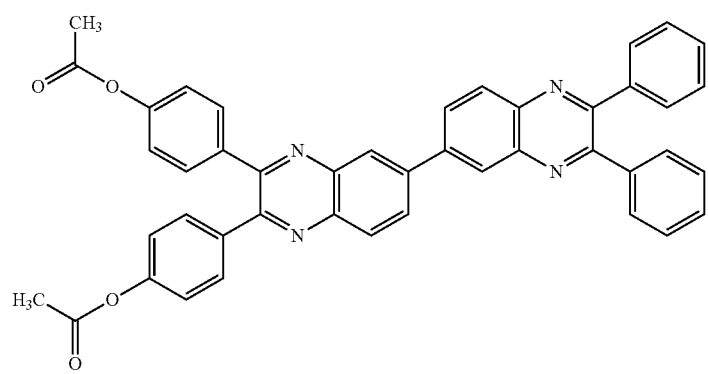
(120)
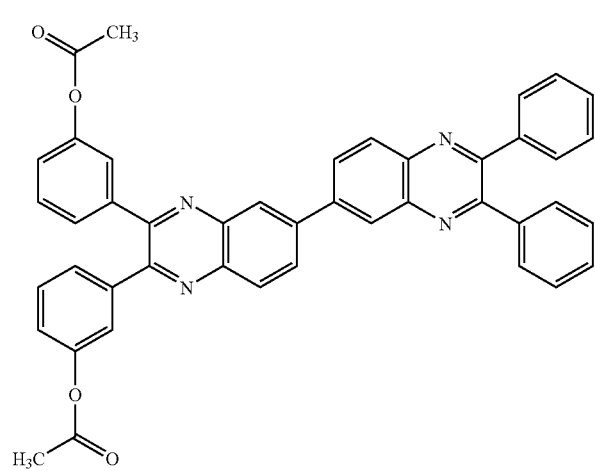

(121)
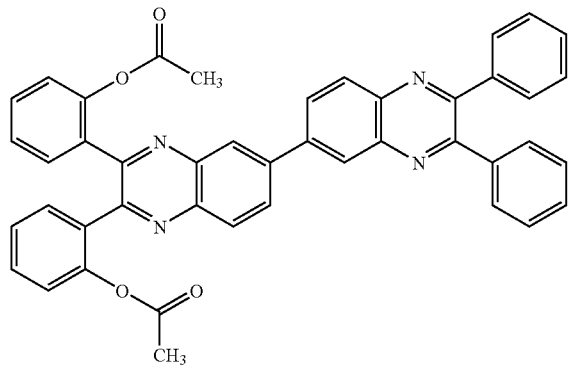
(122)
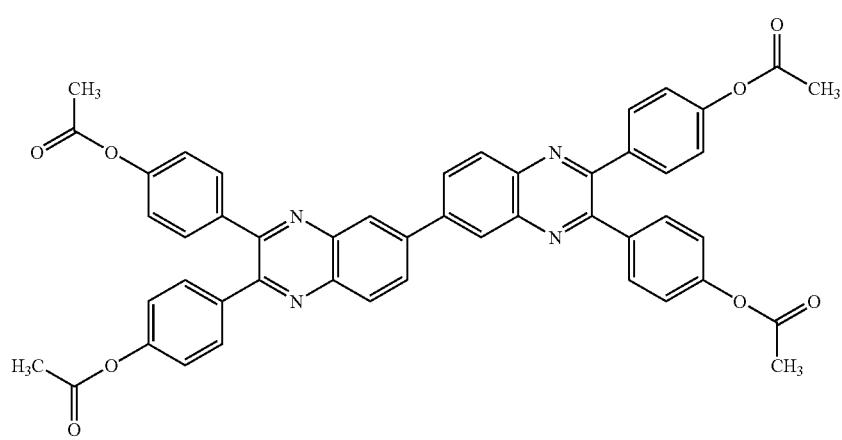
(123)
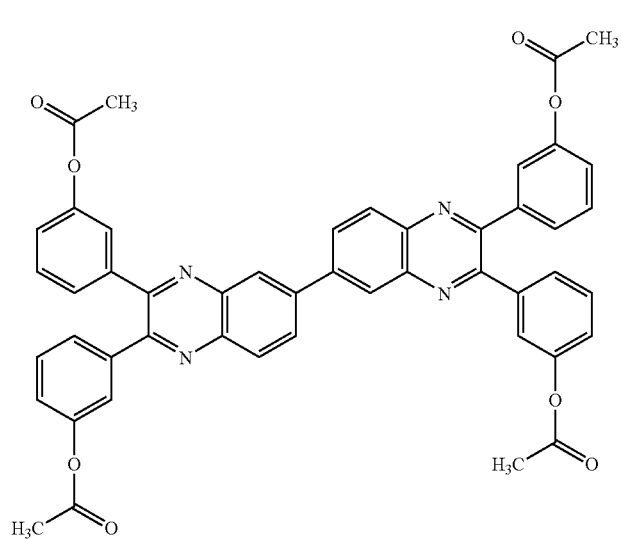

(124)
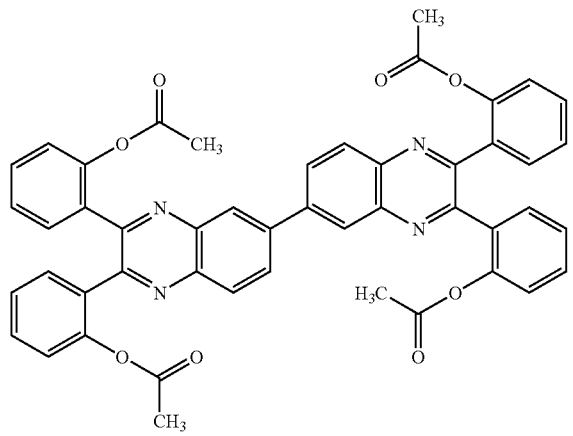
(125)
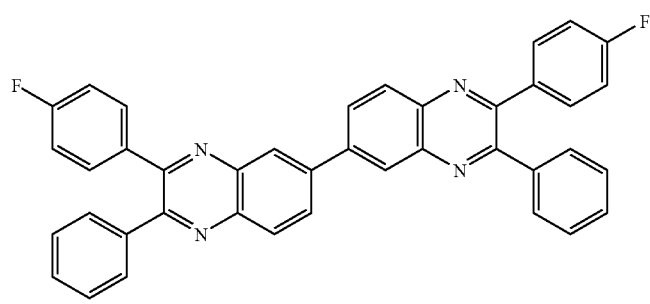
(126)
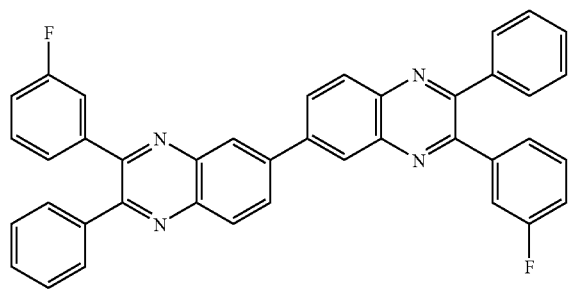
(127)
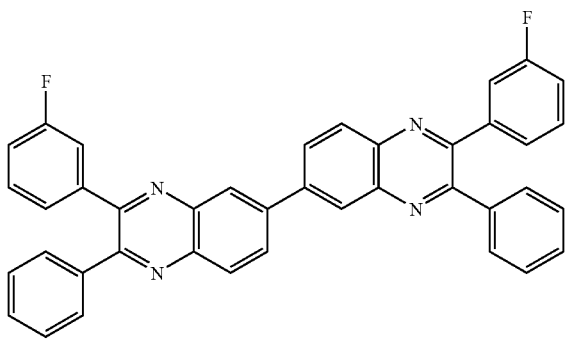
(128)
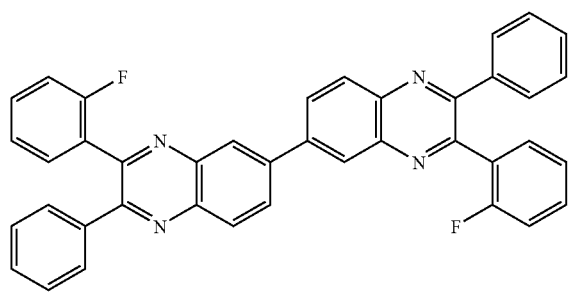
(129)
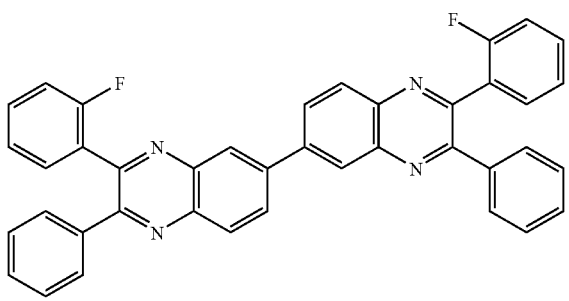

-continued
(130)
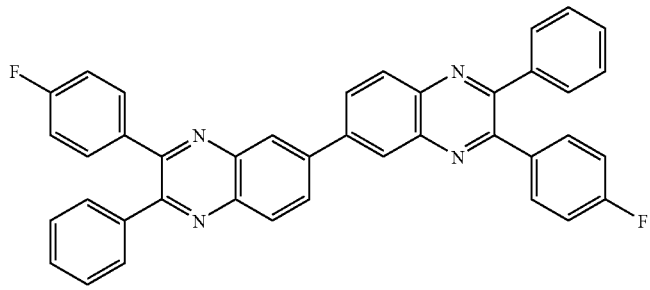
(131)
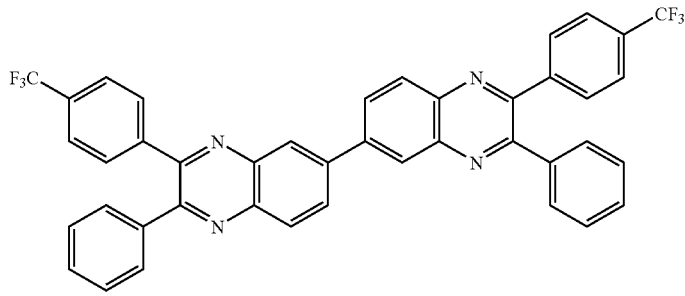
(132)
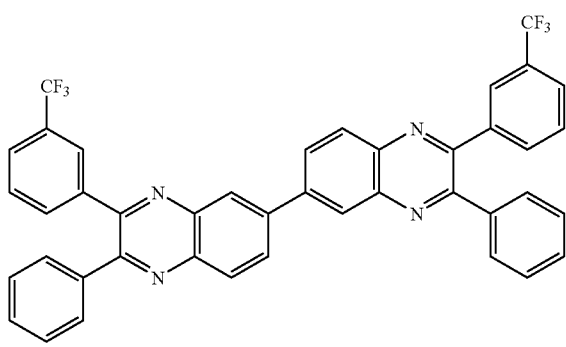
(133)
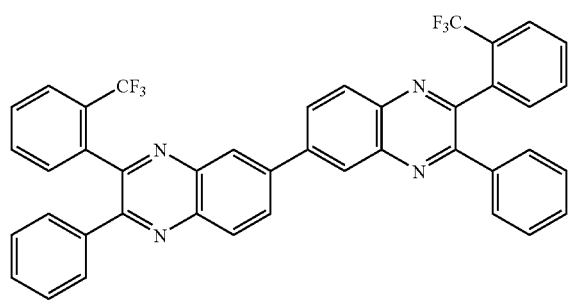
(134)
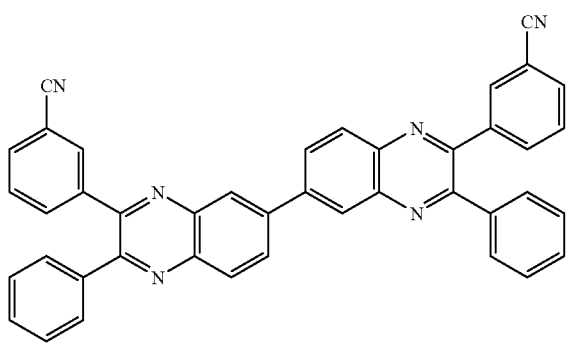
(135)
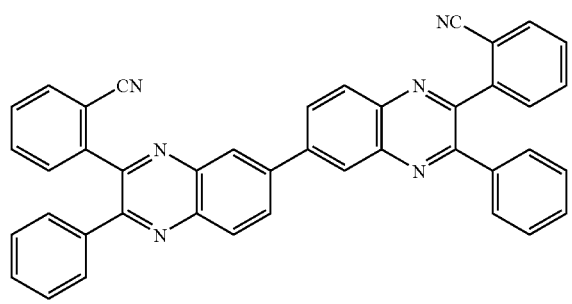
(136)
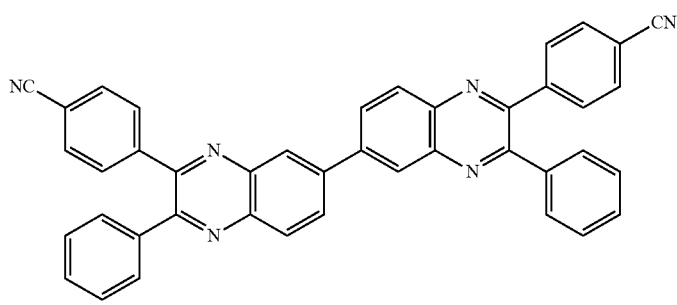

-continued
(137)
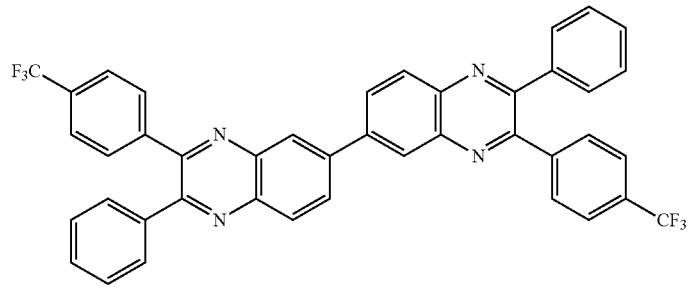
(138)
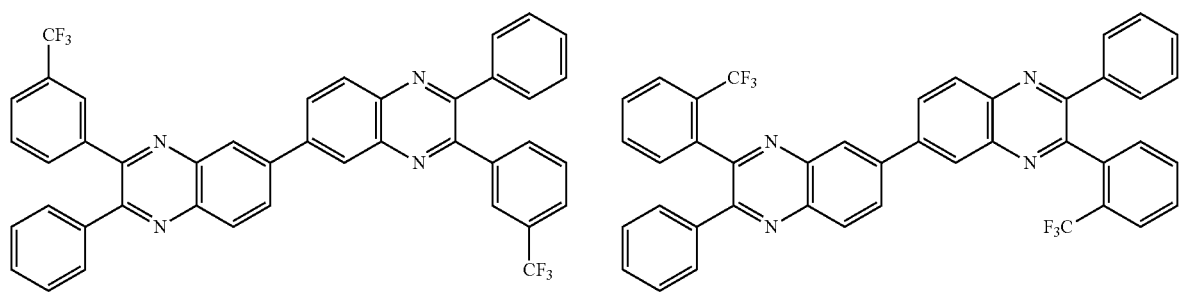
(139)
(140)
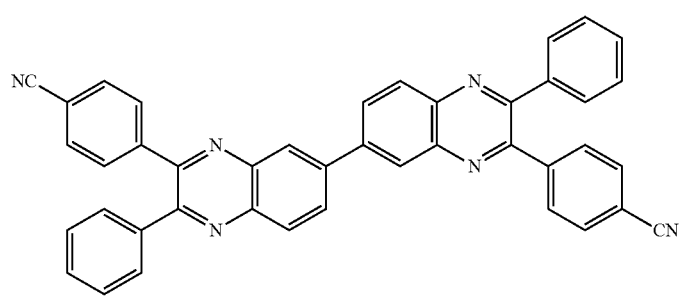
(141)
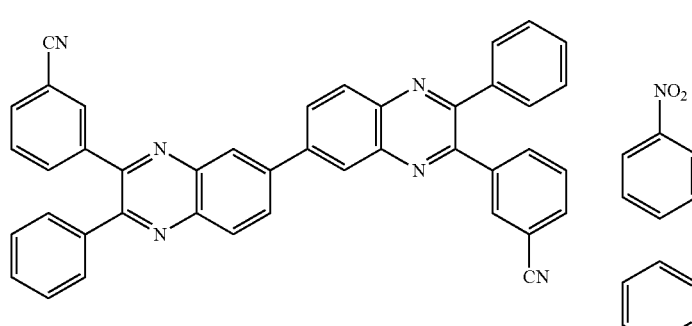
(142)
(143)
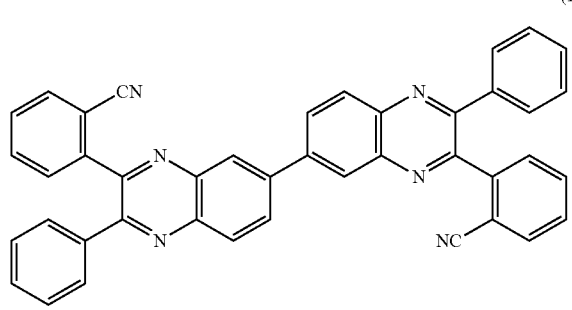
(144)
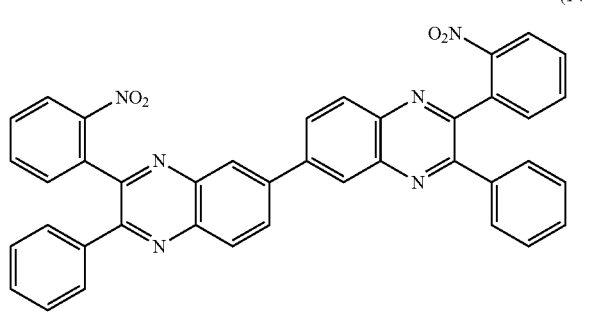

-continued
(145)
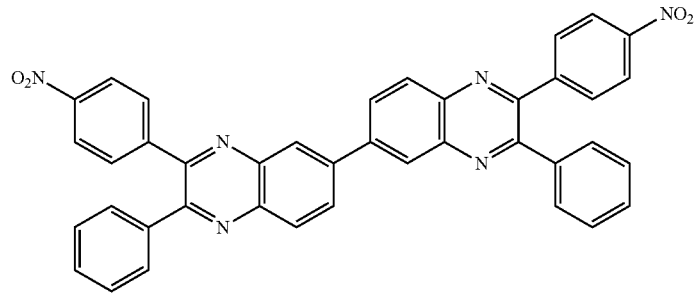
(146)
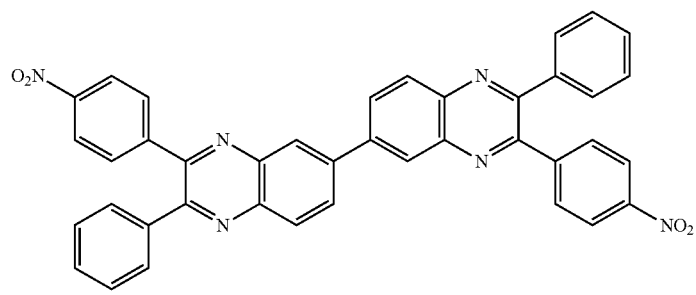
(147) (148)
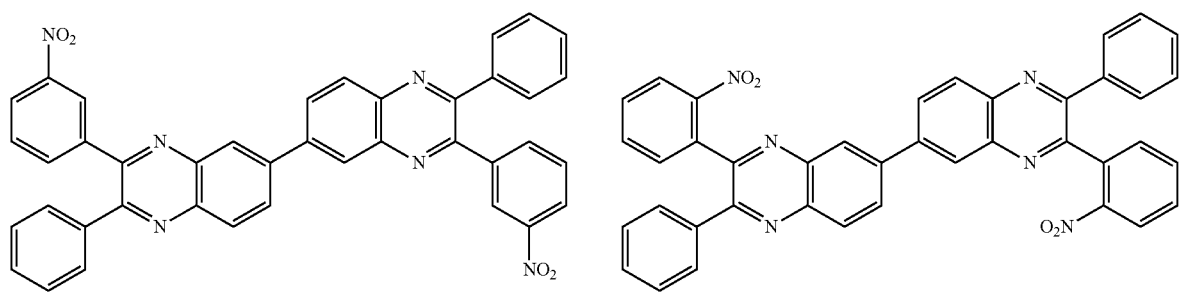
(149)
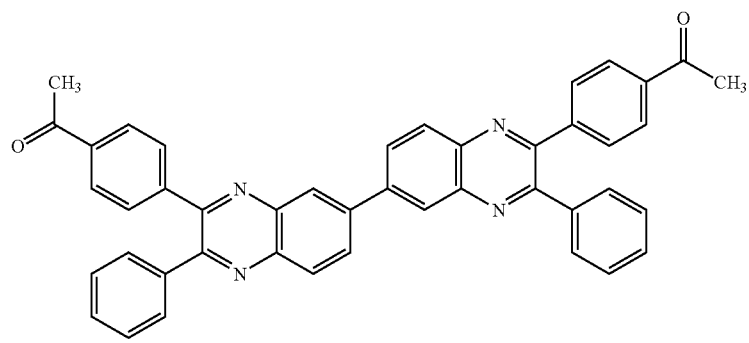
(150) (151)
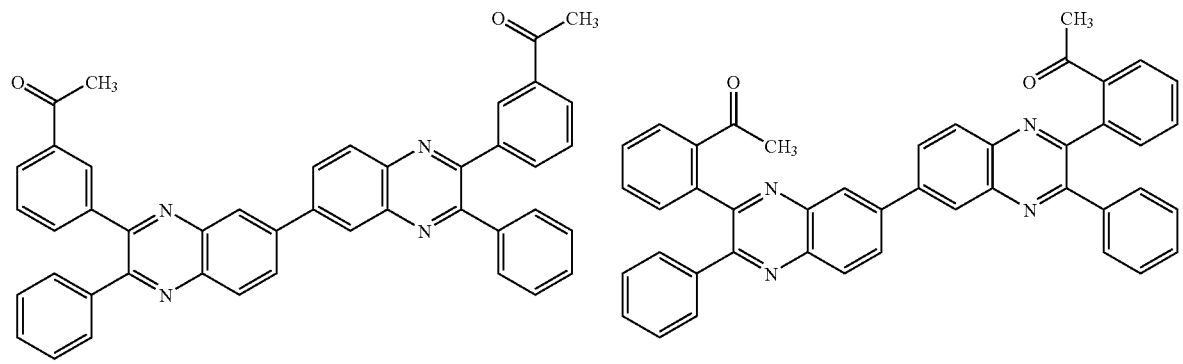

(152)
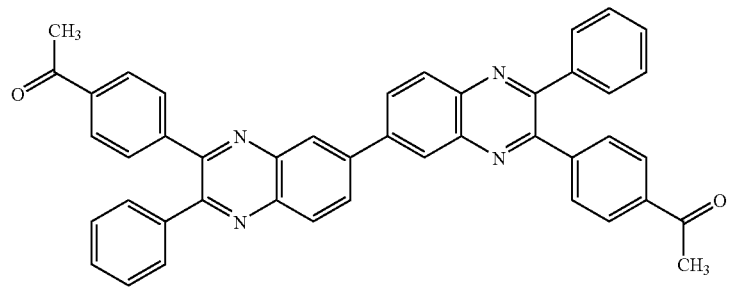
(153)
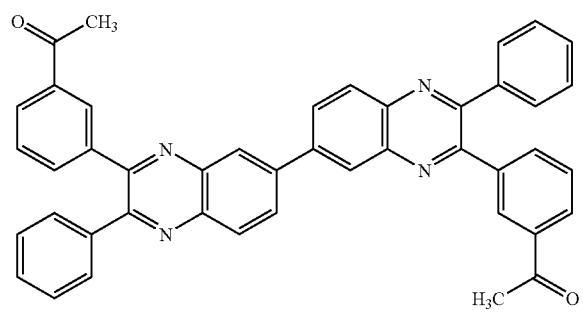
(154)
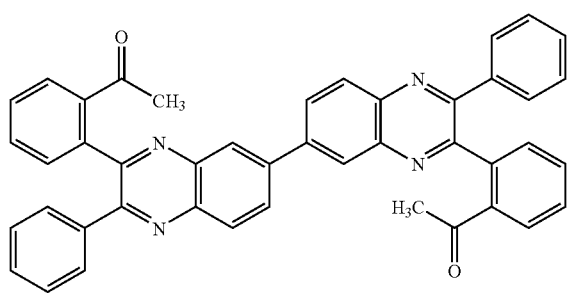
(155)
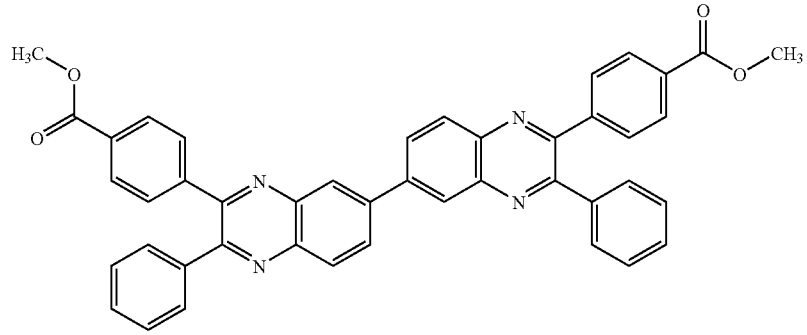
(156)
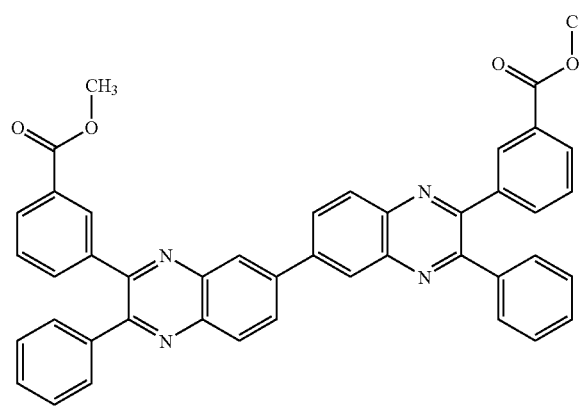
(157)
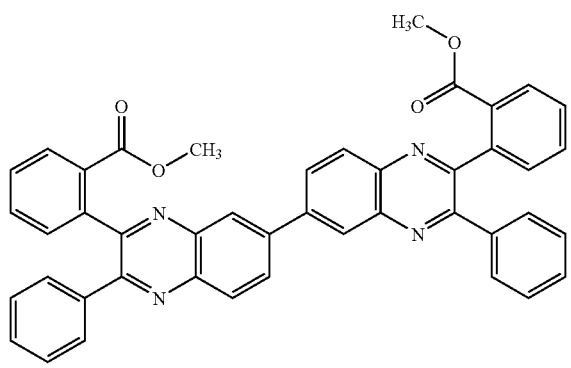

(158)
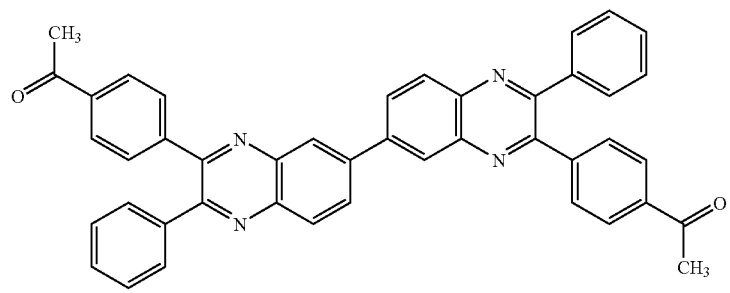
(159)
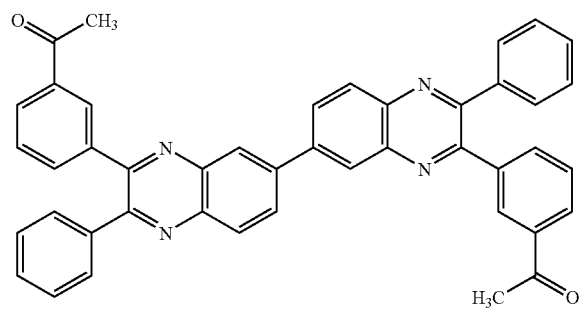
(160)
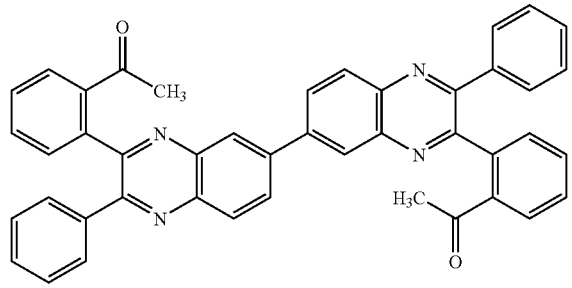
(161)
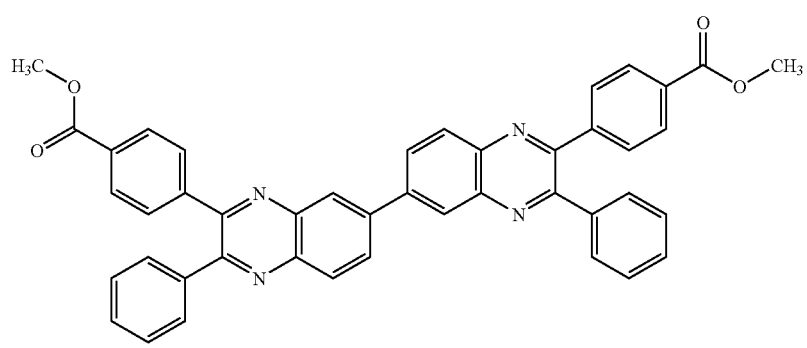
(162)
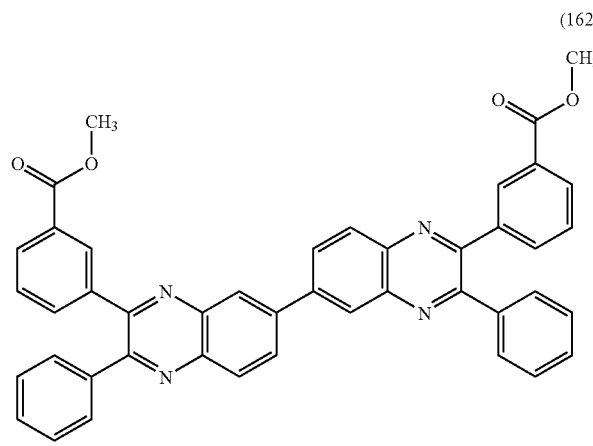
(163)
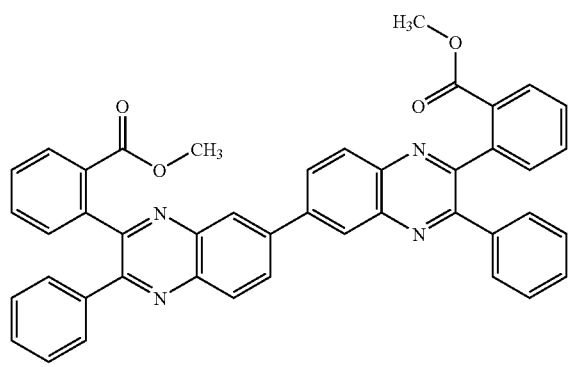

(164)
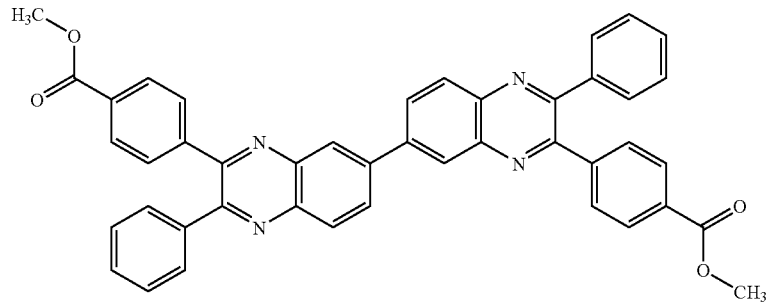
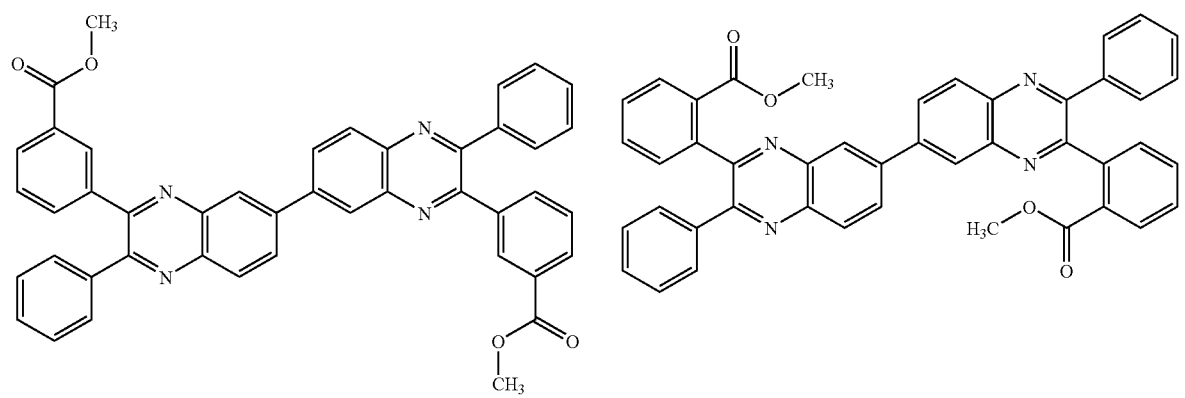
(167)
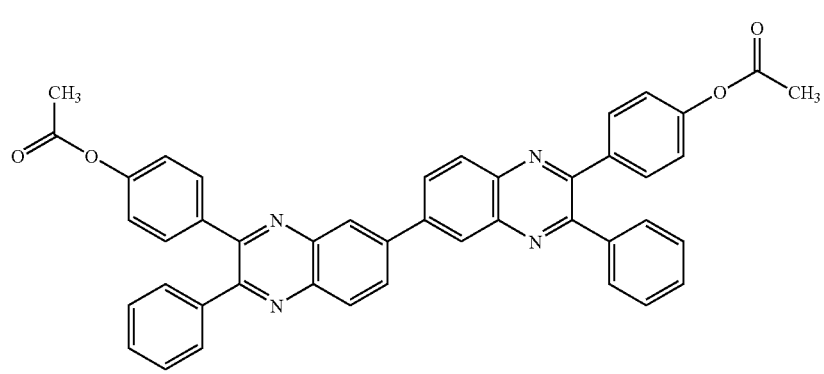
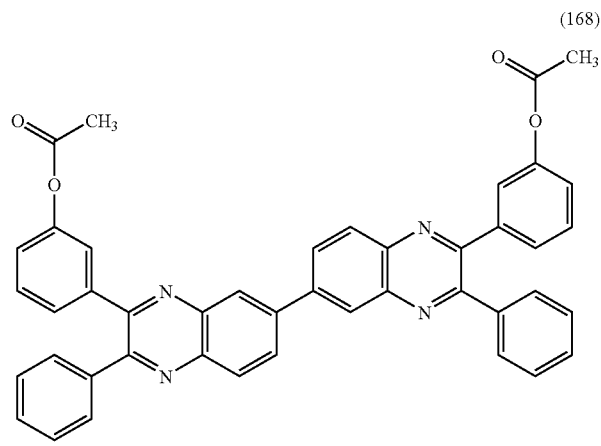
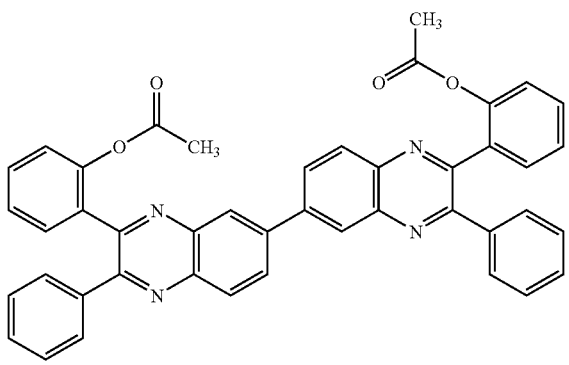

-continued
(170)
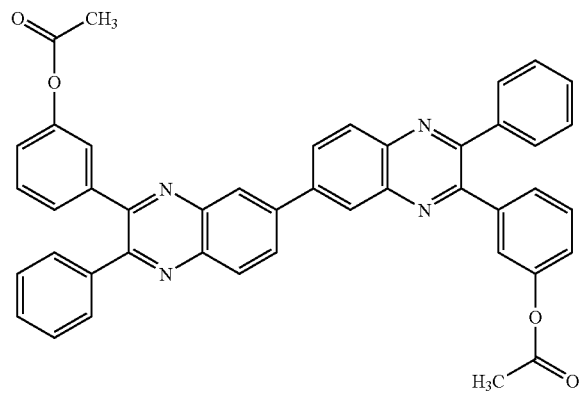
(171)
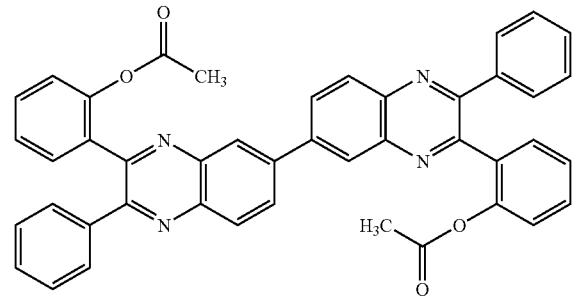
(172)
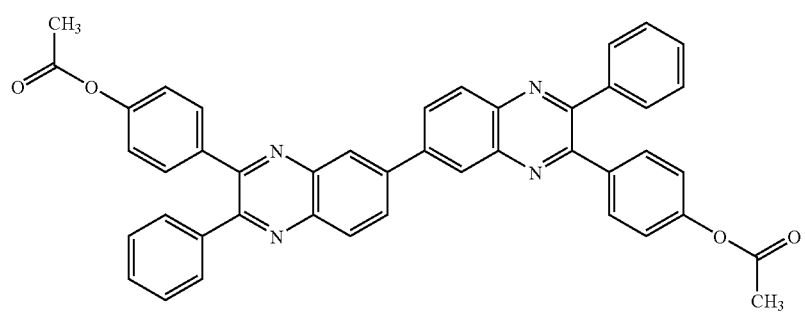
(173)
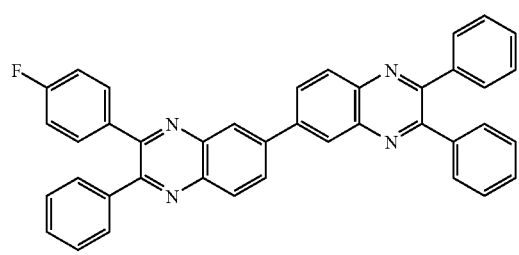
(174)
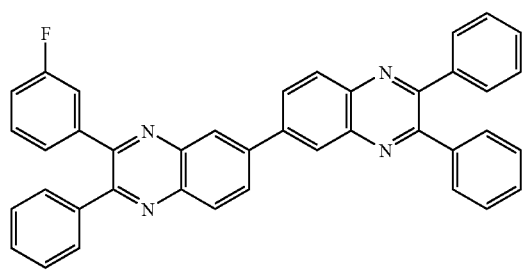
(175)
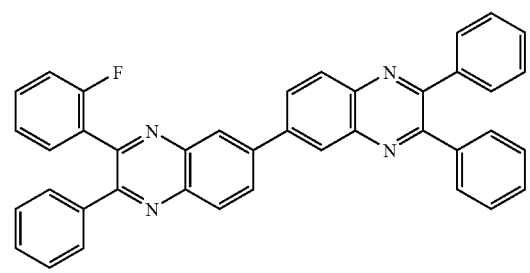
(176)
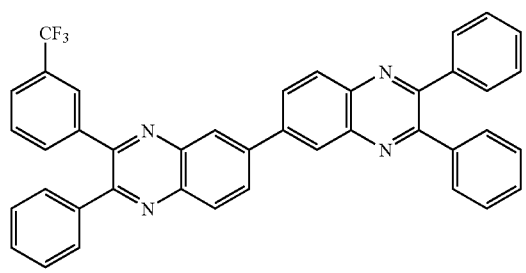
(177)
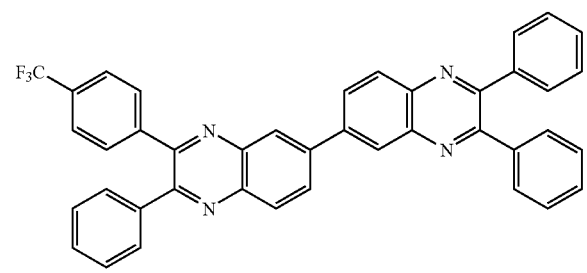

-continued
(178)
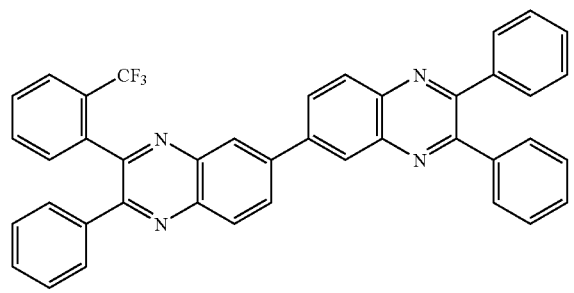
(179)
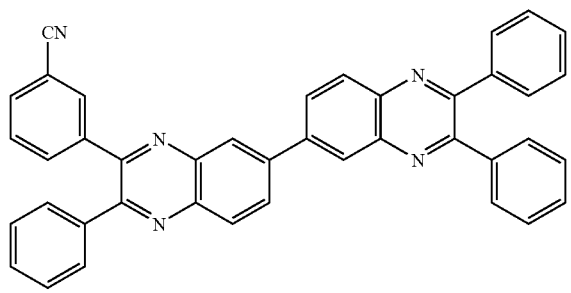
(180)
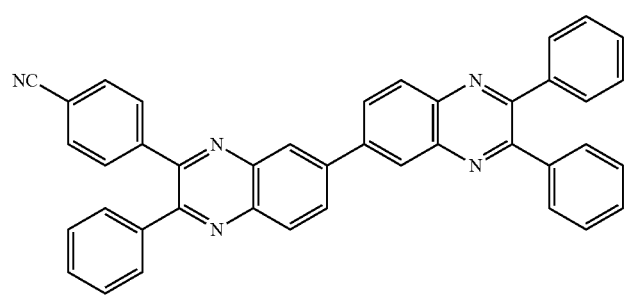
(181)
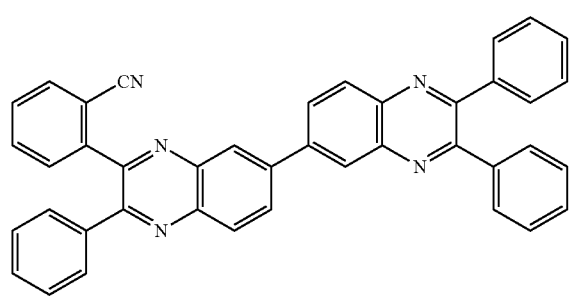
(182)
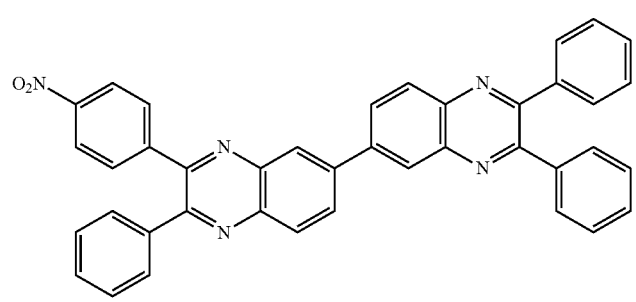
(183)
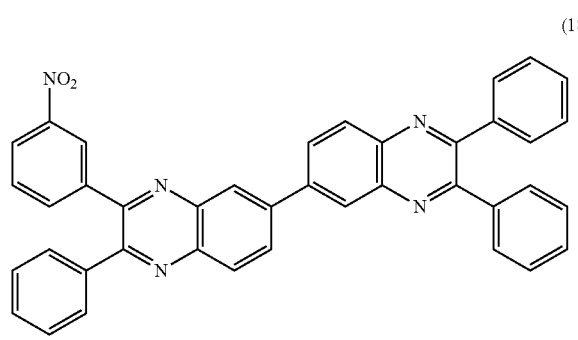
(184)
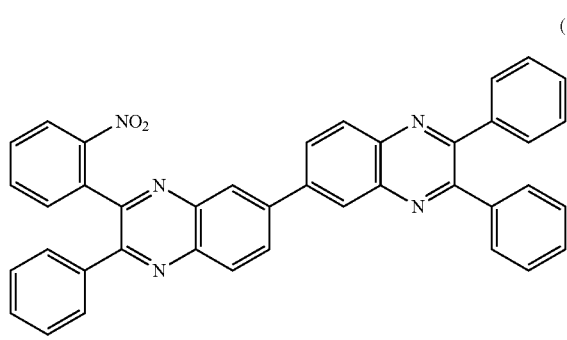

-continued
(185) 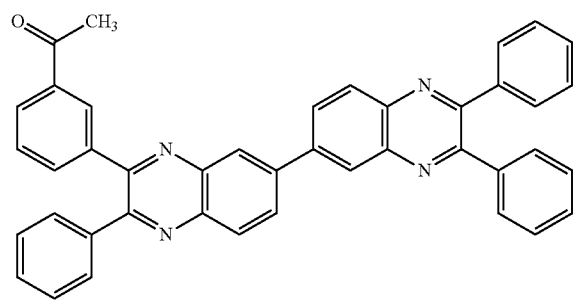
(186) 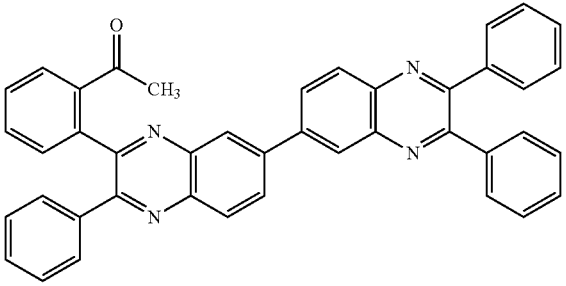
(187) 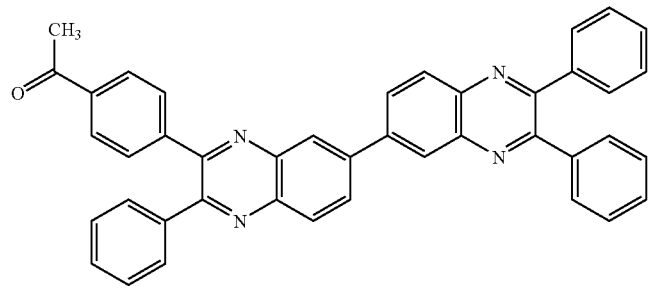
(188) 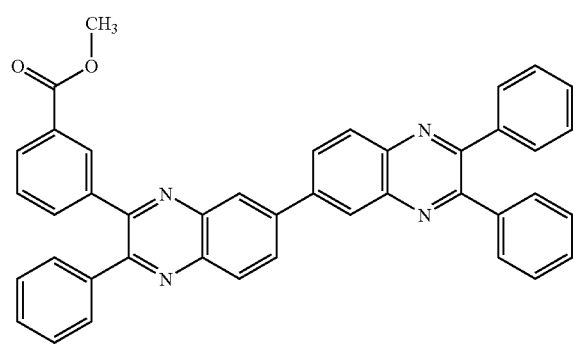
(189) 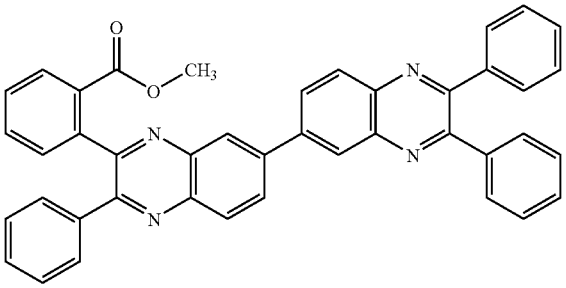
(190) 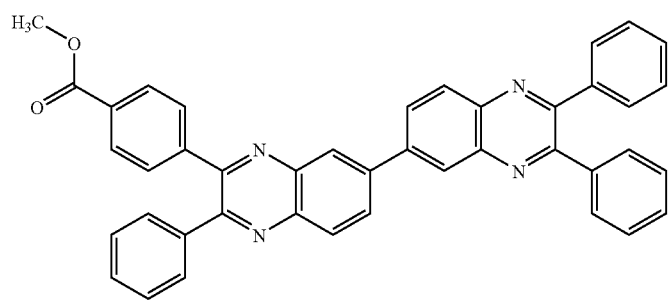
(191) 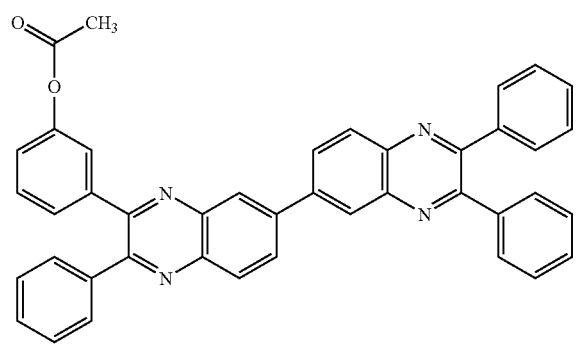
(192) 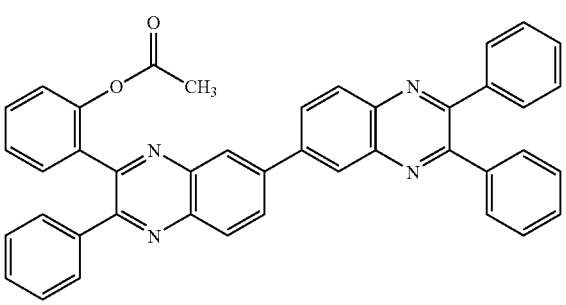

-continued
(193)
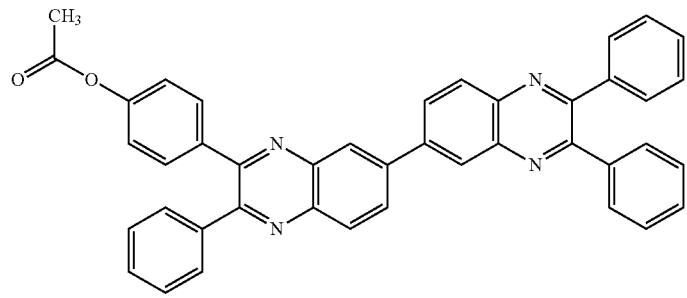
(194)
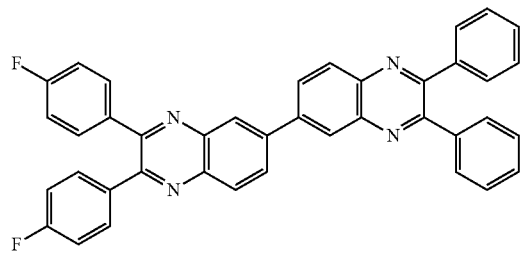
(195)
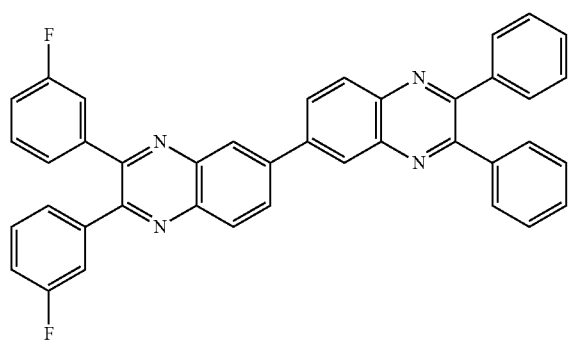
(196)
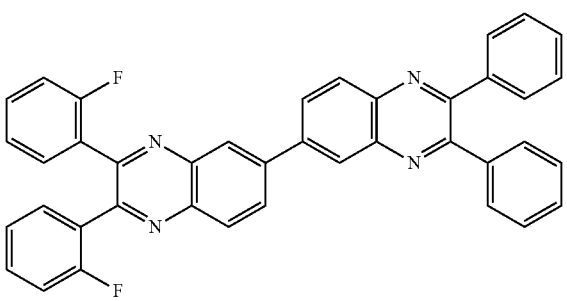
(197)
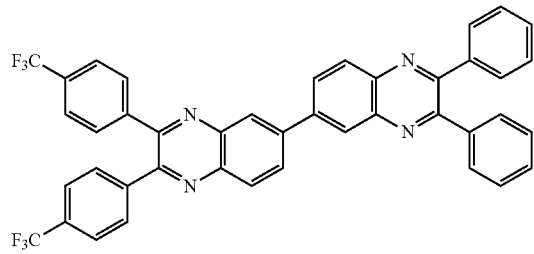
(198)
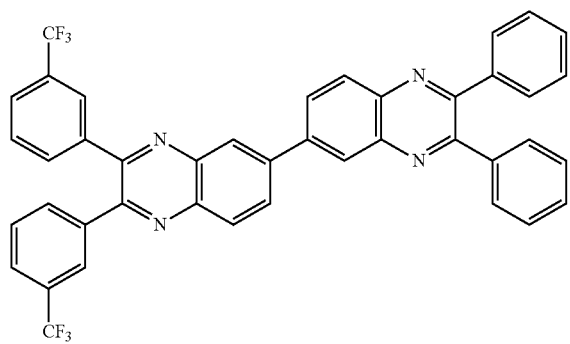
(199)
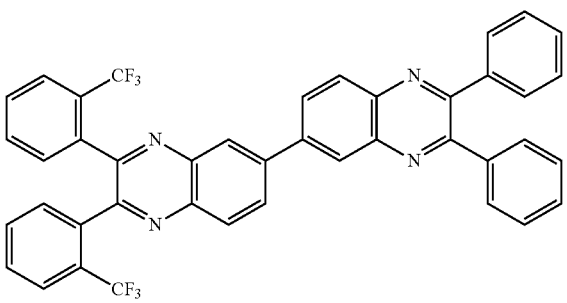

(200)
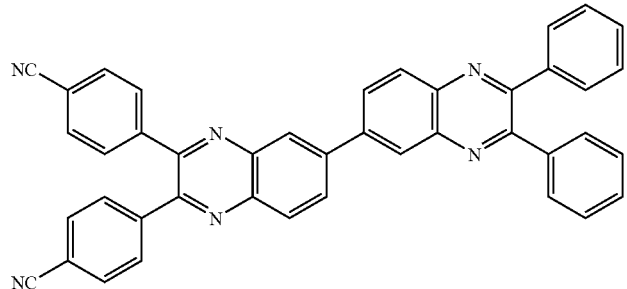
(201)
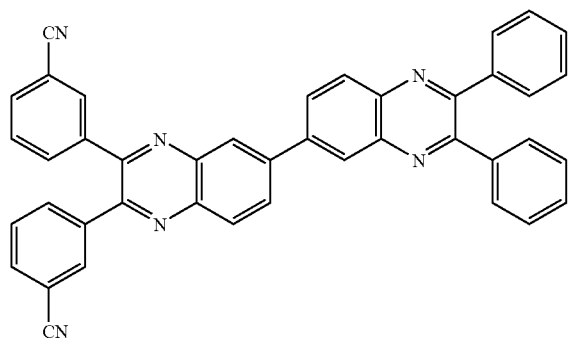
(202)
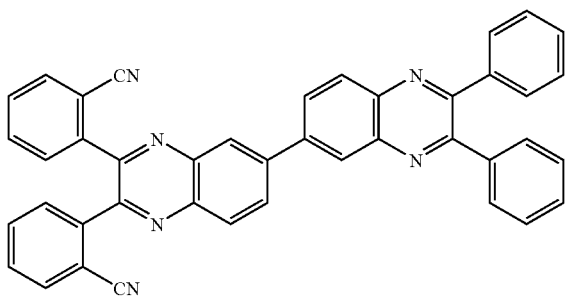
(203)
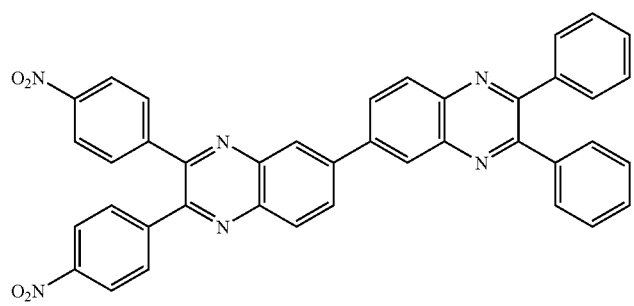
(204)
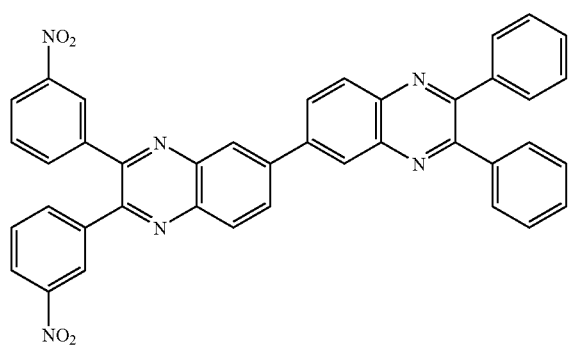
(205)
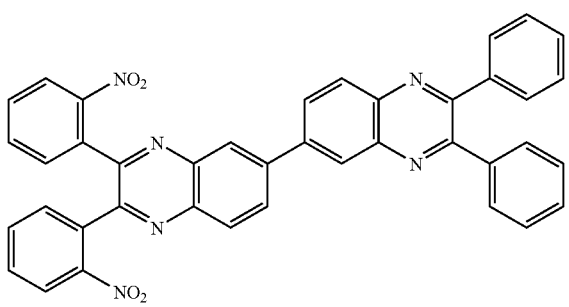

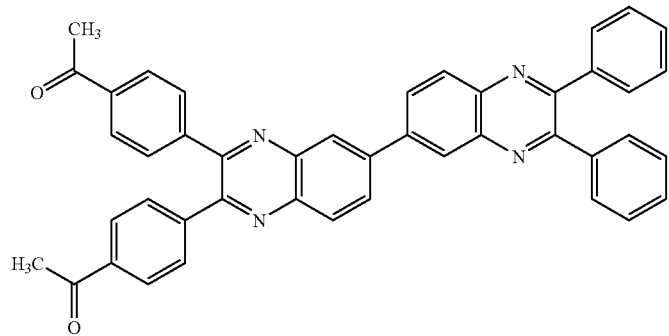
(206)
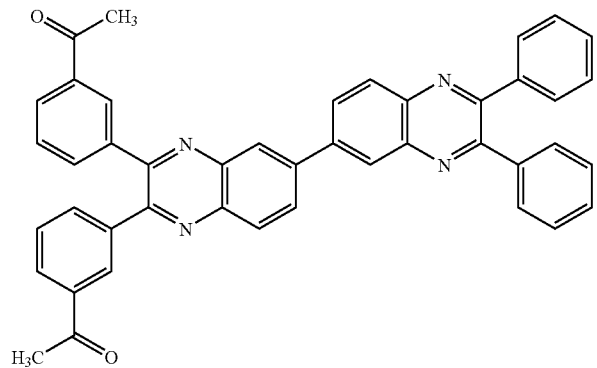
(207)
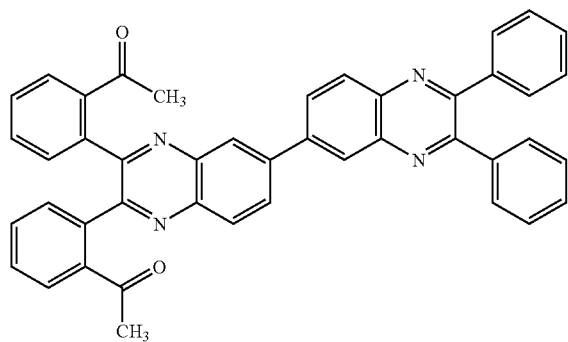
(208)
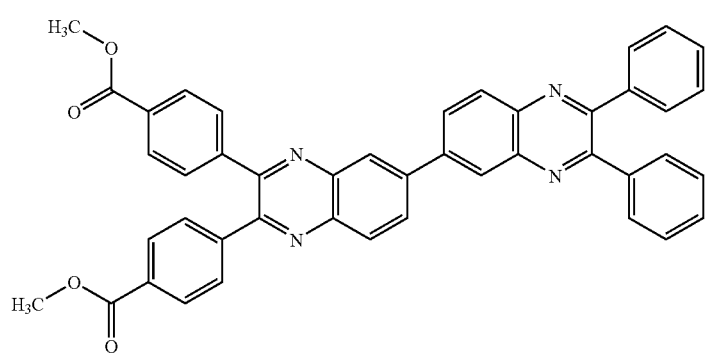
(209)

-continued

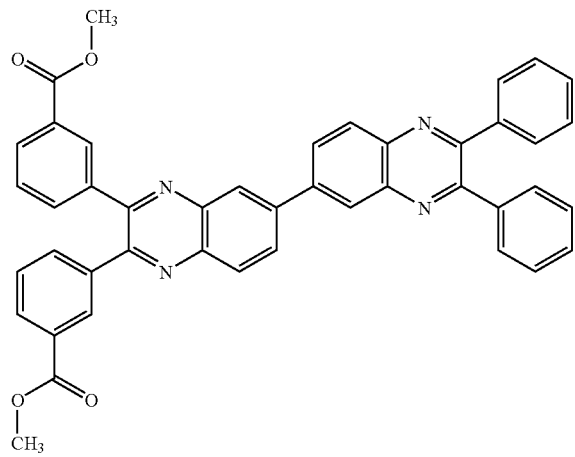

(210)

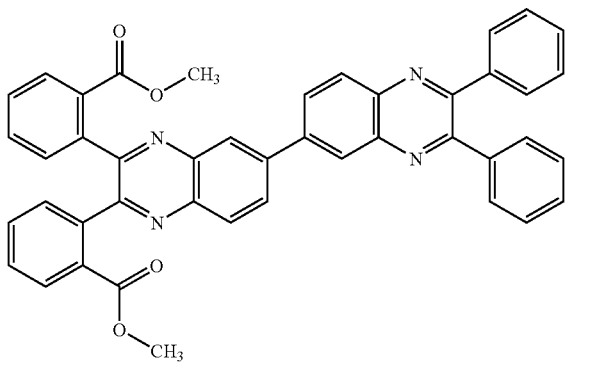

(211)

As described above, the LUMO level of the fourth organic compound is preferably lower than that of the third organic compound by 0.3 eV or more. Thus, depending on the type of the fourth organic compound to be used, a substance may be selected so as to satisfy the condition as the third organic compound as appropriate. For example, the condition can be satisfied by using 2,3,2'3'-tetrakis(4-fluorophenyl)-6,6'-biquinoxaline (abbreviation: FDPQ2) represented by the structural formula (101) or 2,3-bis(4-fluorophenyl)quinoxaline (abbreviation FDPQ) as the fourth organic compound and using Alq as the third organic compound.

Figure 3:
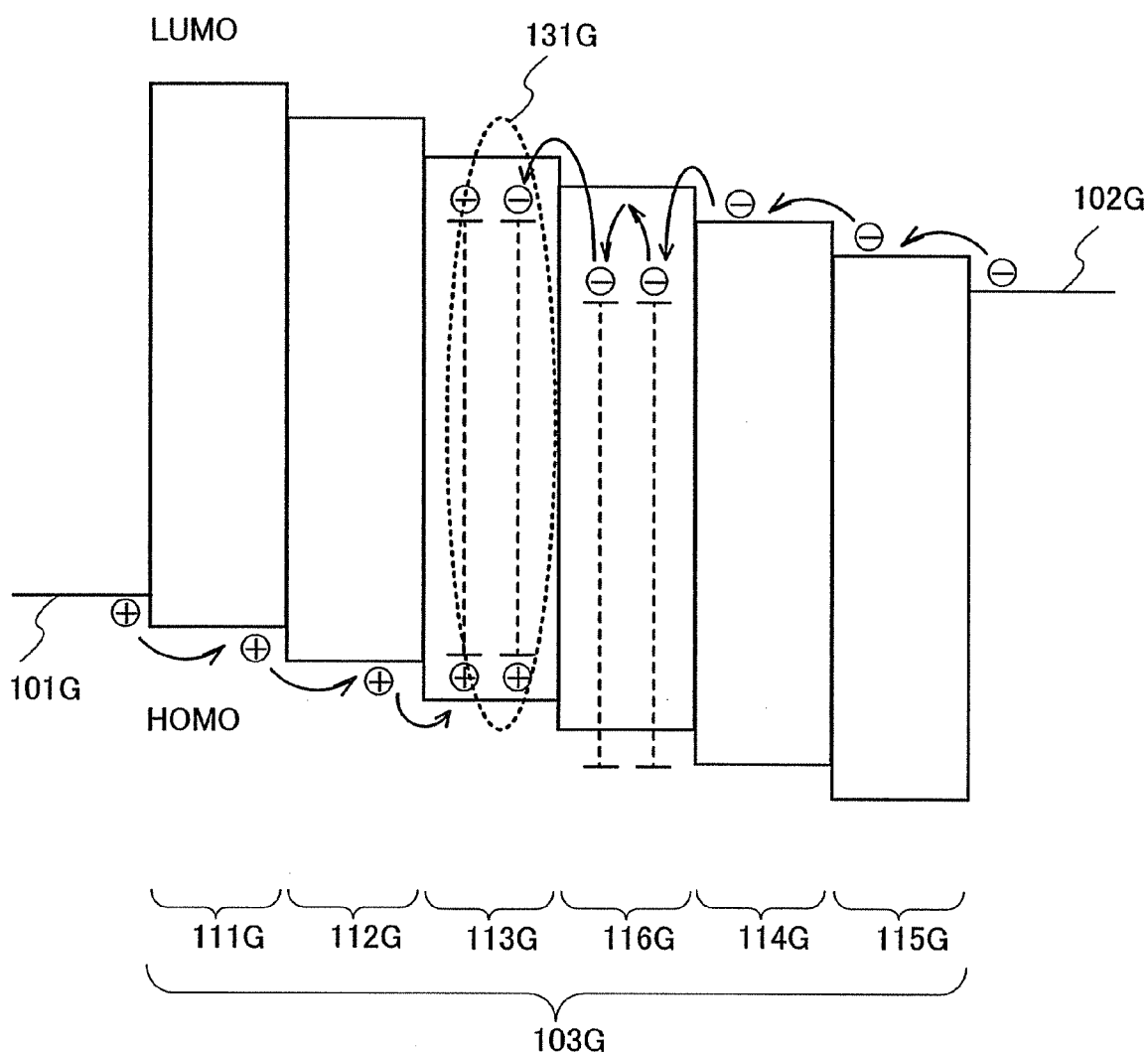
FIG. 3 illustrates a light-emitting device according to an aspect of the present invention.

FIG. 3 exemplarily illustrates a band diagram of the green-light-emitting element shown in FIG. 1. In FIG. 3, holes injected from the anode 101G pass through the hole-injecting layer 111G and the hole-transporting layer 112G. Then, the holes are injected to the light-emitting layer 113G. On the other hand, electrons injected from the cathode 102G pass through an electron-injecting layer 115G and an electron-transporting layer 114G. Then, the electrons are injected to the layer 116G for controlling carrier transfer. The movement speed of the electrons injected to the layer 116G for controlling carrier transfer is retarded by the fourth organic compound having an electron trapping property. The electrons whose movement speed has been retarded are injected to the light-emitting layer 113G, and then recombined with holes. In this manner, light emission is obtained.

When the light-emitting layer 113G has an electron-transporting property, for example, the movement speed of the holes that are injected from the hole-transporting layer 112G to the light-emitting layer 113G is retarded. In addition, the movement speed of the electrons that are injected from the layer 116G for controlling carrier transfer to the light-emitting layer 113G is even slow in the light-emitting layer 113G because it has already been retarded in the layer 116G for controlling carrier transfer. Therefore, holes of a slow movement speed and electrons of a slow movement speed are recombined in the light-emitting layer 113G, whereby the recombination probability is increased and luminous efficiency is improved.

In the case of a conventional light-emitting element which does not include the layer 116G for controlling carrier transfer, the movement speed of electrons is not retarded and the electrons are directly injected to the light-emitting layer 113G Thus, the electrons reach the vicinity of the interface between the hole-transporting layer 112G and the light-emitting layer 113G. Therefore, a light-emitting region is formed in the vicinity of the interface between the hole-transporting layer 112G and the light-emitting layer 113G. In that case, there is a possibility that the electrons may reach and deteriorate the hole-transporting layer 112G. Further, as the amount of electrons that have reached the hole-transporting layer 112G is increased over time, the recombination probability in the light-emitting layer is decreased over time, which leads to a shorter lifetime of the element (luminance decay over time).

In the green-light-emitting element shown in this embodiment mode, electrons injected from the cathode 102G pass through the electron-injecting layer 115G and the electron-transporting layer 114G. Then, the electrons are injected to the layer 116G for controlling carrier transfer. Here, the layer 116G for controlling carrier transfer has a structure in which the fourth organic compound having a function of trapping electrons is added to the third organic compound having an electron-transporting property. Therefore, the movement speed of the electrons that are injected to the layer 116G for controlling carrier transfer is retarded and the electron injection to the light-emitting layer 113G is controlled. As a result, a light-emitting region, which has conventionally been formed in the vicinity of the interface between the hole-transporting layer 112G containing a compound with a high hole-transporting property and the light-emitting layer 113G, is formed in a region from the light-emitting layer 113G to the vicinity of the interface between the light-emitting layer 113G and the layer 116G for controlling carrier transfer, in the light-emitting element shown in this embodiment mode. Therefore, there is low possibility that electrons may reach and deteriorate the hole-transporting layer 112G which contains a compound with a high hole-transporting property. Similarly, as for holes, there is also low possibility that holes may reach and deteriorate the electron-transporting layer 114G which contains a compound with a high electron-transporting property because the layer 116G for controlling carrier transfer contains the third organic compound having an electron-transporting property.

Further, it is an important point that not merely a substance with low electron mobility is applied to the layer 116G for controlling carrier transfer but an organic compound having a function of trapping electrons is added to an organic compound having an electron-transporting property. Thus, a long-lifetime light-emitting element which does not easily deteriorate over time can be obtained. That is, the change of carrier balance hardly occurs, as compared with the case where the movement of carriers is controlled by a single substance. For example, when the movement of carriers is controlled by a layer made of a single substance, the balance of the whole layer is changed by a partial change in morphology or by partial crystallization. Thus, such a light-emitting element will easily deteriorate over time. However, as shown in this embodiment mode, when the movement of carriers is controlled with the component that is included less, among all the components included in the layer 116G for controlling carrier transfer, it is possible to reduce the effects of morphological change, crystallization, aggregation, or the like, and thereby deterioration over time can be suppressed. Therefore, a long-lifetime light-emitting element whose luminous efficiency will not easily decrease over time can be obtained.

In the green-light-emitting element shown in this embodiment mode, the light-emitting region is not formed at the interface between the light-emitting layer and the hole-transporting layer or the interface between the light-emitting layer and the electron-transporting layer. Therefore, there is no adverse effect of deterioration which would otherwise be caused if the light-emitting region is positioned close to the hole-transporting layer or the electron-transporting layer. Further, changes in carrier balance over time (in particular, changes in amount of electron injection over time) can be suppressed. Therefore, a long-lifetime light-emitting element which does not easily deteriorate can be obtained.

In addition, the thickness of the layer 116G for controlling carrier transfer is preferably in the range of from 5 nm to 20 nm, inclusive. If the thickness is too large, electron transfer speed may become too slow, which leads to increase of driving voltage. On the other hand, if the thickness is too small, the electron transfer speed may not be controlled. For this reason, the thickness of the layer 116G for controlling carrier transfer is preferably in the range of from 5 nm to 20 nm, inclusive.

An electron-transporting layer 114G can have a similar structure to the electron-transporting layer 114B. The electron-transporting layer 114G may be formed using the same material as the electron-transporting layer 114B or a different material from the electron-transporting layer 114B. In the case where the electron-transporting layer 114G is formed using the same material as the electron-transporting layer 114B, a light-emitting device can be formed without increasing the number of steps, which is preferable.

An electron-injecting layer 115G can have a similar structure to the electron-injecting layer 115B. The electron-injecting layer 115G may be formed using the same material as the electron-injecting layer 115B or a different material from the electron-injecting layer 115B. In the case where the electron-injecting layer 115G is formed using the same material as the electron-injecting layer 115B, a light-emitting device can be formed without increasing the number of steps, which is preferable.

The cathode 102G can have a similar structure to the cathode 102B. The cathode 102G may be formed using the same material as the cathode 102B or a different material from the cathode 102B. In the case where the cathode 102G is formed using the same material as the cathode 102B, a light-emitting device can be formed without increasing the number of steps, which is preferable.

The light-emitting element as described above includes a layer for controlling carrier transfer. The layer for controlling carrier transfer contains at least two kinds of substances. Therefore, by controlling the combination of substances, the mixture ratio thereof, the thickness of the layer, or the like, carrier balance can be precisely controlled.

Further, since the carrier balance can be controlled by controlling the combination of substances, the mixture ratio thereof, the thickness of the layer, or the like, carrier balance can be more easily controlled than in a conventional light-emitting element. That is, the movement of carriers can be controlled not by changing the physical properties of a material used but by controlling the mixture ratio, the thickness of the layer, and the like.

Thus, it becomes possible to prevent excessive electrons from being injected and also prevent electrons from penetrating the light-emitting layer and reaching the hole-transporting layer or the hole-injecting layer. Therefore, a decrease in luminous efficiency over time can be suppressed. That is, a long-lifetime light-emitting element can be provided.

Among two or more kinds of substances contained in the first layer, the fourth organic compound included less than the third organic compound is used for controlling the movement of electrons. Therefore, the movement of electrons can be controlled with the component that is included less, among the components contained in the layer for controlling electron transfer. Thus, a long-lifetime light-emitting element which does not easily deteriorate over time can be obtained. In other words, the change of carrier balance hardly occurs, as compared with the case where the movement of carriers is controlled by a single substance. For example, when the movement of carriers is controlled by a layer made of a single substance, the balance of the whole layer is changed by a partial change in morphology or by partial crystallization. Therefore, such a light-emitting element will easily deteriorate over time. However, as shown in this embodiment mode, when the movement of carriers is controlled with the component that is included less, among all the components contained in the layer for controlling carrier transfer, it is possible to suppress the effects of morphological change, crystallization, aggregation, or the like, and thereby deterioration over time can be suppressed. Therefore, a long-lifetime light-emitting element whose luminous efficiency will not easily decrease over time can be provided.

<Red-Light-Emitting Element>

An anode 101R can have a similar structure to the anode 101B. The anode 101R may be formed using the same material as the anode 101B or a different material from the anode 101B. In the case where the anode 101R is formed using the same material as the anode 101B, a light-emitting device can be formed without increasing the number of steps, which is preferable.

There are no particular limitations on the stacked structure of the EL layer 103B, and layers formed of a substance with a high electron-transporting property, a substance with a high hole-transporting property, a substance with a high electron-injecting property, a substance with a high hole-injecting property, a bipolar substance (a substance with high electron-transporting and hole-transporting properties) and/or the like may be combined with the light-emitting layer shown in this embodiment mode as appropriate. For example, a hole-injecting layer, a hole-transporting layer, a light-emitting layer, an electron-transporting layer, an electron-injecting layer, and/or the like can be combined as appropriate to constitute the EL layer 103R. Specific materials to form each of the layers will be given below.

A light-emitting layer 113R includes a substance having a high light-emitting property, a fifth organic compound and a sixth organic compound.

In the light-emitting layer 113R, the fifth organic compound is a compound having a hole-transporting property. Specifically, an aromatic amine compound such as 4,4'-bis[N-(1-napthyl)-N-phenylamino]biphenyl (abbreviation:

NPB), 4,4'-bis[N-(9-phenanthryl)-N-phenylamino]biphenyl (abbreviation: PPB), 4,4'-bis[N-(3-methylphenyl)-N-phenylamino]biphenyl (abbreviation: TPD), 4,4'-bis[N-(9,9-dimethylfluoren-2-yl)-N-phenylamino]biphenyl (abbreviation: DFLDPBi), 4,4',4''-tris(N,N-diphenylamino)triphenylamine (abbreviation: TDATA), 4,4',4''-tris[N-(3-methylphenyl)-N-phenylamino]triphenylamine (abbreviation: m-MTDATA), 4,4',4''-tri(N-carbazolyl)triphenylamine (abbreviation: TCTA), 1,1-bis[4-(diphenylamino)phenyl]cyclohexane (abbreviation: TPAC), 9,9-bis[4-(diphenylamino)phenyl]fluorene (abbreviation: TPAF), 4-(9-carbazolyl)-4'-(5-phenyl-1,3,4-oxadiazol-2-yl)triphenylamine (abbreviation:YGAO11), or N-[4-(9-carbazolyl)phenyl]-N-phenyl-9,9-dimethylfluoren-2-amine (abbreviation: YGAF) can be used. Also, a carbazole derivative such as 4,4'-di(N-carbazolyl)biphenyl (abbreviation: CBP), 1,3-bis(N-carbazolyl)benzene (abbreviation: mCP), or 1,3,5-tris(N-carbazolyl)benzene (abbreviation: TCzB) can be used. Further, a high molecular compound such as poly(4-vinyltriphenylamine) (abbreviation: PVTPA) can also be used as such an aromatic amine compound. As a carbazole derivative, a high molecular compound such as poly(N-vinylcarbazole) (abbreviation: PVK) can also be used. The triplet excitation energy of the fifth organic compound as described above is preferably larger than that of the substance having a high light-emitting property.

On the other hand, the sixth organic compound is a compound having an electron-transporting property. Specifically, a heteroaromatic compound such as 9-[4-(5-phenyl-1,3,4-oxadiazol-2-yl)phenyl]carbazole (abbreviation: CO11), 1,3-bis[5-(p-tert-buthylphenyl)-1,3,4-oxadiazol-2-yl]benzene (abbreviation: OXD-7), 2-(4-biphenylyl)-5-(4-tert-butylphenyl)-1,3,4-oxadiazole (abbreviation: PBD), 2,2',2''-(1,3,5-benzenetriyl)tris(1-phenyl-1H-benzimidazole) (abbreviation: TPBI), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 9,9',9''-[1,3,5-triazine-2,4,6-triyl]tricarbazole (abbreviation: TCZTRZ), 2,2',2''-(1,3,5-benzenetriyl)tris(6,7-dimethyl-3-phenylquinoxaline) (abbreviation: TriMeQn), 9,9'-(quinoxaline-2,3-diyldi-4,1-phenylene)di(9H-carbazole) (abbreviation CzQn), 3,3',6,6'-tetraphenyl-9,9'-(quinoxaline-2,3-diyldi-4,1phenylene)di (9H-carbazole) (abbreviation: DCZPQ), bathophenanthroline (abbreviation: BPhen), or bathocuproine (abbreviation: BCP) can be used. A metal complex such as bis(2-methyl-8-quinolinolato)(4-phenylphenolato) aluminum(III) (abbreviation: BAlq), tris[2-(2-hydroxyphenyl)-5-phenyl-1,3,4-oxadiazolato]aluminum(III) (abbreviation: Al(OXD)$_3$), tris(2-hydroxyphenyl-1-phenyl-1H-benzimidazolato)aluminum(III) (abbreviation: Al(BIZ)$_3$), bis[2-(2-hydroxyphenyl)benzothiazolato]zinc(II) (abbreviation: Zn(BTZ)$_2$), or bis[2-(2-hydroxyphenyl)benzoxazolato] zinc(II) (abbreviation: Zn(PBO)$_2$) can be used. Further, a high molecular compound such as poly(2,5-pyridine-diyl) (abbreviation: PPy) can also be used as such a heteroaromatic compound. As a metal complex, metal complex high molecular compounds disclosed as in the following reference can also be used (TAO et al., APPLIED PHYSICS LETTERS, vol. 70, No. 12, 24 Mar. 1997, pp. 1503-1505.). Note that the triplet excitation energy of the sixth organic compound as described above is preferably larger than that of the substance having a high light-emitting property.

The high light-emitting substance included in the light-emitting layer 113R can be a substance which emits phosphorescence. For example, bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N,C$^{2'}$iridium (III) acetylacetonate (abbreviation: Ir(piq)$_2$(acac)), tris(1-phenylisoquinolinato-N,C$^{2'}$)iridium(III) (abbreviation: Ir(piq)$_3$) and the like can be given. In particular, an organometallic complex which has a ligand of a pyrazine skeleton and whose central metal belongs to Group 9 or 10 (hereinafter, referred to a pyrazine-based organometallic complex) emits phosphorescence with much higher efficiency as compared to known phosphorescent organometallic complexes, which is preferable.

Figure 4:
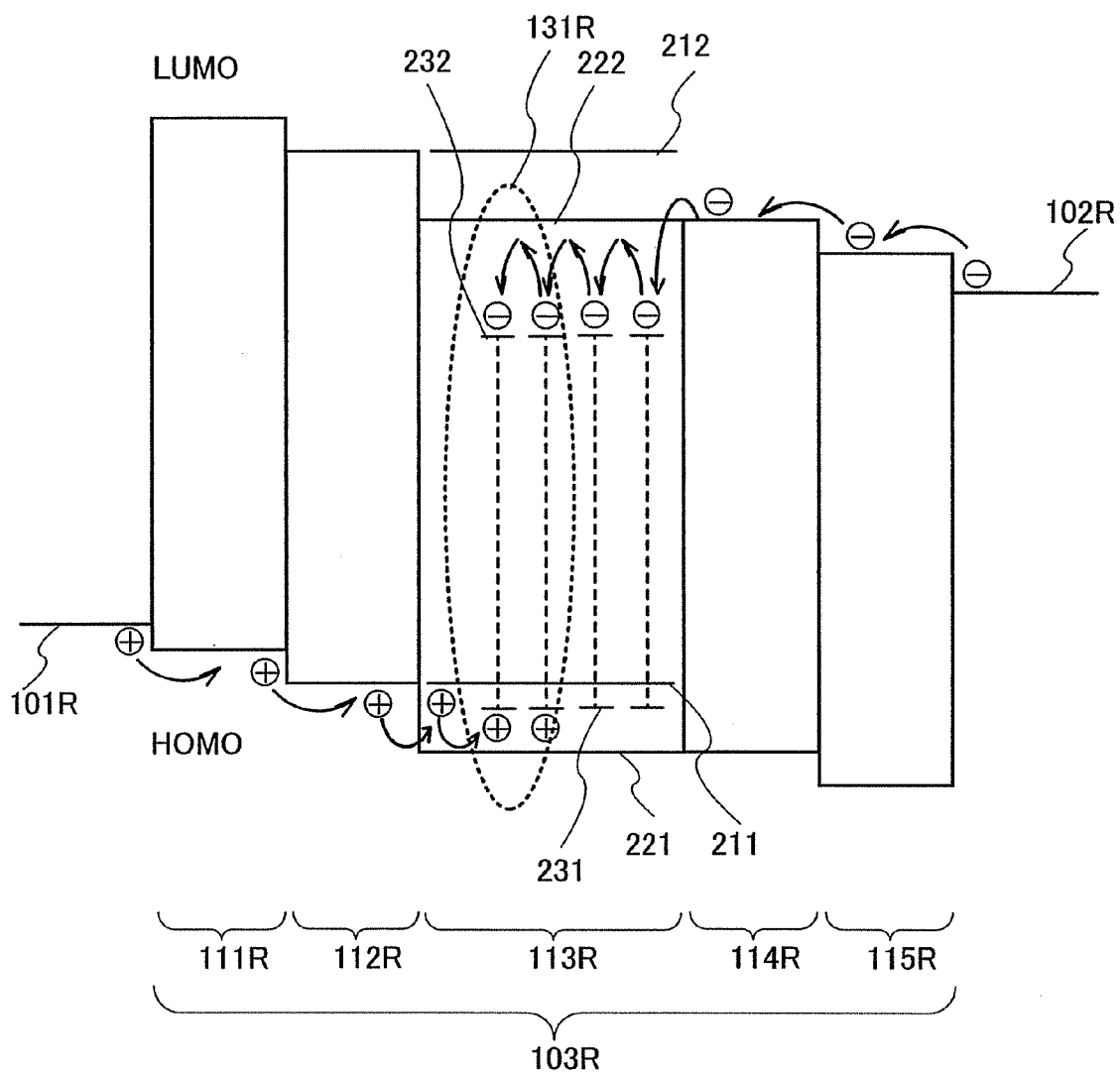
FIG. 4 illustrates a light-emitting device according to an aspect of the present invention.

FIG. 4 exemplarily shows a band diagram of the red-light-emitting element shown in FIG. 1. The light-emitting layer 113R shown in FIG. 4 includes a fifth organic compound having a hole-transporting property, a sixth organic compound having an electron-transporting property and a pyrazine-based organometallic complex. Since a LUMO level 232 of the pyrazine-based organometallic complex is lower than a LUMO level 212 of the fifth organic compound and a LUMO level 222 of the sixth organic compound, electrons are trapped by the LUMO level 232 of the pyrazine-based organometallic complex. Note that since the sixth organic compound has an electron-transporting property, some electrons are trapped by the LUMO level 232 of the pyrazine-based organometallic complex, but some electrons are transported through the LUMO level 232 of the pyrazine-based organometallic complex and to the hole-transporting layer 112R side little by little. On the other hand, since the fifth organic compound has a hole-transporting property and also a hole-accepting property, holes are injected into a HOMO level 211 of the fifth organic compound first. Holes are difficult to be injected into the HOMO level 221 of the sixth organic compound. At that time, by controlling the amount of the fifth organic compound, the mobility of the injected holes can be controlled. Thus, the mobility can be adjusted to the mobility of electrons coming from an electron-transporting layer 114R side. In other words, in the light-emitting layer 113R, holes and electrons can be balanced well. Holes are injected into a HOMO level 231 of the pyrazine-based organometallic complex and are recombined with electrons trapped there, so that light is emitted. In the light-emitting element having such a structure, the amounts of the fifth organic compound, the sixth organic compound, and the pyrazine-based organometallic complex are controlled, so that the location of a light-emitting region 131R can be controlled.

As described above, the fifth organic compound, the sixth organic compound and the pyrazine-based organometallic complex are combined suitably to constitute a light-emitting layer. Specific examples of the pyrazine-based organometallic complex will be described in Embodiment Mode 2. Note that the light-emitting layer may include another substance.

In the light-emitting layer, preferably, at least one of the fifth organic compound and the sixth organic compound serves as a host material and the pyrazine-based organometallic complex serves as a guest material. This is in order to prevent concentration quenching of the pyrazine-based organometallic complex. Also, this is in order that the carrier balance in the light-emitting layer can be adjusted by the fifth organic compound and the sixth organic compound.

Therefore, in the light-emitting element of the present invention, preferably, the amount of the fifth organic compound and/or the sixth organic compound is larger than that of the pyrazine-based organometallic complex. Specifically, its volume fraction or its mass fraction is preferably high. In addition, in terms of prevention of concentration quenching, the ratio of the pyrazine-based organometallic complex to the light-emitting layer is preferably from 1 mass % to 10 mass %, inclusive.

In the light-emitting layer, the mass ratio of the fifth organic compound to the sixth organic compound is preferably in the range of from 1:20 to 20:1. In other words, the mass ratio of the sixth organic compound to the fifth organic compound is preferably from 1/20 to 20, inclusive. If the mass ratio is out of the range, the state of the light-emitting layer may be substantially identical to the state in which only the fifth organic compound and the pyrazine-based organometallic complex are included in the light-emitting layer or the state in which only the sixth organic compound and the pyrazine-based organometallic complex are included in the light-emitting layer.

The present inventors have found that the structure of the light-emitting layer in which the amount of the sixth organic compound having an electron-transporting property is equal to or higher than that of the fifth organic compound having a hole-transporting property is extremely effective. This appears to be caused from that the hole mobility is higher than the electron mobility in general organic compounds. Accordingly, in the present invention, the mass ratio of the sixth organic compound to the fifth organic compound is more preferably from 1 to 20, inclusive. The range which is extremely effective for obtaining long lifetime is from 5 to 20, inclusive, in particular.

The electron-trapping property of the pyrazine-based organometallic complex used in the present invention is often deeper than the LUMO level of the fifth organic compound and the LUMO level of the sixth organic compound by 0.2 eV or more, specifically. In such a case, the lifetime improvement and the efficiency improvement are significant, and thus one feature of the present invention is that the LUMO level of the pyrazine-based organometallic complex is deeper than the LUMO level of the fifth organic compound and the LUMO level of the sixth organic compound by 0.2 eV or more.

Next, layers other than the light-emitting layer 113R are described. A hole-transporting layer 112R and a hole-injecting layer 111R are not necessarily provided, and they may be provided as necessary. Specific materials for forming these layers are preferably hole-transporting compounds, and NPB, PPB, TPD, DFLDPBi, TDATA, m-MTDATA, TCTA, TPAC, TPAF, YGAO11, YGAF, CBP, mCP, TCzB, PVTPA, PVK or the like as described above can be used. An anthracene derivative having a low triplet excitation energy such as 9,10-bis[4-(diphenylamino)phenyl]anthracene (abbreviation: TPA2A) or 2-tert-butyl-9,10-di(2-naphthyl)anthracene (abbreviation: t-BuDNA) can also be used.

This feature can be explained as below. The light-emitting layer 113R has a good carrier balance as described above, and the light-emitting region does not exist close to the interface between the light-emitting layer 113R and the hole-transporting layer 112R. Therefore, if a substance having lower triplet excitation energy than the pyrazine-based organometallic complex is applied to the hole-transporting layer 112R, the substance is difficult to serve as a quencher to the pyrazine-based organometallic complex.

In other words, it is not necessary to consider the triplet excitation energy and thus a material used can be selected from a wider range of choices. Thus, a hole-transporting layer 112R can have a similar structure to the hole-transporting layer 112B. The hole-transporting layer 112R may be formed using the same material as the hole-transporting layer 112B or a different material from the hole-transporting layer 112B. In the case where the hole-transporting layer 112R is formed using the same material as the hole-transporting layer 112B, a light-emitting device can be formed without increasing the number of steps, which is preferable.

A hole-injecting layer 111R can have a similar structure to the hole-injecting layer 111B. The hole-injecting layer 111R may be formed using the same material as the hole-injecting layer 111B or a different material from the hole-injecting layer 111B. In the case where the hole-injecting layer 111R is formed using the same material as the hole-injecting layer 111B, a light-emitting device can be formed without increasing the number of steps, which is preferable.

The electron-transporting layer 114R and an electron-injecting layer 115R are not necessarily required, and may be provided as necessary. As a specific material which forms these layers, an electron-transporting compound is preferable. The above-described CO11, OXD-7, PBD, TPBI, TAZ, p-EtTAZ, TCzTRz, TriMeQn, CzQn, DCZPQ, BPhen, BCP, BAlq, Al(OXD)$_3$, Al(BIZ)$_3$, Zn(BTZ)$_2$, Zn (PBO)$_2$, PPy, or the like can be used. A substance having a low triplet excitation energy such as tris(8-quinolinolato)aluminum(III) (abbreviation: Alq$_3$), tris(4-methyl-8-quinolinolato)aluminum (III) (abbreviation: Almq$_3$), or bis(10-hydroxybenzo[h]quinolinato)berylium(II) (abbreviation: BeBq$_2$) can be used (for example, it is reported that the phosphorescence spectrum of Alq$_3$ is about 650 to 700 mm of deep red).

This feature can be explained as below. The light-emitting layer 113R has a good carrier balance as described above, and a light-emitting region does not exist close to the interface between the light-emitting layer 113R and the electron-transporting layer 114R. Therefore, even if a substance having a lower triplet excitation energy than the pyrazine-based organometallic complex is applied to the electron-transporting layer 114R, the substance is difficult to serve as a quencher to the pyrazine-based organometallic complex.

In other words, it is not necessary to consider the triplet excitation energy and thus a material used can be selected from a wider range of choices. The electron-transporting layer 114R can have a similar structure to the electron-transporting layer 114B. The electron-transporting layer 114R may be formed using the same material as the electron-transporting layer 114B or a different material from the electron-transporting layer 114B. In the case where the electron-transporting layer 114R is formed using the same material as the electron-transporting layer 114B, a light-emitting device can be formed without increasing the number of steps, which is preferable.

Similarly, the electron-injecting layer 115R can have a similar structure to the electron-injecting layer 115B. The electron-injecting layer 115R may be formed using the same material as the electron-injecting layer 115B or a different material from the electron-injecting layer 115B. In the case where the electron-injecting layer 115R is formed using the same material as the electron-injecting layer 115B, a light-emitting device can be formed without increasing the number of steps, which is preferable.

A cathode 102R can have a similar structure to the cathode 102B. The cathode 102R may be formed using the same material as the cathode 102B or a different material from the cathode 102B. In the case where the cathode 102R is formed using the same material as the cathode 102B, a light-emitting device can be formed without increasing the number of steps, which is preferable.

The blue-light-emitting element, the green-light-emitting element, and the red-light-emitting element can each have a suitable structure as described above, and thus the light-emitting device of the present invention can have excellent characteristics.

Figure 12:
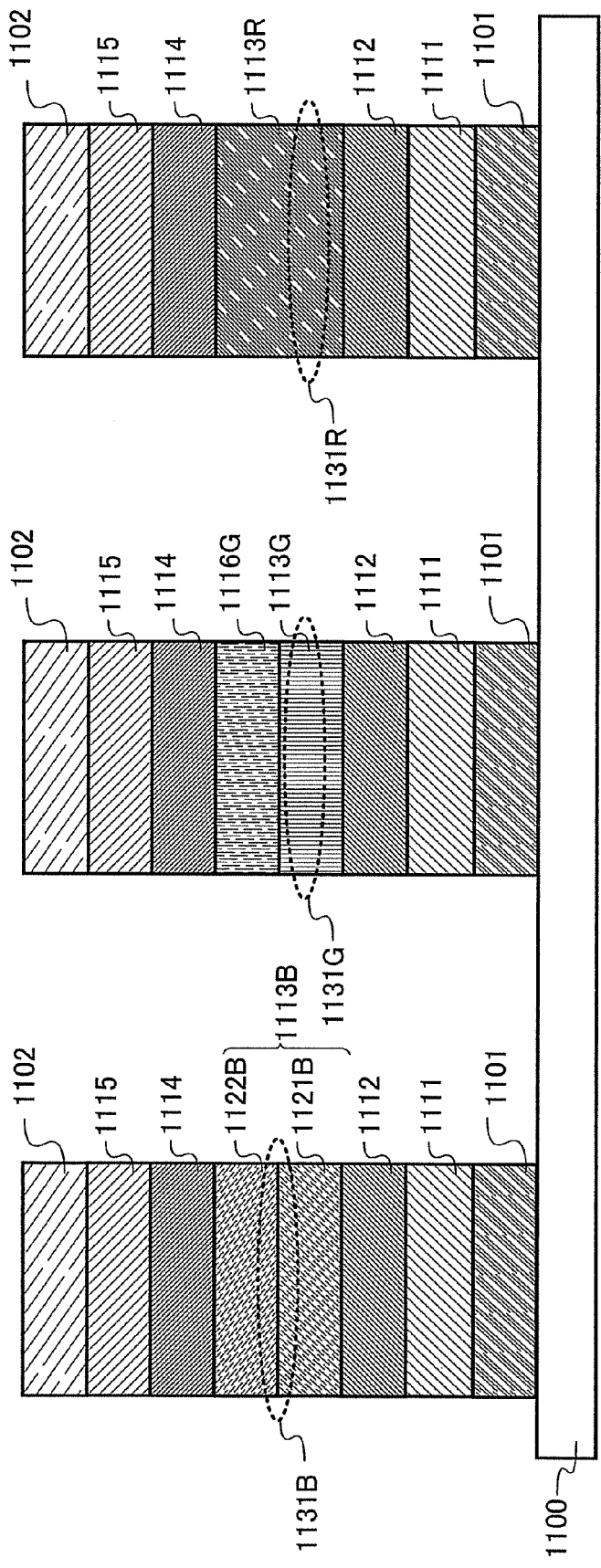
FIG. 12 illustrates a light-emitting device according to an aspect of the present invention.

Further, in the light-emitting device of the present invention, layers other than the light-emitting layer of the respective light-emitting devices can be formed in common. In other words, the layers other than the light-emitting layers can have the same structure. FIG. 12 illustrates a light-emitting device in which layers other than the light-emitting layers are formed in common, as an example. First, in each light-emitting element, an anode 1101, a hole-injecting layer 1111, and a hole-transporting layer 1112 are formed over a substrate 1100 in common. Then, a light-emitting layer 1113B, a light-emitting layer 1113G, and a layer 1116G for controlling carrier transfer, and a light-emitting layer 1113R are formed for the blue-light-emitting element, the green-light-emitting element, and the red-light-emitting element, respectively. Then, an electron-transporting layer 1114, an electron-injecting layer 1115 and a cathode 1102 are formed in each light-emitting element in common. As illustrated in FIG. 12, the layers other than the light-emitting layer have the same structure, thereby making it possible to simplify the manufacturing process of the light-emitting device.

Furthermore, in the light-emitting device of the present invention, the light-emitting regions of the light-emitting layers in the respective light-emitting elements are different from each other. Specifically, it is possible to arrange the respective light-emitting region closer to the electrode serving as an anode in the order of the blue-light-emitting element, the green-light-emitting element, and the red-light-emitting element. As described above, in the blue-light-emitting element, the light-emitting region 1131B exists near the interface between the first light-emitting layer 1121B and the second light-emitting layer 1122B. In the green-light-emitting element, the light-emitting region 1131G exists in a portion from the light-emitting layer 1113G to the vicinity of the interface between the light-emitting layer 1113G and the layer 1116G for controlling carrier transfer. In the red-light-emitting element, the amounts of the fifth organic compound, the sixth organic compound, and the pyrazine-based organometallic complex included in the light-emitting layer 1113R are adjusted, so that the location of the light-emitting region 1131R can be controlled. Accordingly, when a reflective electrode is used as the cathode, the design can be made such that the light-emitting region of the blue-light-emitting element having a short emission wavelength exists closest to the cathode, and as the emission wavelengths of the light-emitting elements are longer, the green-light-emitting element and the red-light-emitting element are arranged in this order in the way that the distance from the cathode is longer. In other words, the structure is suitable for optical design of light-emitting elements. Therefore, the distance to the reflective electrode can be an optical distance which is suitable for the emission wavelength, which leads to increase of extraction efficiency of light.

As a method forming the EL layer, various methods can be used regardless of a dry process or a wet process. For example, a vacuum evaporation method, an ink-jet method, a spin coating method, or the like may be used. Further, different deposition methods may be used for different electrodes or different layers.

For example, among the above-described materials, a high molecular compound may be used to form the EL layer by a wet process. Alternatively, a low molecular organic compound may be used to form the EL layer by a wet process. Further, it is also possible to form the EL layer by using a low molecular organic compound and using a dry process such as a vacuum evaporation method.

Similarly, the electrodes can be formed by a wet process such as a sol-gel process or by a wet process with a paste of a metal material. Alternatively, the electrodes can be formed by a dry process such as a sputtering method or a vacuum evaporation method.

In the case where the light-emitting element shown in this embodiment mode is applied to a display device and its light-emitting layer is selectively deposited according to each color, the light-emitting layer is preferably formed by a wet process. When the light-emitting layer is formed by an ink-jet method, selective deposition of the light-emitting layer for each color can be easily performed even when a large substrate is used.

In the light-emitting element having the above-described structure, shown in this embodiment mode, current flows when a voltage is applied between the anode 101 and the cathode 102. At that time, holes and electrons are recombined in the light-emitting layer 113, which is a layer including a high light-emitting substance, so that light is emitted. In other words, the light-emitting region is formed in the light-emitting layer 113.

Light is extracted outside through one or both of the anode 101 and the cathode 102. Therefore, one or both of the anode 101 and the cathode 102 is a light-transmitting electrode. When only the anode 101 is a light-transmitting electrode, light is extracted from the substrate side through the anode 101. Meanwhile, when only the cathode 102 is a light-transmitting electrode, light is extracted from a side opposite to the substrate side through the cathode 102. When both of the anode 101 and the cathode 102 are light-transmitting electrodes, light is extracted from both the substrate side and the side opposite to the substrate side through the anode 101 and the cathode 102

Figure 5:
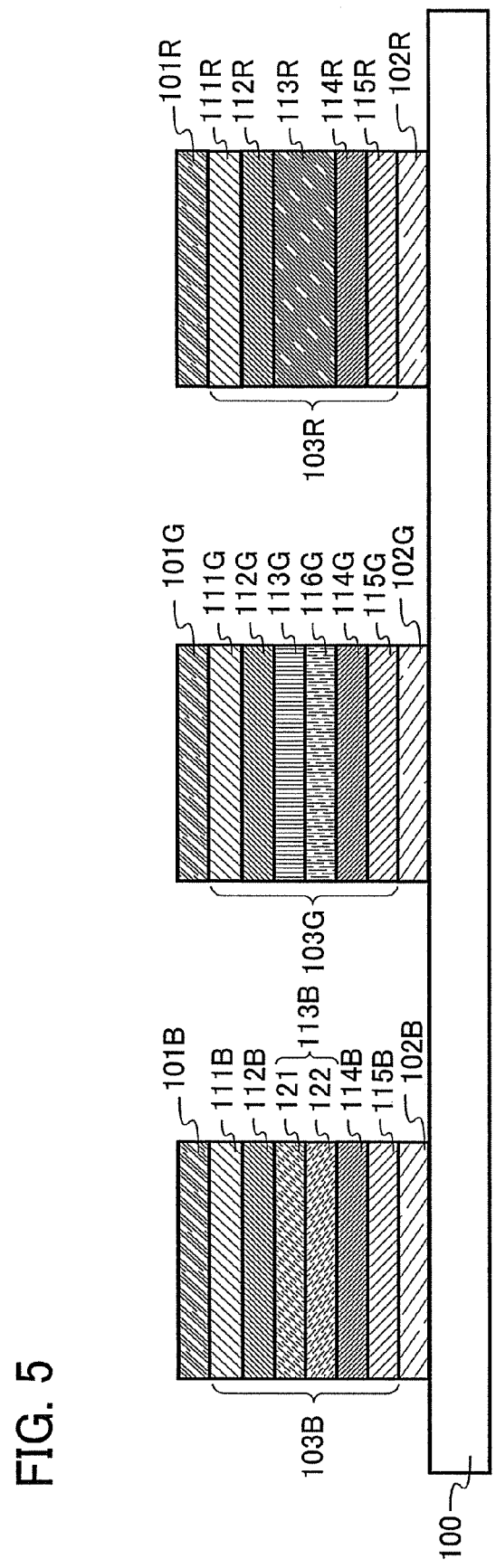
FIG. 5 illustrates a light-emitting device according to an aspect of the present invention.

Although FIG. 1 illustrates the structure in which the anode 101 is provided on the substrate 100 side, the cathode 102 may be provided on the substrate 100 side. In FIG. 5, the cathode 102, the EL layer 103, and the anode 101 are stacked over the substrate 100 in this order. The layers included in the EL layer 103 are stacked in the inverse order of the structure illustrated in FIG. 1.

In this embodiment mode, the light-emitting element is formed over a substrate made of glass, plastic, or the like. When a plurality of such light-emitting elements are formed over one substrate, a passive matrix light-emitting device can be formed. In addition, it is possible to form, for example, thin film transistors (TFTs) over a substrate made of glass, plastic, or the like and form light-emitting elements on electrodes that are electrically connected to the TFTs. Accordingly, an active matrix light-emitting device in which drive of the light-emitting elements is controlled with the TFTs can be formed. Note that the structure of the TFTs is not particularly limited. Either staggered TFTs or inversely staggered TFTs may be employed. In addition, a driver circuit formed on a TFT substrate may be constructed from both n-channel and p-channel TFTs or from either n-channel TFTs or p-channel TFTs. Further, the crystallinity of a semiconductor film used for forming the TFTs is not specifically limited. Either an amorphous semiconductor film or a crystalline semiconductor film may be used.

Embodiment Mode 2

Embodiment Mode 2 will specifically describe a structure of a pyrazine-based organometallic complex which can be used for a light-emitting device of the present invention.

The pyrazine-based organometallic complex is an organometallic complex which has a ligand having a pyrazine skeleton, and whose a central metal is an element belonging to Group 9 (Co, Rh, Ir) or an element belonging to Group 10 (Ni, Pd, Pt). Further, the organometallic complex should have a property of emitting phosphorescence.

Many of organometallic complexes belonging to Group 9 or 10 exhibit MLCT (Metal to Ligand Charge Transfer) transition. In particular, the triplet MLCT transition is often observed in phosphorescent compounds. The LUMO level of the organometallic complex exhibiting MLCT transition is determined by the rank of the LUMO level of a ligand. Thus, if a ligand having a high LUMO level is used, the LUMO level of the organometallic complex is also high, and if a ligand having a low LUMO level, the LUMO level of the organometallic complex is also low. Pyrazine has a LUMO level lower than pyridine, and thus, a pyrazine-based organometallic complex used in the present invention exhibits a LUMO level lower (i.e., a higher electron-trapping property) than a conventional pyridine-based organometallic complex.

A ligand of the pyrazine-based organometallic complex used in the present invention may have a pyrazine skeleton. In particular, when the ligand is a 2-arylpyrazine derivative, the ligand can be cyclometalated to the central metal. The cyclometalated complex can realize a high phosphorescence quantum yield. Therefore, the ligand is preferably a 2-arylpyrazine derivative. Further, when a 2-phenylpyrazine derivative which is a kind of 2-arylpyrazine derivatives is a ligand, the ligand can be ortho-metalated to the central metal (ortho-metalation is a kind of cyclometalation). The present inventors have found that such an ortho-metal complex in which 2-phenylpyrazine is ortho-metalated can realize particularly high phosphorescence quantum yield. Therefore, a preferred mode of the ligand is a 2-phenylpyrazine derivative.

Hereinafter, specific examples of organometallic complexes using a 2-arylpyrazine derivative as a ligand are given.

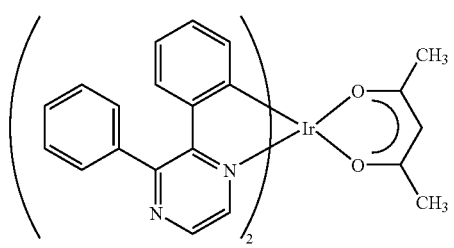

(1)

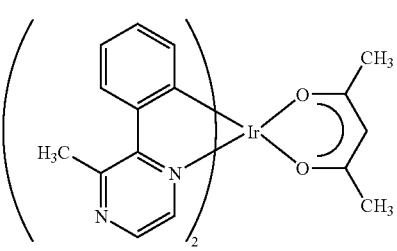

(2)

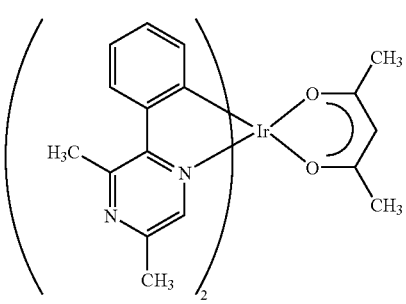

(3)

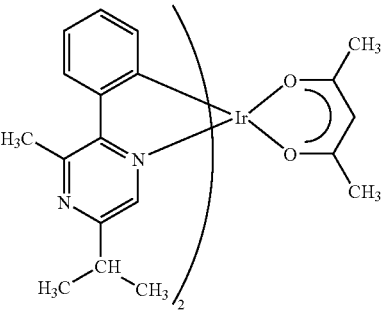

(4)

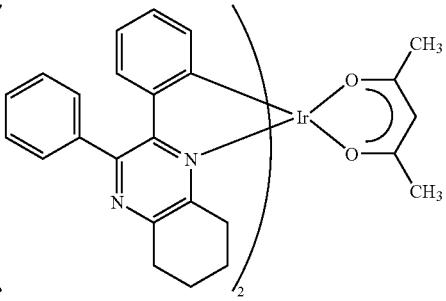

(5)

Among organometallic complexes in which a 2-phenylpyrazine derivative is ortho-metalated, an organometallic complex in which a 2,5-diphenylpyrazine derivative is ortho-metalated has a still deeper LUMO level. Therefore, when a ligand is a 2,5-diphenylpyrazine derivative, the effect of a light-emitting element shown in Embodiment Mode 1 is remarkable, which is preferable.

As an organometallic complex in which a 2,5-diphenylpyrazine derivative is ortho-metalated, an organometallic complex having the following general formula (G1) is given.

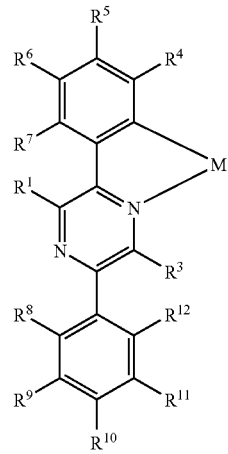

(G1)

In the formula, $R^1$ represents either an alkyl group or a phenyl group. In the case where $R^1$ represents a phenyl group, it may have another substituent, and as a substituent, an alkyl group, halogen, a haloalkyl group, an alkoxy group, and an alkoxycarbonyl group are given. $R^3$ represents either hydrogen or an alkyl group. $R^4$ to $R^{12}$ represent any of hydrogen, an alkyl group, a halogen group, a haloalkyl group, an alkoxy group, and an alkoxycarbonyl group. In addition, M is a central metal, and represents either an element belonging to Group 9 or an element belonging to Group 10.

Specifically, the organometallic complex having a structure represented by the general formula (G1) is preferably a mixed ligand organometallic complex having a ligand L represented by the general formula (G2) other than the pyrazine derivative. This is because such a complex is easy to be synthesized.

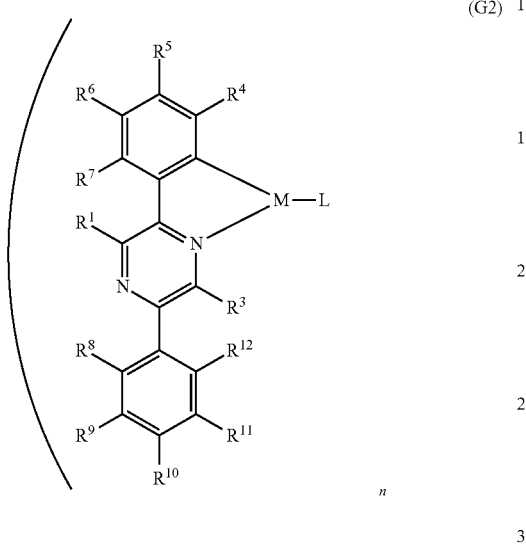

(G2)

In the formula, $R^1$ represents either an alkyl group or a phenyl group. In the case where $R^1$ represents a phenyl group, it may have another substituent, and as a substituent, an alkyl group, halogen, a haloalkyl group, an alkoxy group, and an alkoxycarbonyl group are given. $R^3$ represents either hydrogen or an alkyl group. In addition, $R^4$ to $R^{12}$ independently represent one of hydrogen, an alkyl group, halogen, a haloalkyl group, an alkoxy group, and an alkoxycarbonyl group. In addition, M is a central metal, and represents either an element belonging to Group 9 or an element belonging to Group 10. L is a monoanionic ligand. When the M is an element belonging to Group 9, n is 2 (n=2) and when the M is an element belonging to Group 10, n is 1 (n=1).

The central metal of the above pyrazine-based organometallic complex is preferably iridium or platinum in terms of heavy atom effect. In particular, iridium is preferable since iridium can provide remarkable heavy atom effect, extremely high efficiency and is chemically stable.

Next, the arylene group $A_r$, each subsistent $R^1$ to $R^{12}$, and the monoanionic ligand L in the above general formulae (G1) and (G2) are described in detail.

$R^1$ represents either an alkyl group or a phenyl group. Further, the phenyl group may have a substituent. As the substituent at that time, an alkyl group, a halogen group, a haloalkyl group, an alkoxy group, an alkoxycarbonyl group or the like can be used.

$R^3$ represents hydrogen or an alkyl group.

$R^4$ to $R^{12}$ independently represent hydrogen, an alkyl group, a halogen group, a haloalkyl group, an alkoxy group, or an alkoxycarbonyl group.

In the above structure, the alkyl group preferably has 1 to 4 carbon atoms, specifically, a methyl group, an ethyl group, an isopropyl group, a t-butyl group or the like can be given. In addition, a fluoro group, and a chloro group are nominated for a halogen group, and a fluoro group is preferable in terms of chemical stability. As the haloalkyl group, a trifluoromethyl group is preferable. Further, the alkoxy group preferably has 1 to 4 carbon atoms, specifically, a methoxy group, an ethoxy group, an isopropoxy group, and a t-butoxy group are given. In addition, the alkoxycarbonyl group preferably has 2 to 5 carbon atoms, and specifically, a methoxycarbonyl group, an ethoxycarbonyl group, an isopropoxy carbonyl group, and a t-butoxycarbonyl group are nominated for the alkoxycarbonyl group.

Next, the monoanionic ligand L will be described. The monoanionic ligand L is preferably a monoanionic bidentate chelate ligand having a β-diketone structure, a monoanionic bidentate chelate ligand having a carboxyl group, a monoanionic bidentate chelate ligand having a phenolic hydroxyl group, or a monoanionic bidentate chelate ligand in which two ligand elements are both nitrogen, since they have a high coordinative ability. More specifically, monoanionic ligands represented by the following structural formulae (L1) to (L8) are given. However, the monoanionic ligand L is not limited to these ligands.

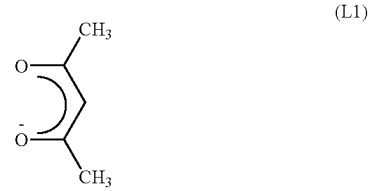

(L1)

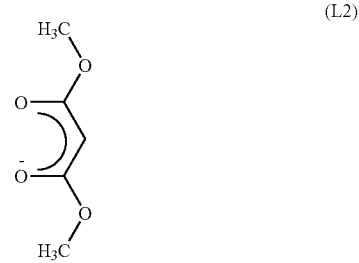

(L2)

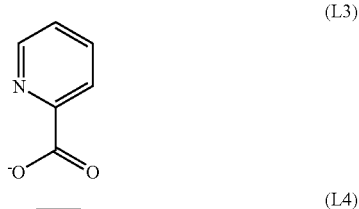

(L3)

(L4)

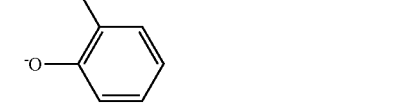

(L5)

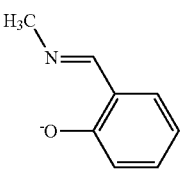

(L6)

(L7)
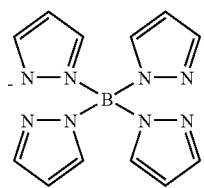
(L8)
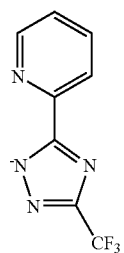
Specific structural formulae of the above-described general formulae (G1) and (G2) are given below (the structural formulae (1) to (20)). Note that the pyrazine-based organometallic complex of the present invention is not limited to these complexes.
(6)
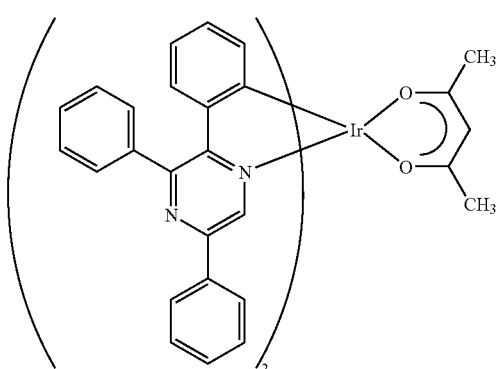
(7)
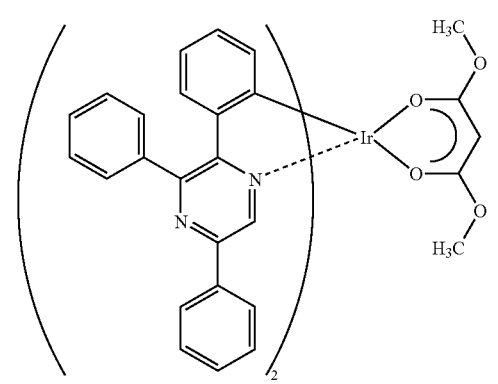
(8)
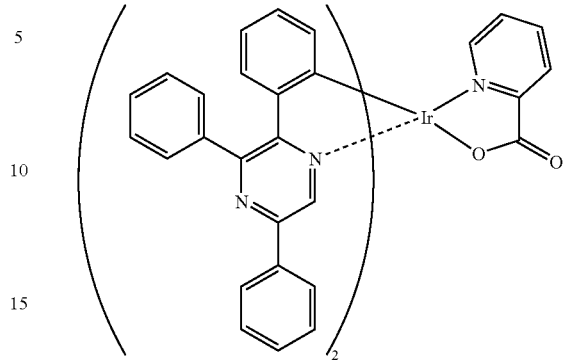
(9)
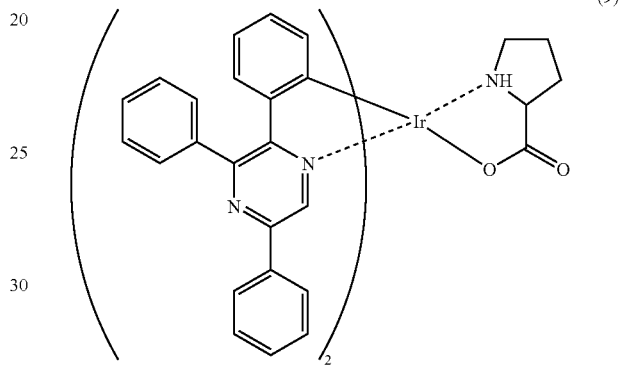
(10)
(11)
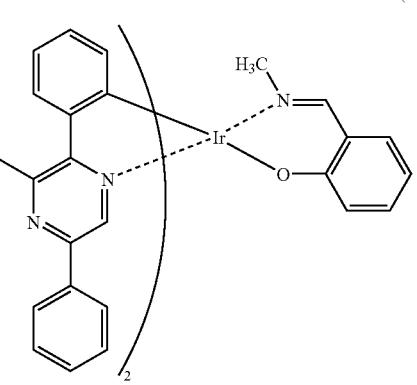

(12)
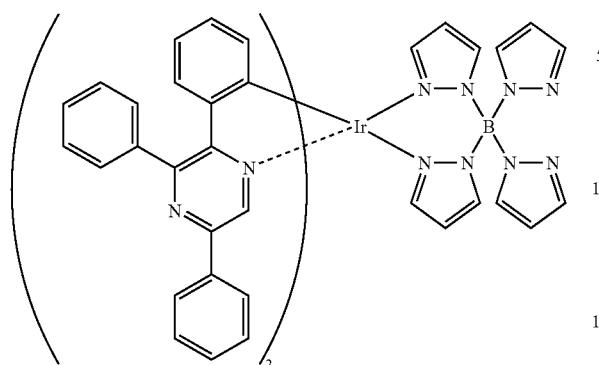
(13)
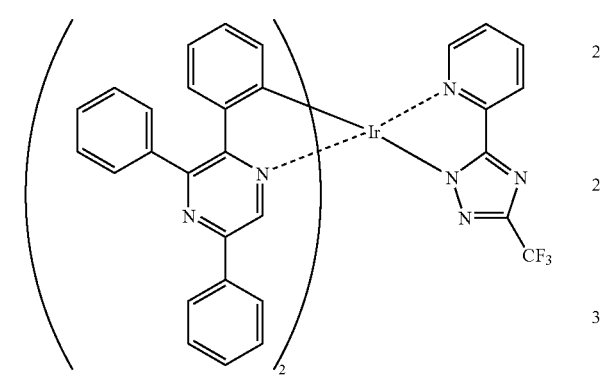
(14)
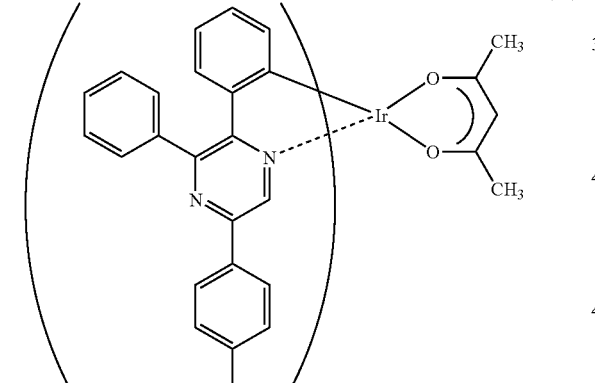
(15)
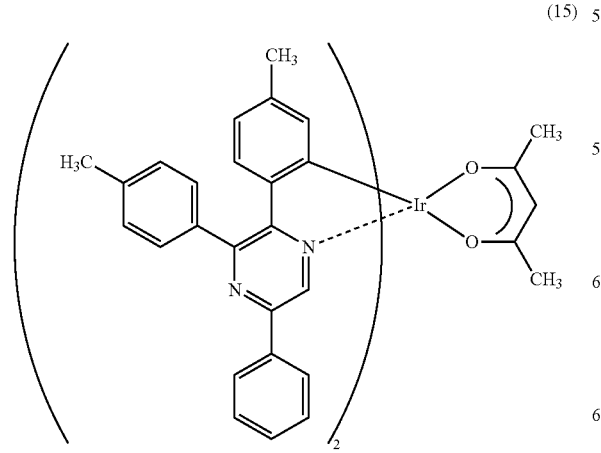
(16)
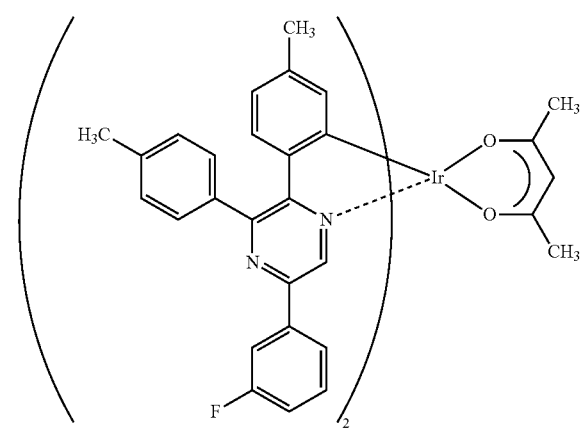
(17)
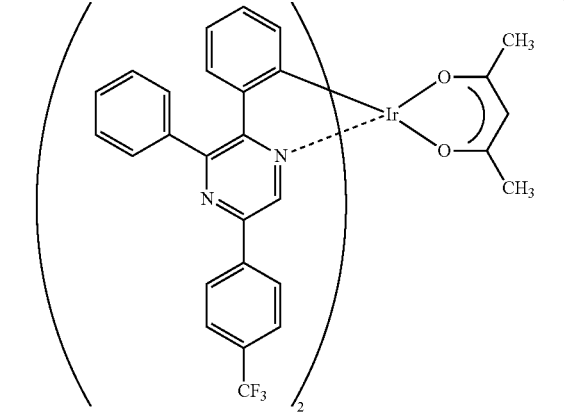
(18)
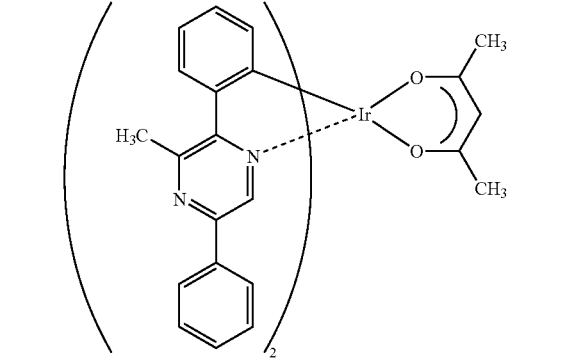
(19)
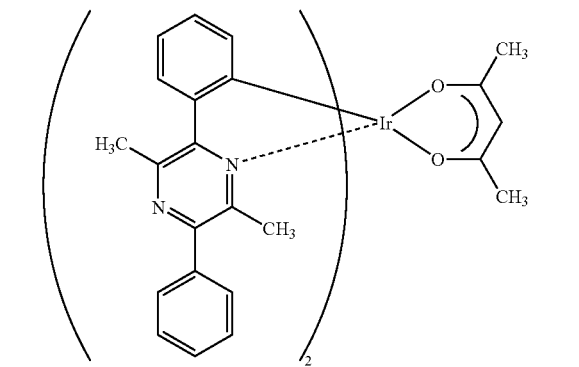

-continued (20)

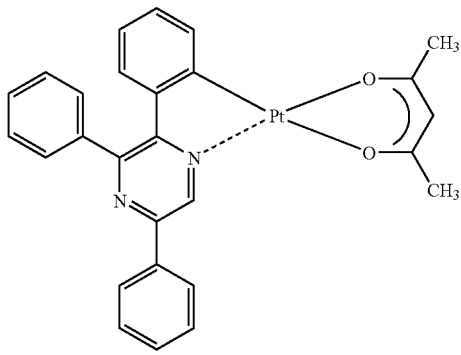

Embodiment Mode 3

An example of a cross sectional view of a light-emitting device formed according to the present invention will be described with reference to FIG. 9.

Figure 9:
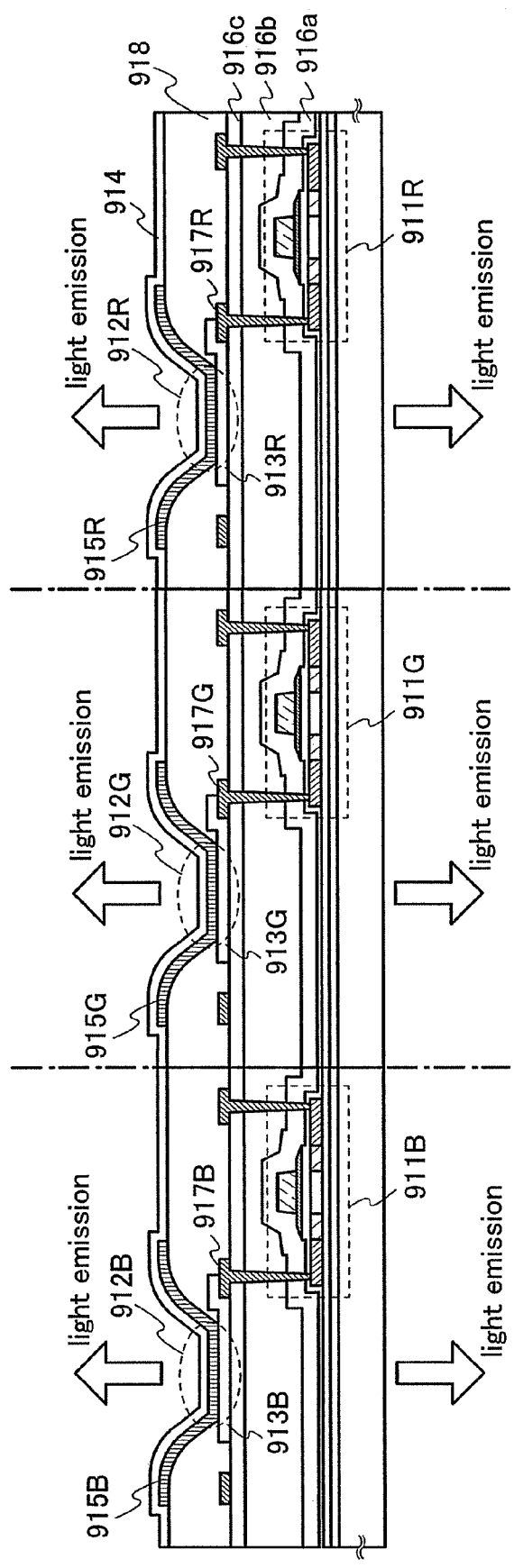
FIG. 9 illustrates a light-emitting device according to an aspect of the present invention.

In FIG. 9, a region surrounded by a dashed line represents a transistor 911 which is provided for driving a light-emitting element 912 shown in Embodiment Mode 1. The light-emitting element 912, which is a light-emitting element of the present invention, comprises an EL layer 915 between a first electrode 913 and a second electrode 914. The EL layer 915 has the structure shown in Embodiment Mode 1. A drain of the transistor 911 and the first electrode 913 are electrically connected to each other by a wiring 917 which extends through a first interlayer insulating film 916 (916a, 916b and 916c). The light-emitting element 912 is isolated from other light-emitting elements provided adjacently to the light-emitting element 912 by a partition layer 918. The light-emitting device of the present invention having this structure is provided over a substrate 910 in this embodiment mode.

The transistor 911 as shown in FIG. 9 is a top-gate type transistor in which a gate electrode is provided on a side of a semiconductor layer opposite to the substrate. Further, the structure of the transistor 911 is not especially limited. For example, a bottom-gate type transistor may be employed. In the case of using a bottom-gate type transistor, either a transistor in which a protection film is formed over a semiconductor layer forming a channel (a channel protection type transistor) or a transistor in which a part of a semiconductor layer forming a channel is etched (a channel etched type transistor) may be used.

The semiconductor layer constituting a part of the transistor 911 may be any of a crystalline semiconductor, a non-crystalline semiconductor, a semiamorphous semiconductor, and the like. Concretely, the semiamorphous semiconductor has an intermediate structure between an amorphous structure and a crystalline structure (including a single crystalline structure and a polycrystalline structure), and a third condition that is stable in term of free energy. The semiamorphous semiconductor further includes a crystalline region having a short range order along with lattice distortion. Crystal grains with a size of 0.5 to 20 nm is included in at least a part of a semiamorphous film. Raman spectrum is shifted toward a lower wavenumber than 520 $cm^{-1}$. The diffraction peak of (111) or (220), which is believed to be derived from Si crystal lattice, is observed in the semiamorphous semiconductor by the X-ray diffraction. The semiamorphous semiconductor contains hydrogen or halogen of 1 at. % or more for terminating dangling bonds. The semiamorphous semiconductor is also referred to as a microcrystalline semiconductor.

The semiamorphous semiconductor is formed by glow discharge decomposition of a source gas of a silicon compound (plasma CVD). As for the source gas of a silicon compound, $SiH_4$, $Si_2H_6$, $SiH_2Cl_2$, $SiHCl_3$, $SiCl_4$, $SiF_4$ or the like can be used. The silicon compound source gas may also be diluted with $H_2$, or a mixture of $H_2$ and one or more of rare gas elements selected from the group consisting of He, Ar, Kr and Ne. The dilution ratio is set to be in the range of from 1:2 to 1:1,000. The pressure is set to be approximately in the range of from 0.1 to 133 Pa. The power frequency is set to be from 1 to 120 MHz, preferably, from 13 to 60 MHz. The substrate heating temperature may be set to be 300° C. or lower, more preferably, from 100 to 250° C. As to impurity elements contained in the film, each concentration of impurities for atmospheric constituents such as oxygen, nitrogen and carbon is preferably set to be $1\times10^{20}/cm^3$ or less. In particular, the oxygen concentration is set to be $5\times10^{19}/cm^3$ or less, preferably, $1\times10^{19}/cm^3$ or less.

As a specific example of a crystalline semiconductor layer, a semiconductor layer made from single crystalline silicon, polycrystalline silicon, silicon germanium, or the like can be cited. These materials may be formed by laser crystallization. For example, these materials may be formed by crystallization with use of a solid phase growth method using nickel or the like.

When a semiconductor layer is formed with an amorphous substance, e.g., amorphous silicon, it is preferable to use a light-emitting device with a circuit including only n-channel transistors as the transistor 911 and the other transistors (transistors included in a circuit for driving the light-emitting element). In the other cases, a light-emitting device with a circuit including either an n-channel transistor or a p-channel transistor may be employed. Also, a light-emitting device with a circuit including both an n-channel transistor and a p-channel transistor may be used.

The first interlayer insulating film 916 may include plural layers as shown in FIG. 9 or a single layer. The interlayer insulating film 916a is made from an inorganic material such as silicon oxide and silicon nitride. The interlayer insulating film 916b is made with acrylic or siloxane (which is a compound that has a skeleton formed by a silicon (Si)-oxygen (O) bond, and as a substituent, an organic group containing at least hydrogen (e.g., an alkyl group or aromatic hydrocarbon) is used, or as a substituent, a fluoro group may be used. Further, as a substituent, an organic group containing at least hydrogen and a fluoro group may be used.) or a substance with a self-planarizing property which can be formed by a coating method, such as silicon oxide. The interlayer insulating film 916c is made with a silicon nitride film containing argon (Ar). The substances constituting each layer are not especially limited. Therefore, substances other than the above-mentioned substances may be employed. Alternatively, a layer made with a substance other than the above-mentioned substances may be used in combination. Accordingly, the first interlayer insulating film 916 may be formed using both an inorganic material and an organic material or using either an inorganic material or an organic material.

The edge portion of the partition layer 918 preferably has a shape in which the radius of curvature is continuously varied. This partition layer 918 is formed using acrylic resin, a siloxane compound, silicon oxide or the like. Further, the partition layer 918 may be made with one of or both an inorganic film and an organic film.

FIG. 9 illustrates a structure in which only the first interlayer insulating film 916 (including the first interlayer insulating films 16a to 16c) is sandwiched between the transistor 911 and the light-emitting element 912. Alternatively, in addition to the first interlayer insulating film 916 (916a and 916b), a second interlayer insulating film may be provided The second interlayer insulating film may include either plural layers or a single layer, as well as the first interlayer insulating film 916. The substances constituting each layer are not especially limited. Therefore, substances other than the above-mentioned substances may be employed. Alternatively, a layer made with a substance other than the above-mentioned substances may be used in combination. Accordingly, the second interlayer insulating film may be formed using both an inorganic material and an organic material or using either an inorganic material or an organic material.

When the first electrode and the second electrode each are formed using a substance with a light-transmitting property in the light-emitting element 912, light can be emitted through both the first electrode 913 and the second electrode 914 as shown in the outline arrows in FIG. 9. When only the second electrode 914 is made with a substance with a light-transmitting property, light can be emitted only through the second electrode 914. In this case, the first electrode 913 is preferably made with a material with high reflectance or a film (reflective film) made with a material with high reflectance is preferably provided under the first electrode 913. When only the first electrode 913 is made with a substance with a light-transmitting property, light can be emitted only through the first electrode 913. In this case, the second electrode 914 is preferably made using a material with high reflectance or a reflective film is preferably provided over the second electrode 914.

Moreover, the light-emitting element 912 may have a structure in which the first electrode 913 serves as an anode and the second electrode 914 serves as a cathode, or a structure in which the first electrode 913 serves as a cathode and the second electrode 914 serves as an anode. In the former case, the transistor 911 is a p-channel transistor. In the latter case, the transistor 911 is an n-channel transistor.

The light-emitting device of the present invention employs a suitable structure for the light-emitting element for each color, and thus hardly deteriorates and has high reliability.

Figure 10A:
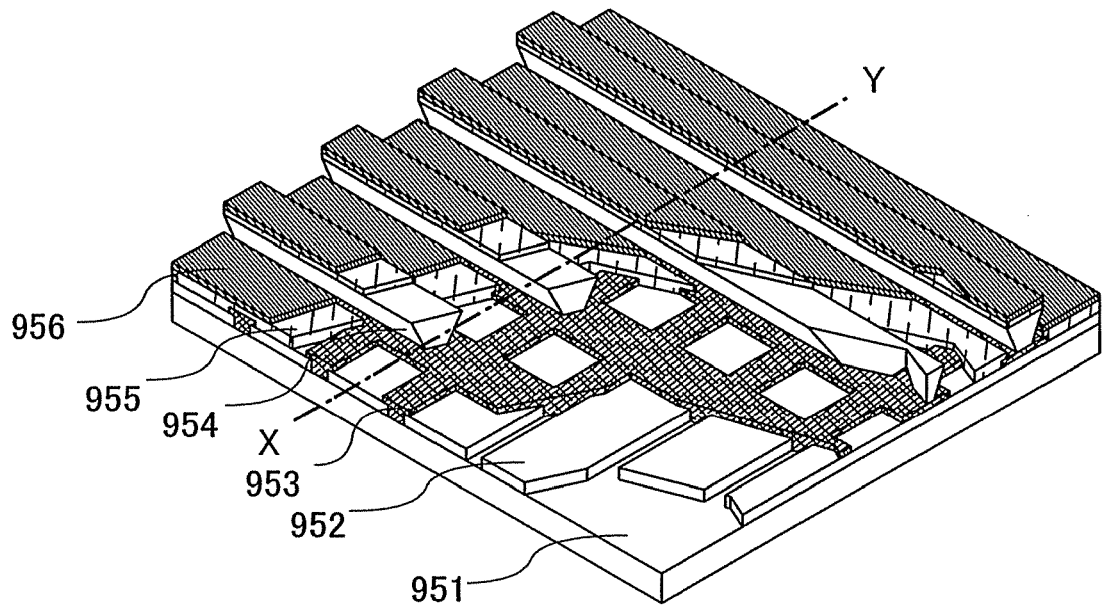
FIGS. 10A and 10B show a light-emitting device according to an aspect of the present invention.
Figure 10B:
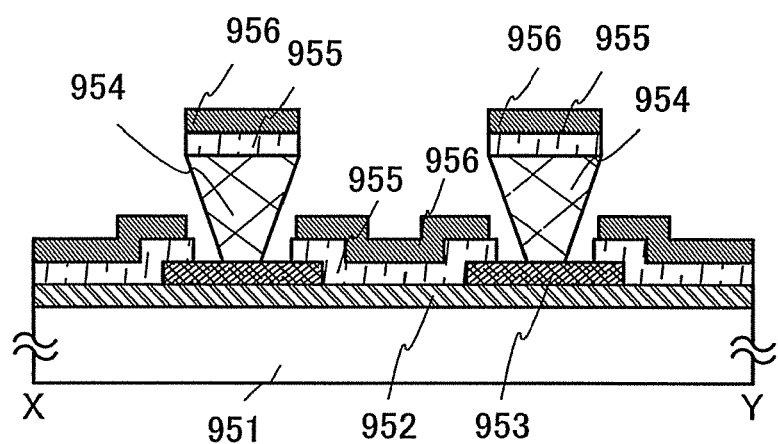

As set forth above, an active light-emitting device which controls the driving of the light-emitting element using transistors has been described in this embodiment mode. In addition, a passive matrix light-emitting device may be employed. FIG. 10A is a perspective view of a passive matrix light-emitting device which is manufactured in accordance with the present invention, and FIG. 10B is a cross-sectional view taken along the line X-Y of FIG. 10A. In FIGS. 10A and 10B, an organic layer 955 is provided between an electrode 952 and an electrode 956 over a substrate 951. An end portion of the electrode 952 is covered with an insulating layer 953. A partition layer 954 is provided over the insulating layer 953. The sidewalls of the partition layer 954 are aslope such that a distance between both sidewalls is gradually narrowed toward the surface of the substrate. That is, a cross-section taken along the direction of a shorter side of the partition layer 954 has a trapezoidal shape, and the base of the trapezoid (a side of the trapezoid that is parallel to the surface of the insulating layer 953 and is in contact with the insulating layer 953) is shorter than the upper side of the trapezoid (a side of the trapezoid that is parallel to the surface of the insulating layer 953 and is not in contact with the insulating layer 953). By providing the partition layer 954 in this manner, defects of the light-emitting element due to static charge and the like can be prevented. In addition, the passive matrix light-emitting device hardly deteriorates and can have high reliability.

This embodiment mode can be freely combined with any of the other embodiment modes.

Embodiment Mode 4

This embodiment mode will describe an example of the appearance of a light-emitting device according to the present invention with reference to FIGS. 8A and 8B. FIG. 8A is a top view of a light-emitting device, and FIG. 8B is a cross-sectional view taken along lines A-A' and B-B' of FIG. 8A. Reference numerals 601, 602, and 603 denote a driver circuit portion (a source driver circuit), a pixel portion, and a driver circuit portion (a gate driver circuit), respectively, which are indicated by dotted lines. In addition, reference numerals 604 and 605 denote a sealing substrate and a sealing material, respectively, and a portion surrounded by the sealing material 605 corresponds to a space 607.

A lead wiring 608 is a wiring for transmitting signals to the source driver circuit 601 and the gate driver circuit 603, and this wiring 608 receives video signals, clock signals, start signals, reset signals, or the like from an FPC (Flexible Printed Circuit) 609 that is an external input terminal. Although only the FPC is shown here, the FPC may be provided with a printed wiring board (PWB). The light-emitting device in this specification includes not only a light-emitting device itself but also a light-emitting device with an FPC or a PWB attached thereto.

Next, a cross-sectional structure will be described with reference to FIG. 8B. The driver circuit portion and the pixel portion are formed over a substrate 610. Here, the source driver circuit 601, which is the driver circuit portion, and one pixel of the pixel portion 602 are shown.

A CMOS circuit, which is a combination of an n-channel TFT 623 and a p-channel TFT 624, is formed for the source driver circuit 601. The driver circuit may be formed using various types of circuits, such as CMOS circuits, PMOS circuits, or NMOS circuits. Although a driver-integration type device, in which a driver circuit is formed over the same substrate as the pixel portion, is shown in this embodiment mode, a driver circuit is not necessarily formed over the same substrate as the pixel portion and can be formed outside the substrate.

The pixel portion 602 has a plurality of pixels, each of which includes a switching TFT 611, a current-controlling TFT 612, and a first electrode 613, which is electrically connected to a drain of the current-controlling TFT 612. Note that an insulator 614 is formed so as to cover an end portion of the first electrode 613. Here, a positive photosensitive acrylic resin film is used for the insulator 614.

The insulator 614 is formed so as to have a curved surface having curvature at an upper end portion or a lower end portion thereof in order to obtain favorable coverage. For example, in the case of using a positive photosensitive acrylic resin as a material for the insulator 614, the insulator 614 is preferably formed so as to have a curved surface with a curvature radius (0.2 to 3 µm) only at the upper end portion thereof. Either a negative photoresist which becomes insoluble in an etchant by light irradiation or a positive photoresist which becomes soluble in an etchant by light irradiation can be used for the insulator 614.

Over the first electrode 613, an EL layer 616 and a second electrode 617 are formed. A wide variety type of materials, such as metals, alloys, electrically conductive compounds, or mixture of them can be used for a material for forming the first electrode 613. When the first electrode 613 is used as an anode, it is particularly preferable to select a material with a high work function (a work function of 4.0 eV or higher)

among such metals, alloys, electrically conductive compounds, and mixture of them. For example, the first electrode 613 can be formed by using a single-layer film such as a film made of indium tin oxide including silicon, a film made of indium zinc oxide, a titanium nitride film, a chromium film, a tungsten film, a Zn film, or a Pt film; a stacked layer of a titanium nitride film and a film including aluminum as its main component; a three-layer structure of a titanium nitride film, a film including aluminum as its main component, and a titanium nitride film; or the like. When the first electrode 613 has a stacked structure, the electrode 613 has low resistance enough to serve as a wiring, giving a good ohmic contact. Further, the first electrode 613 can also function as an anode.

In addition, the EL layer 616 is formed by various methods such as an evaporation method using an evaporation mask, an inkjet method, and a spin coating method. The EL layer 616 the structure shown in Embodiment Mode 1. In other words, the EL layer 616 includes the blue-light-emitting element, the green-light-emitting element and the red-light-emitting element. In addition, not only organic compounds, but also inorganic compounds can be used for the material for forming the EL layer.

As a material for forming the second electrode 617, a wide variety of materials, such as metals, alloys, electrically conductive compounds, or mixture of them can be used. When the second electrode 617 is used as a cathode, it is particularly preferable to select a material with a low work function (a work function of 3.8 eV or lower) among such metals, alloys, electrically conductive compounds, and mixture of them. For example, elements belonging to Group 1 or 2 of the periodic table, i.e., alkali metals such a lithium (Li) and cesium (Cs) and alkaline earth metals such as magnesium (Mg), calcium (Ca), and strontium (Sr); alloys of them (e.g., MgAg and AlLi); or the like can be used. In the case where light generated in the EL layer 616 is transmitted through the second electrode 617, the second electrode 617 may also be formed using a stacked layer of a thin metal film having a small thickness and a transparent conductive film (e.g., indium tin oxide (ITO), indium tin oxide including silicon or silicon oxide, indium zinc oxide (IZO), or indium oxide including tungsten oxide and zinc oxide (IWZO)).

The sealing substrate 604 is attached to the element substrate 610 with the sealing material 605, and thereby the light-emitting element 618 is provided in the space 607 surrounded by the element substrate 610, the sealing substrate 604, and the sealing material 605. Note that the space 607 is filled with a filler, and the space 607 may be filled with an inert gas (e.g., nitrogen or argon) or the sealing material 605.

Note that an epoxy resin is preferably used for the sealing material 605. Such a material preferably allows as little moisture and oxygen as possible to penetrate. As a material for forming the sealing substrate 604, a plastic substrate made of FRP (Fiberglass-Reinforced Plastics), PVF (polyvinyl fluoride), polyester, acrylic, or the like can be used as well as a glass substrate or a quartz substrate.

Through the above-described process, a light-emitting device according to this embodiment mode can be obtained.

The thus obtained light-emitting device of the present invention has a long-lifetime light-emitting element; therefore, the device itself also has a long lifetime.

This embodiment mode can be freely combined with any of the other embodiment modes.

Embodiment Mode 5

In Embodiment Mode 5, a pixel circuit and a protection circuit that are included in the light-emitting device shown in Embodiment Modes 1 to 4 and operations thereof will now be described.

Figure 6A:
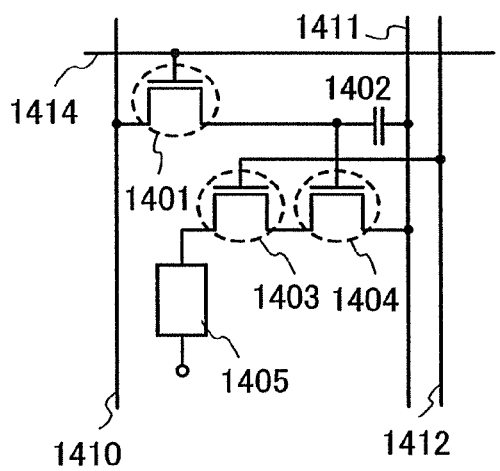
FIGS. 6A to 6F each show a light-emitting device according to an aspect of the present invention.

In the pixel shown in FIG. 6A, a signal line 1410, power supply lines 1411 and 1412 are arranged in a column direction, and a scan line 1414 is arranged in a row direction. The pixel also includes a switching TFT 1401, a driving TFT 1403, a current controlling TFT 1404, a capacitor 1402 and a light-emitting element 1405.

Figure 6B:
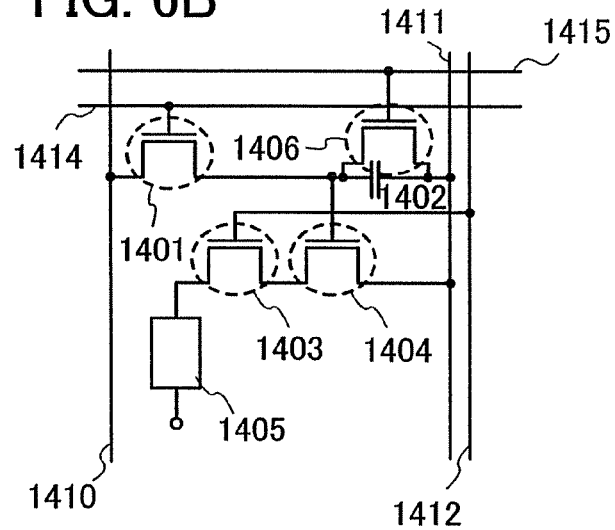
Figure 6C:
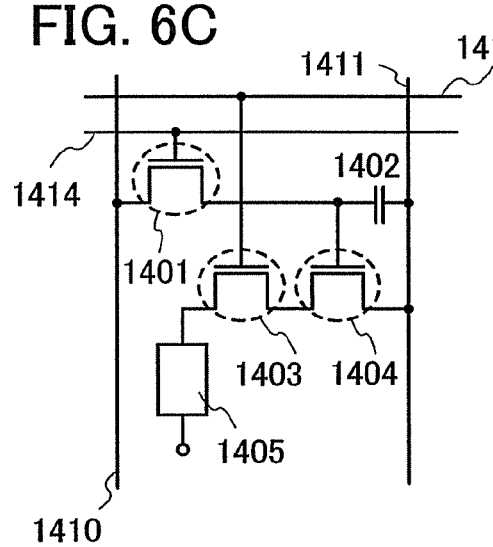
Figure 6D:
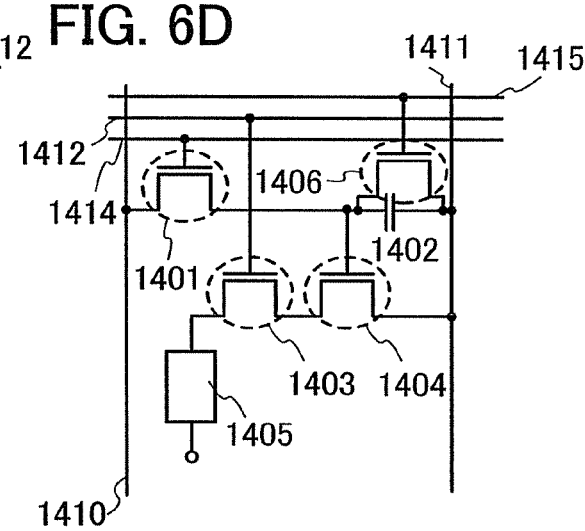

The pixel shown in FIG. 6C, which basically has the same structure as the pixel shown in FIG. 6A, is different only in that a gate electrode of a driving TFT 1403 is connected to a power supply line 1412 arranged in a row direction. Namely, each of FIGS. 6A and 6C illustrates the same equivalent circuit diagram. However, when the case of arranging the power supply line 1412 in the column direction (FIG. 6A) is compared to the case of arranging the power supply line 1412 in the row direction (FIG. 6C), the power supply lines are each formed with a conductive film in a different layer. In this embodiment mode, attention is given to the wiring connected to the gate electrode of each driving TFT 1403, and FIGS. 6A and 6C are separately illustrated to indicate that the layers for forming these wirings are different from each other.

In each of the pixels shown in FIGS. 6A and 6C, the driving TFT 1403 and the current controlling TFT 1404 are connected in series in the pixels. It is preferable that the channel length L (1403) and channel width W (1403) of the driving TFT 1403 and the channel width L (1404) and channel width W (1404) of the current controlling TFT 1404 satisfy L (1403)/W (1403): L (1404)/W (1404)=5 to 6000:1.

It is to be noted that the driving TFT 1403 operates in the saturation region and functions to control a current amount that is applied to the light-emitting element 1405, while the current controlling TFT 1404 operates in the linear region and functions to control current supply to the light-emitting element 1405. Both of the TFTs preferably have the same conductivity type in the manufacturing process, and are formed as N-channel TFTs in this embodiment mode. For the driving TFT 1403, not only an enhancement mode TFT but also a depletion mode TFT may be used. In the light-emitting device of the present invention having the structure described above, the current controlling TFT 1404 operates in the linear region. Therefore, slight fluctuation in Vgs of the current controlling TFT 1404 has no influence on a current amount that is applied to the light-emitting element 1405. Namely, the current amount that is applied to the light-emitting element 1405 can be determined by the driving TFT 1403, which operates in the saturation region. The structure described above makes it possible to improve luminance unevenness of light-emitting elements due to variations in characteristics of TFTs and to provide a display device with enhanced image quality.

In each of the pixels shown in FIGS. 6A to 6D, the switching TFT 1401 controls input of a video signal to the pixel. When the switching TFT 1401 is turned ON, a video signal is input to the pixel. Then, the voltage of the video signal is held in the capacitor 1402. Although each of FIGS. 6A and 6C illustrates the structure in which the capacitor 1402 is provided, the present invention is not limited to this structure. The capacitor 1402 may be omitted when a gate capacitance or the like can cover the capacitance for holding a video signal.

The pixel shown in FIG. 6B, which basically has the same pixel structure as FIG. 6A, is different only in that a TFT 1406 and a scan line 1415 are additionally provided. Similarly, the pixel shown in FIG. 6D, which basically has the same pixel structure as FIG. 6C, is different only in that the TFT 1406 and a scan line 1415 are additionally provided.

The switching (ON/OFF) of the TFT 1406 is controlled by the scan line 1415 provided additionally. When the TFT 1406 is turned on, charge held in the capacitor 1402 is discharged to turn off the current controlling TFT 1404. Namely, the arrangement of the TFT 1406 makes it possible to bring the light-emitting element 1405 forcibly into a state where no current flows thereto. Therefore, the TFT 1406 can be referred to as an erasing TFT. Thus, in the structures shown in FIGS. 6B and 6D, an emission period can be started simultaneously with or immediately after a writing period without waiting for completion of writing signals to all pixels, and thus, the duty ratio can be improved.

Figure 6E:
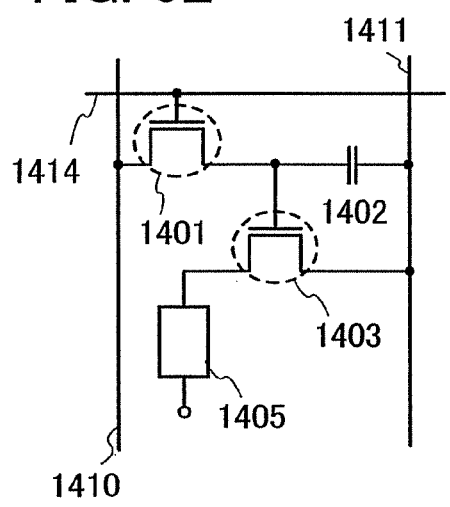
Figure 6F:
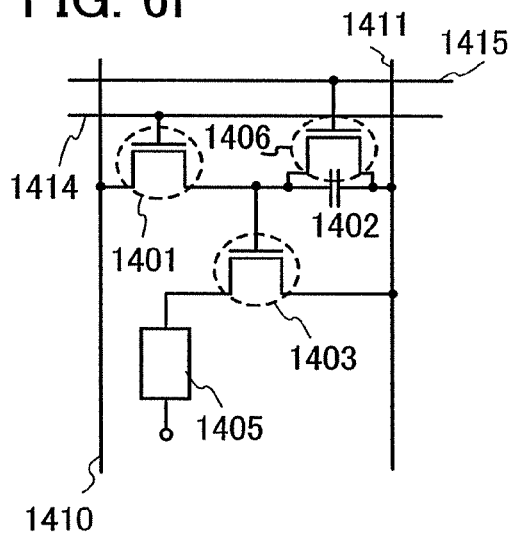

In the pixel shown in FIG. 6E, a signal line 1410 and a power supply line 1411 are arranged in a column direction, and the scan line 1414 is arranged in a row direction. The pixel also includes a switching TFT 1401, a driving TFT 1403, a capacitor 1402 and a light-emitting element 1405. The pixel shown in FIG. 6F, which basically has the same pixel structure as FIG. 6E, is different only in that a TFT 1406 and a scan line 1415 are additionally provided. Also in the structure shown in FIG. 6F, the arrangement of the TFT 1406 makes it possible to improve the duty ratio.

As described above, various pixel circuits can be employed in the present invention. In particular, in the case of forming a thin film transistor with an amorphous semiconductor film, it is preferable to make the size of a semiconductor film for the driving TFT 1403 larger. Therefore, for the pixel circuit described above, it is preferable to employ a top emission type in which light from a layer including an organic compound is emitted through a sealing substrate.

This active-matrix light-emitting device is considered to be advantageous, since a TFT is provided for each pixel and thus the light-emitting device can be driven at low voltage, even if the pixel density is increased.

In this embodiment mode, an active-matrix light-emitting device in which a TFT is provided in each pixel is described. However, the present invention can be applied to a passive-matrix light-emitting device. The passive-matrix light-emitting device has a high aperture ratio, since a TFT is not provided for each pixel. In the case of a light-emitting device in which luminescence is emitted through the both sides of a layer including an organic compound, the aperture ratio is increased when a passive-matrix light-emitting device is used.

Subsequently, a case of providing diodes as protection circuits for a scan line and a signal line will be described with reference to the equivalent circuit shown in FIG. 6E.

Figure 7:
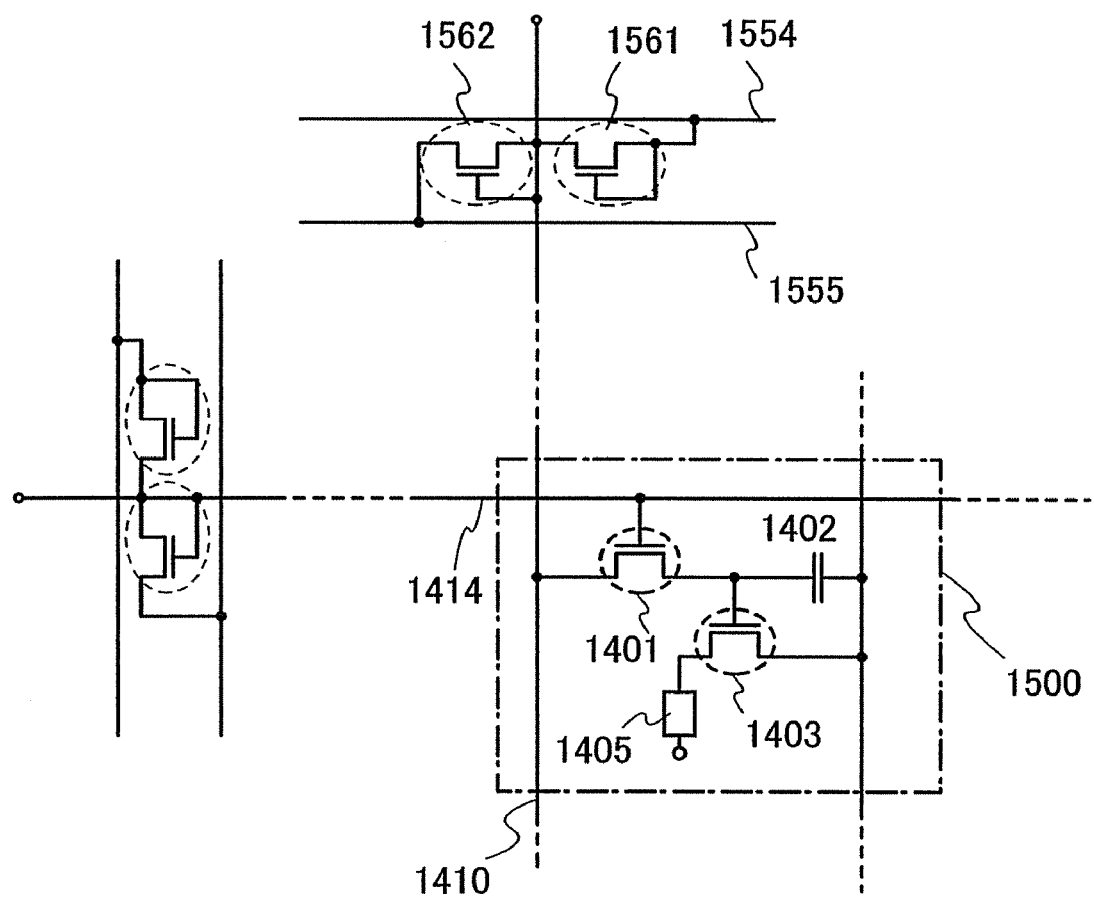
FIG. 7 illustrates a light-emitting device according to an aspect of the present invention.

In FIG. 7, a switching TFT 1401 and a driving TFT 1403, a capacitor 1402, and a light-emitting element 1405 are provided in a pixel portion 1500. For a signal line 1410, diodes 1561 and 1562 are provided. The diodes 1561 and 1562 are manufactured in accordance with the embodiment modes described above in the same way as the switching TFT 1401 and the driving TFT 1403, and each of the diodes 1561 and 1562 includes a gate electrode, a semiconductor layer, a source electrode, and a drain electrode, and the like. Each of the diodes 1561 and 1562 operates as a diode by connecting the gate electrode to the drain electrode or the source electrode.

Common potential lines 1554 and 1555 that are connected to the diodes are formed in the same layer as the gate electrode. Accordingly, it is necessary to form contact holes in a gate insulating layer so as to connect the gate electrode to the source electrode or drain electrode of each diode.

Diodes that are provided for the scan line 1414 have the same structure.

As described above, a protective diode that is provided for an input state can be formed at the same time as the TFTs according to the present invention. It is to be noted that the position in which the protection diode is formed is not limited to this, and the protection circuit can be provided between a driver circuit and a pixel.

This embodiment mode can be freely combined with any of the other embodiment modes.

Moreover, the reliability of the light-emitting device of the present invention can be further enhanced by combining the protection circuit described above.

Embodiment Mode 6

Embodiment Mode 6 will describe electronic devices of the present invention which includes any of the light-emitting devices described in Embodiment Modes 1 to 5 as a component part. The electronic devices of the present invention each include the light-emitting element described in Embodiment Mode 1, and thus have a display portion with a long lifetime.

Typical examples of electronic devices which are formed using the light-emitting device of the present invention include cameras such as video cameras and digital cameras, goggle displays, navigation systems, audio reproducing devices (e.g., car audio component stereos and audio component stereos), computers, game machines, portable information terminals (e.g., mobile computers, mobile phones, portable game machines, and electronic books), and image reproducing devices provided with a recording medium (specifically, a device capable of reproducing the content of a recording medium such as a digital versatile disc (DVD) and provided with a display device that can display the reproduced image), and the like. Specific examples of these electronic devices are shown in FIGS. 11A to 11D.

Figure 11A:
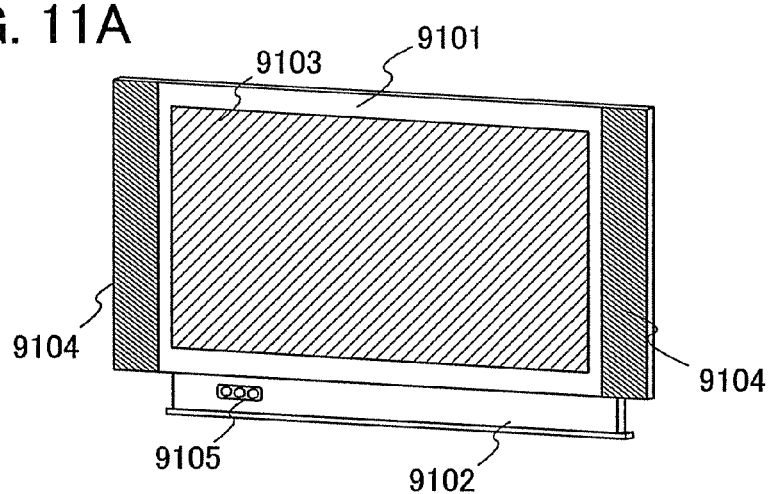
FIGS. 11A to 11D each show an electronic device according to an aspect of the present invention.

FIG. 11A illustrates a television set in accordance with the present invention, which includes a housing 9101, a supporting base 9102, a display portion 9103, speaker portions 9104, video input terminals 9105, and the like. In the television set, the display portion 9103 has a matrix arrangement of light-emitting elements similar to the light-emitting element shown in Embodiment Mode 1. The light-emitting elements has a feature of having long lifetime. The display portion 9103 which includes the light-emitting element has the same feature. Therefore, this television set also has the feature of having long lifetime. In other words, a television set which is durable for use over a long period of time can be provided.

Figure 11B:
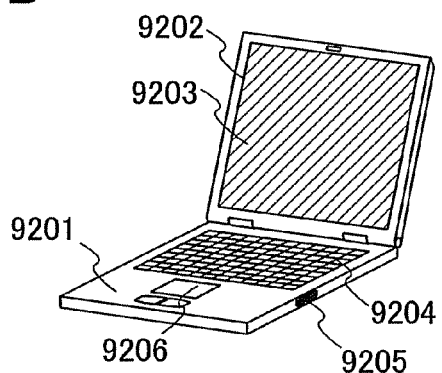

FIG. 11B illustrates a computer in accordance with the present invention, which includes a main body 9201, a housing 9202, a display portion 9203, a keyboard 9204, an external connection port 9205, a pointing device 9206, and the like. In the computer, the display portion 9203 has a matrix arrangement of light-emitting elements similar to the light-emitting element shown in Embodiment Mode 1. The light-emitting element has a feature of having long lifetime. The display portion 9203 which includes the light-emitting elements has the same feature. Therefore, this computer also has the feature of having long lifetime. In other words, a computer which is durable for use over a long period of time can be provided.

Figure 11C:
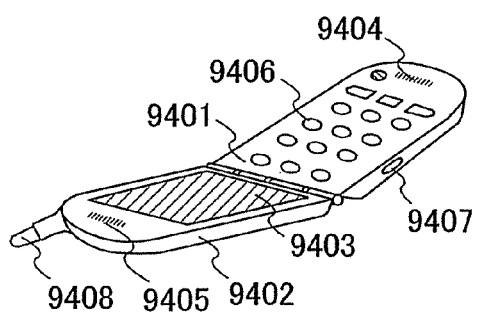

FIG. 11C shows a mobile phone in accordance with the present invention, which includes a main body 9401, a housing 9402, a display portion 9403, an audio input portion 9404, an audio output portion 9405, operation keys 9406, an external connection port 9407, an antenna 9408, and the like. In the mobile phone, the display portion 9403 has a matrix arrangement of light-emitting elements similar to the light-emitting element shown in Embodiment Mode 1. The light-emitting element has a feature of having long lifetime. The display portion 9403 which includes the light-emitting element has the same feature. Therefore, this mobile phone also has the feature of having long lifetime. In other words, a mobile phone which is durable for use over a long period of time can be provided.

Figure 11D:
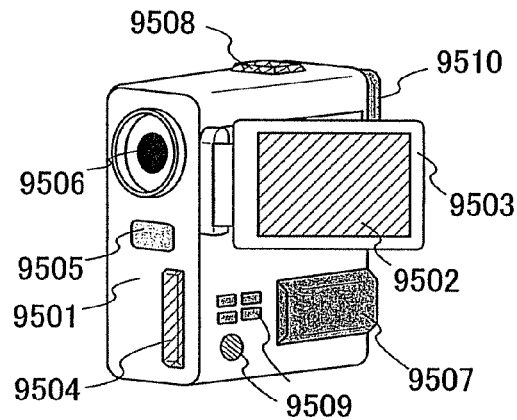

FIG. 11D shows a camera in accordance with the present invention, which includes a main body 9501, a display portion 9502, a housing 9503, an external connection port 9504, a remote control receiving portion 9505, an image receiving portion 9506, a battery 9507, an audio input portion 9508, operation keys 9509, an eye piece portion 9510, and the like. In the camera, the display portion 9502 has a matrix arrangement of light-emitting elements similar to the light-emitting element shown in Embodiment Mode 1. The light-emitting element has a feature of having long lifetime. The display portion 9502 which includes the light-emitting element has the same feature. Therefore, this camera also has the feature of having long lifetime. In other words, a camera which is durable for use over a long period of time can be provided.

As described above, the applicable range of the light-emitting device of the present invention is so wide that the light-emitting device can be applied to electronic devices in a wide variety of fields. By using the light-emitting device of the present invention, an electronic device having a long-lifetime display portion which is durable for use over a long period of time can be provided.

This embodiment mode can be freely combined with any of the other embodiment modes.

Example 1

Figure 13:
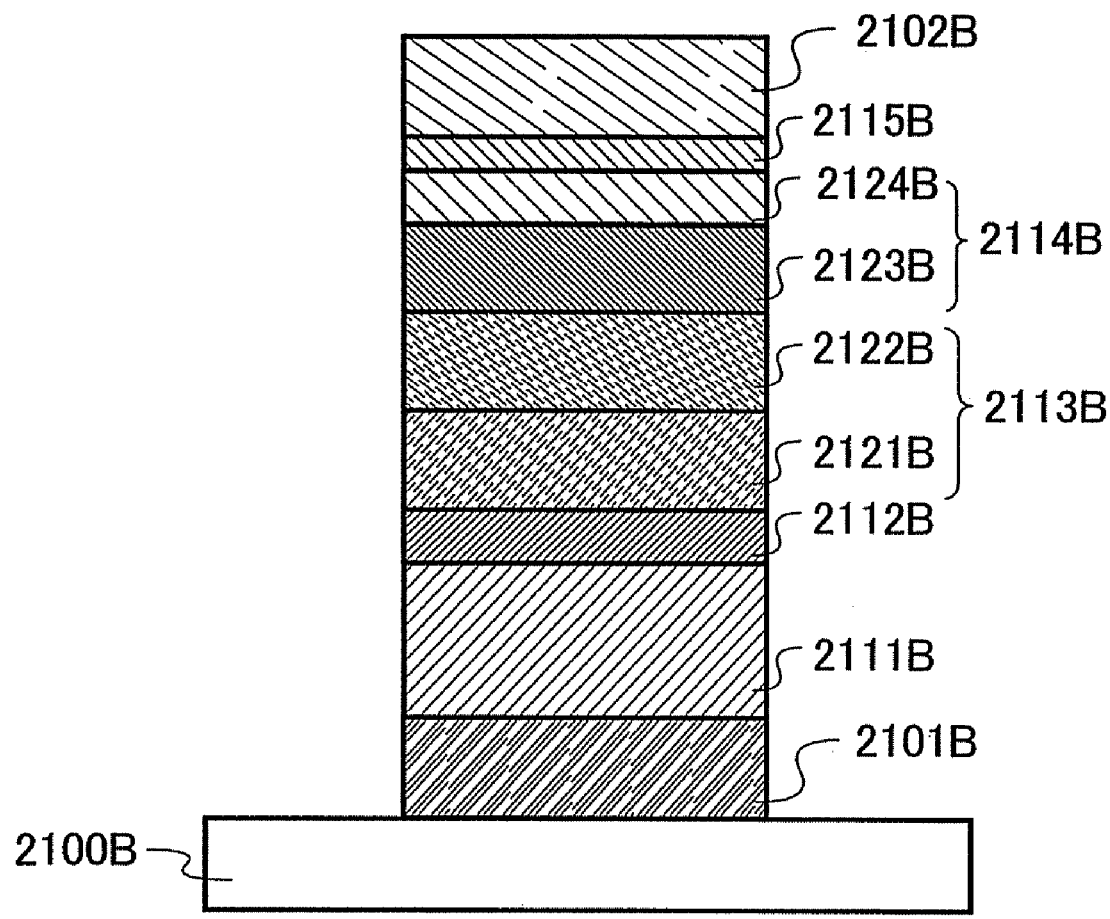
FIG. 13 illustrates a light-emitting element of Example 1.

Example 1 will specifically describe a light-emitting element used in a light-emitting device of the present invention with reference to FIG. 13. Structural formulae of materials used in this example are shown below.

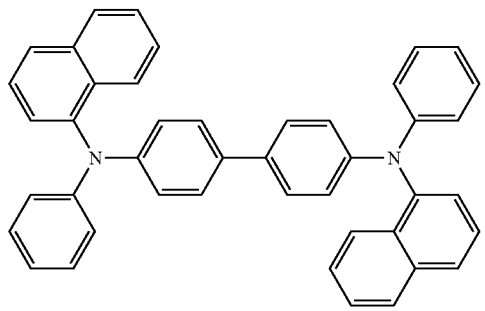

NPB

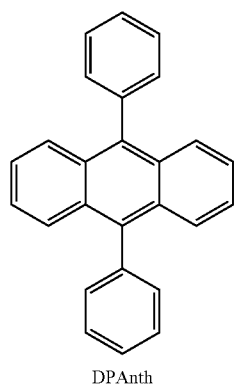

DPAnth

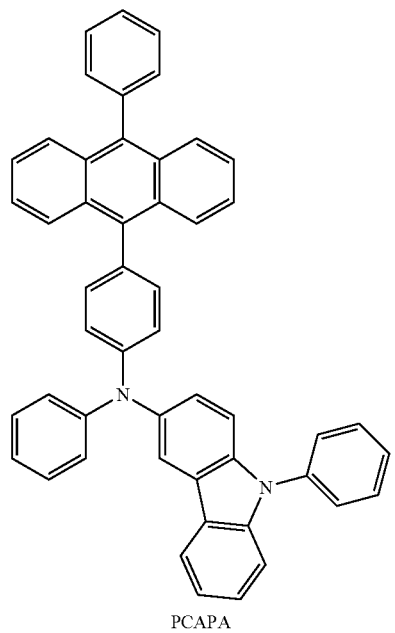

PCAPA

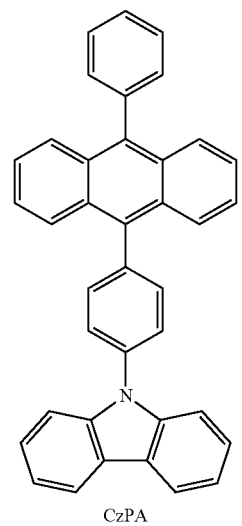

CzPA

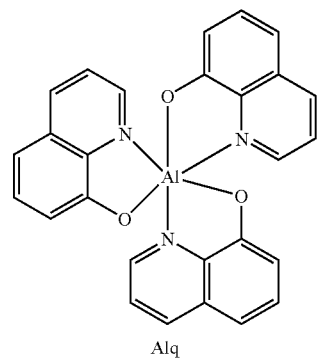

Alq

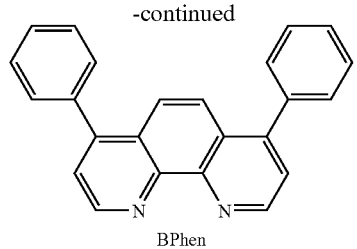

BPhen (Light-Emitting Element 1)

First, indium tin oxide including silicon oxide was deposited over a glass substrate 2100B by a sputtering method to form a first electrode 2101B. Note that the thickness of the first electrode 2101B was 110 nm and the electrode area was 2 mm×2 mm.

Next, the substrate having the first electrode 2101B was fixed to a substrate holder provided in a vacuum evaporation apparatus in such a way that the surface of the first electrode faced downward, and then the pressure was reduced to about $10^{-4}$ Pa. Next, 4,4'-bis[N-(1-naphthyl)-N-phenylamino]biphenyl (abbreviation: NPB) and molybdenum(VI) oxide were co-deposited over the first electrode 2101B, whereby a layer 2111B including a composite material was formed. The thickness of the layer 2111B was set to be 50 nm and the weight ratio of NPB to molybdenum(VI) oxide was set to be 4:1 (=NPB:molybdenum oxide). Note that the co-deposition method is an evaporation method in which evaporation is performed using a plurality of evaporation sources at the same time in one treatment chamber.

Next, a hole-transporting layer 2111B was formed by depositing 4,4'-bis[N-(1-naphthyl)-N-phenylamino]biphenyl (abbreviation: NPB) to a thickness of 10 nm by an evaporation method using resistance heating.

Furthermore, a light-emitting layer 2113B was formed over the hole-transporting layer 2112B. Initially, on the hole-transportinging layer 2112B, 9,10-diphenylanthracene (abbreviation:DPAnth) and N,9-diphenyl-N-[4-(10-phenyl-9-antryl)phenyl]-9H-carbazol-3-amine (abbreviation: PCAPA) were co-evaporated to form a first light-emitting layer 2121B with a thickness of 30 nm. Here, the weight ratio of DPAnth and PCAPA was controlled to 1:0.05 (=DPAnth: PCAPA). Further, on the first light-emitting layer 2121B, 9-[4-(10-phenyl-9-antryl)phenyl]-9H-carbazole (abbreviation: CzPA) and PCAPA were co-evaporated to form a second light-emitting layer 2122B with a thickness of 30 nm. Here, the weight ratio of CzPA to PCAPA was controlled to 1:0.05 (=CzPA: PCAPA).

Then, an electron-transporting layer 2114B was formed over the light-emitting layer 2113B by an evaporation method using resistance heating. First, tris(8-quinolinolato)aluminum (abbreviation: Alq) was formed to a thickness of 10 mm as a first electron-transporting layer 2123B. Then, bathophenanthroline (abbreviation: BPhen) was deposited to a thickness of 20 nm over the first electron-transporting layer 2123B to form a second electron-transporting layer 2124B.

Then, an electron-injecting layer 2115B having a thickness of 1 nm was formed by depositing lithium fluoride (LiF) over the electron-transporting layer 2114B.

Finally, a second electrode 2102B was formed by depositing aluminum to a thickness of 200 nm by an evaporation method using resistance heating. Thus, a light-emitting element 1 was formed.

The thus obtained light-emitting element 1 was put into a glove box under a nitrogen atmosphere so that the light-emitting element was sealed from atmospheric air. Then, the operating characteristics of the light-emitting element 1 were measured. Note that the measurement was conducted at room temperature (atmosphere kept at 25° C.).

Figure 14:
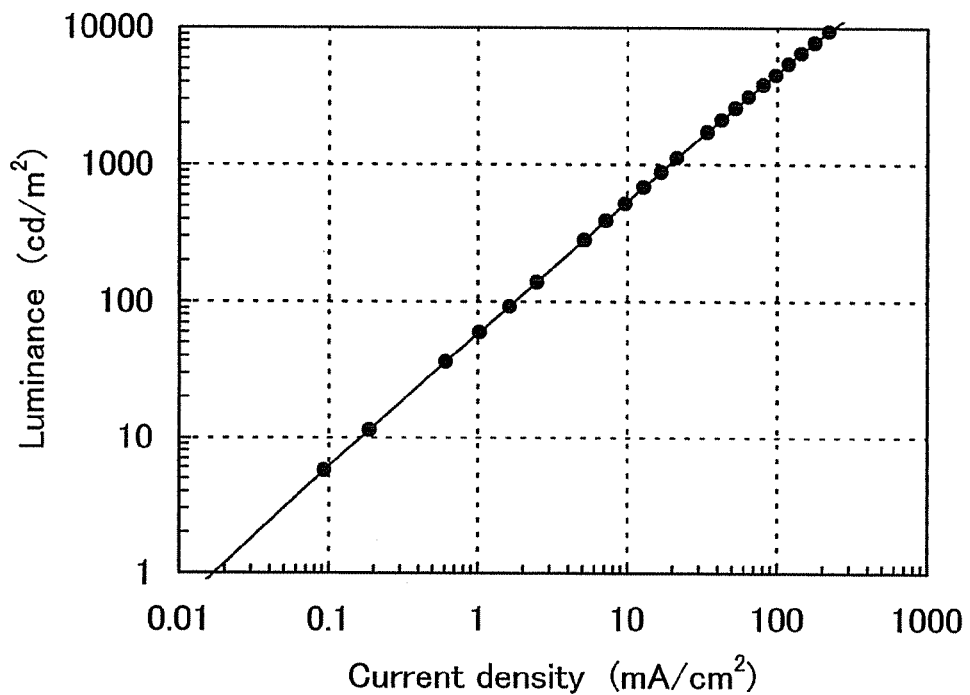
FIG. 14 is a graph showing current density vs. luminance characteristics of the light-emitting element fabricated in Example 1.
Figure 15:
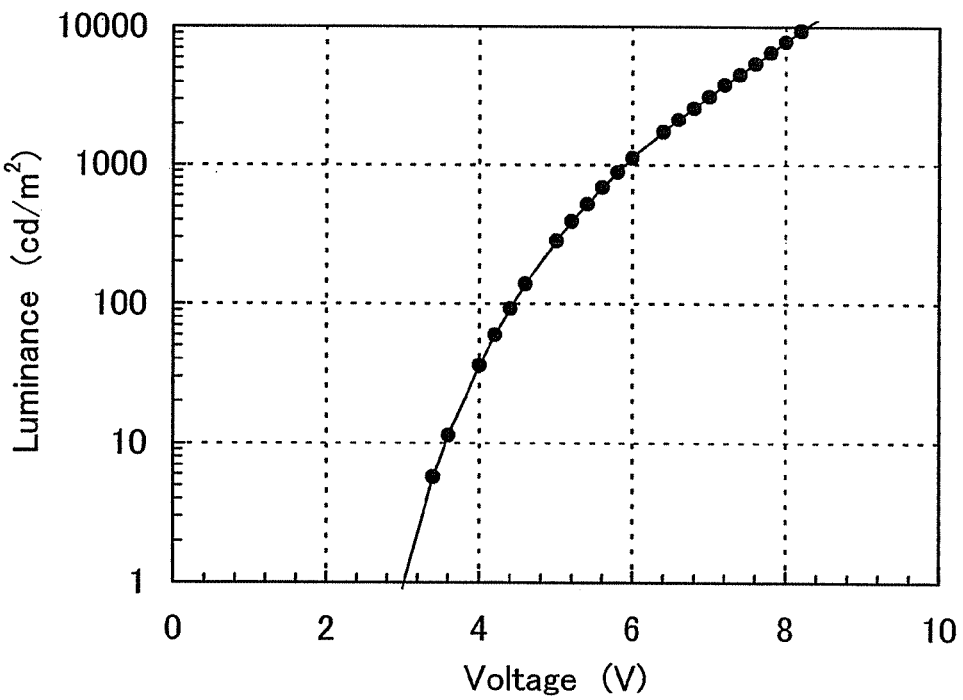
FIG. 15 is a graph showing voltage vs. luminance characteristics of the light-emitting element fabricated in Example 1.
Figure 16:
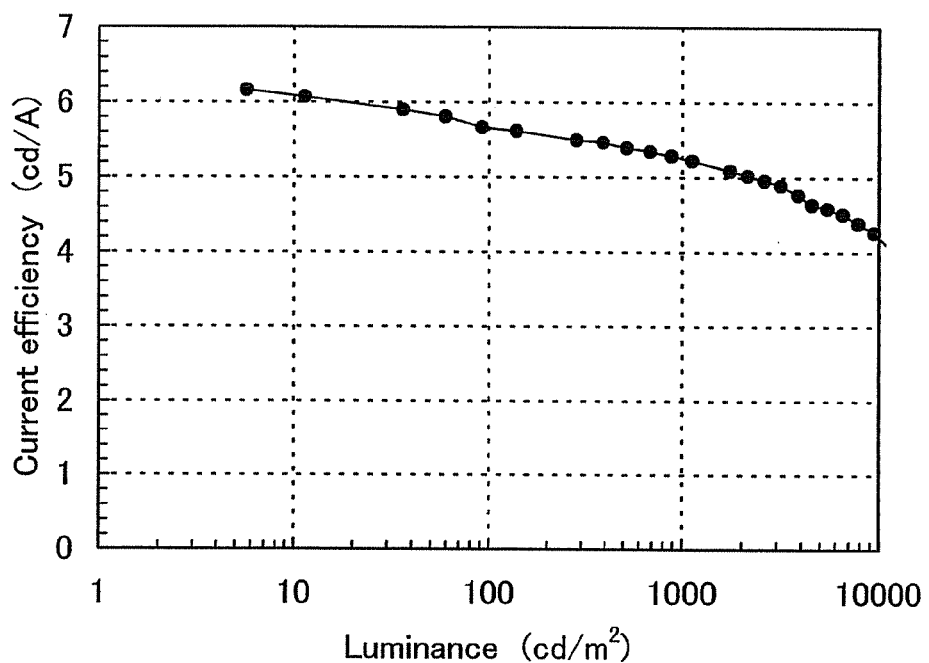
FIG. 16 is a graph showing luminance vs. current efficiency characteristics of the light-emitting element fabricated in Example 1.
Figure 17:
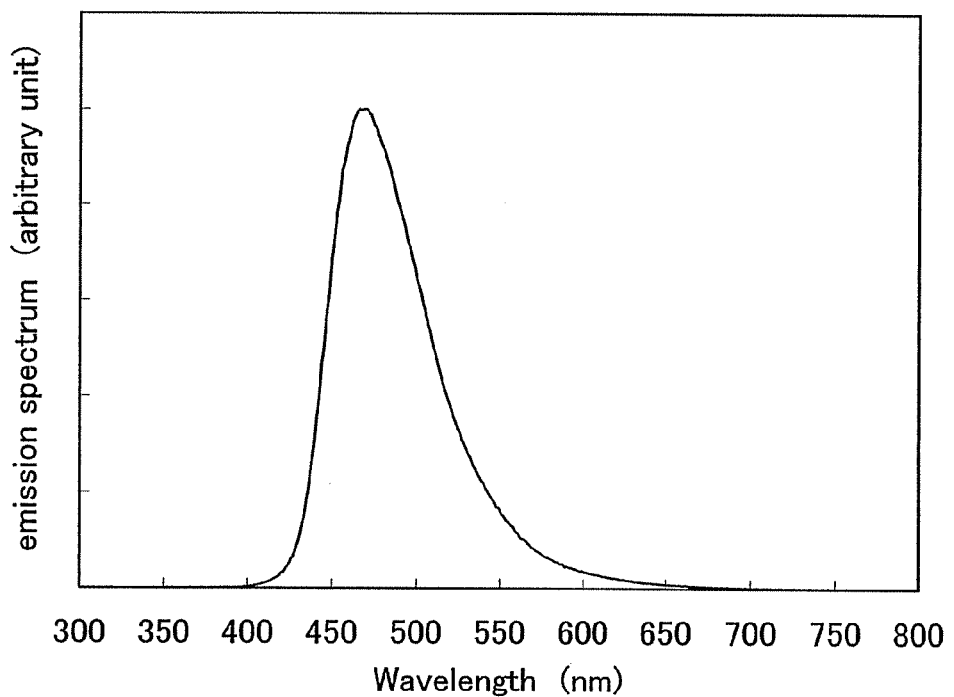
FIG. 17 is a graph showing an emission spectrum of the light-emitting element fabricated in Example 1.
Figure 18:
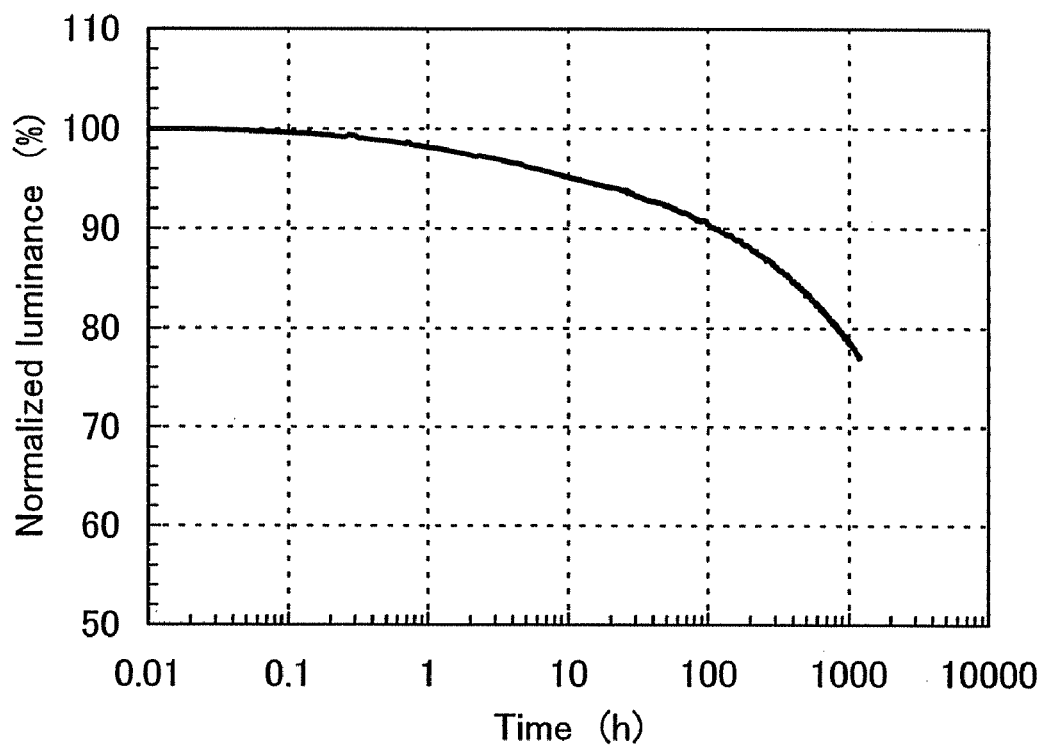
FIG. 18 is a graph showing time dependence of normalized luminance of the light-emitting element formed in Example 1.

FIG. 14 shows the current density vs. luminance characteristics of the light-emitting element 1. FIG. 15 shows the voltage vs. luminance characteristics of the light-emitting element 1. FIG. 16 shows the luminance vs. current efficiency characteristics of the light-emitting element 1. FIG. 17 shows the emission spectrum of the light-emitting element 1 at a current supply of 1 mA. FIG. 18 shows time dependence of normalized luminance of the light-emitting element 1 with 1000 cd/m$^2$ as the initial luminance.

The emission color of the light-emitting element 1 was located at the CIE chromaticity coordinates of (x=0.16, y=0.21) at the luminance of 1120 cd/m$^2$, and was blue. In addition, the voltage and current density of the light-emitting element 1 at the luminance of 1120 cd/m$^2$ were 6.0 V and 21.5 mA/cm$^2$, respectively. The current efficiency, external quantum efficiency, and power efficiency of the light-emitting element 1 at the luminance of 1120 cd/m$^2$ were 5.2 cd/A, 3.5%, and 2.7 μm/W respectively. The light-emitting element 1 had high efficiency and low power consumption. In addition, the peak of the wavelength was 469 nm as seen from FIG. 17.

From the result shown in FIG. 18, the light-emitting element 1 exhibited 79% of the initial luminance even 1000 hours after application of voltage, and was proved to have long lifetime.

Accordingly, a light-emitting element having long lifetime can be provided by applying the present invention.

Example 2

Figure 19:
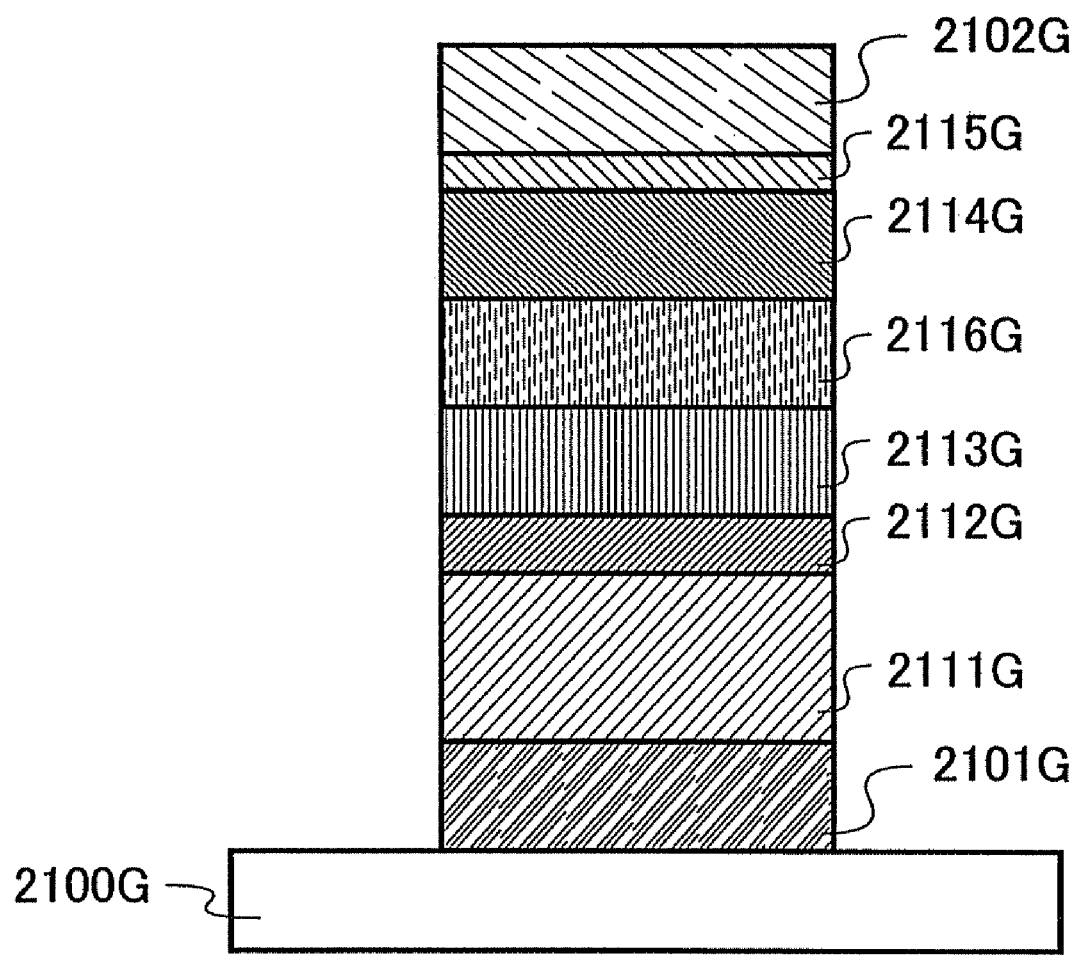
FIG. 19 illustrates a light-emitting element of Example 2.

Example 2 will specifically describe a light-emitting element used in a light-emitting device of the present invention as an example with reference to FIG. 19. Structural formulae of materials used in Example 2 are shown below. Note that the structural formulae of the materials used in Example 1 are omitted.

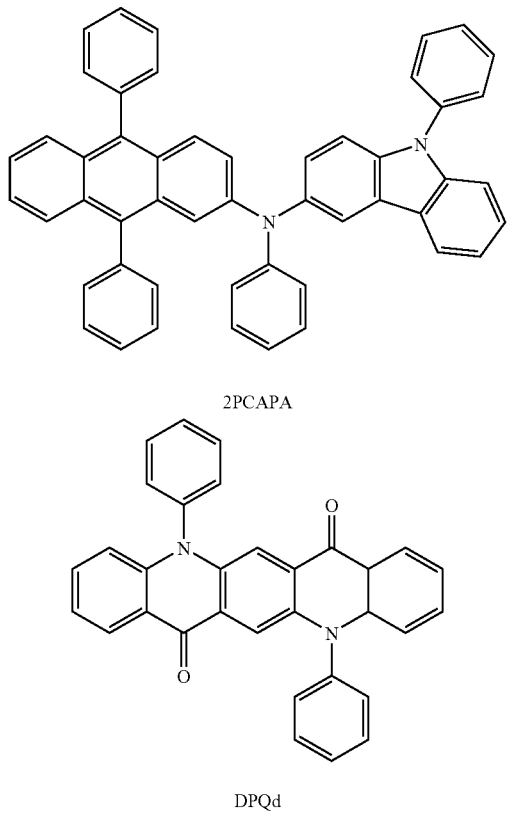

2PCAPA

DPQd (Light-Emitting Element 2)

First, indium tin oxide containing silicon oxide was deposited over a glass substrate 2100G by a sputtering method, whereby a first electrode 2101G was formed. Note that the thickness of the first electrode 2101G was 110 nm and the electrode area was 2 mm×2 mm.

Next, the substrate having the first electrode 2101G was fixed to a substrate holder provided in a vacuum deposition apparatus in such a way that the surface of the first electrode 2101G faced downward, and then the pressure was reduced to about $10^{-4}$ Pa. Then, 4,4'-bis[N-(1-naphthyl)-N-phenylamino]biphenyl (abbreviation: NPB) and molybdenum(VI) oxide were co-deposited over the first electrode 2101G, whereby a layer 2111G containing a composite material was formed. The deposition rate was controlled so that the thickness of the layer 2111G could be 50 nm and the weight ratio of NPB to molybdenum(VI) oxide could be 4:1 (=NPB:molybdenum oxide). Note that the co-deposition method is an evaporation method in which evaporation is performed using a plurality of evaporation sources at the same time in one treatment chamber.

Next, a hole-transporting layer 2112G was formed by depositing 4,4'-bis[N-(1-naphthyl)-N-phenylamino]biphenyl (abbreviation: NPB) to a thickness of 10 nm by an evaporation method using resistance heating.

Further, a light-emitting layer 2213 was formed over the hole-transporting layer 2112G. The light-emitting layer 2113G having a thickness of 30 nm was formed by co-depositing 9-[4-(10-phenyl-9-anthryl)phenyl]-9H-carbazole (abbreviation: CZPA) and N-(9,10-diphenyl-2-anthryl)-N,9-diphenyl-9H-carbazol-3-amine (abbreviation: 2PCAPA). Here, the deposition rate was controlled so that the weight ratio of CZPA to 2PCAPA could be 1:0.05 (=CzPA: 2PCAPA).

Further, a layer 2116G for controlling carrier transfer having a thickness of 10 nm was formed by co-depositing tris(8-quinolinolato)aluminum(III) (abbreviation: Alq) and N,N'-diphenylquinacridon (abbreviation: DPQd) over the light-emitting layer 2113G. Here, the deposition rate was controlled so that the weight ratio of Alq to DPQd could be 1:0.005 (=Alq: DPQd).

After that, an electron-transporting layer 2114G was formed by depositing bathophenanthroline (abbreviation: BPhen) to a thickness of 30 nm over the layer 2116G for controlling carrier transfer by an evaporation method using resistance heating.

Then, an electron-injecting layer 2215G was formed by depositing lithium fluoride (LiF) to a thickness of 1 nm over the electron-transporting layer 2114G.

Finally, a second electrode 2102G was formed by depositing aluminum to a thickness of 200 nm by an evaporation method using resistance heating. In this manner, a light-emitting element 2 was formed.

The thus obtained light-emitting element 2 was put into a glove box containing a nitrogen atmosphere so that the light-emitting element was sealed from atmospheric air. Then, the operating characteristics of the light-emitting element 2 were measured. Note that the measurement was conducted at room temperature (atmosphere kept at 25° C.).

Figure 20:
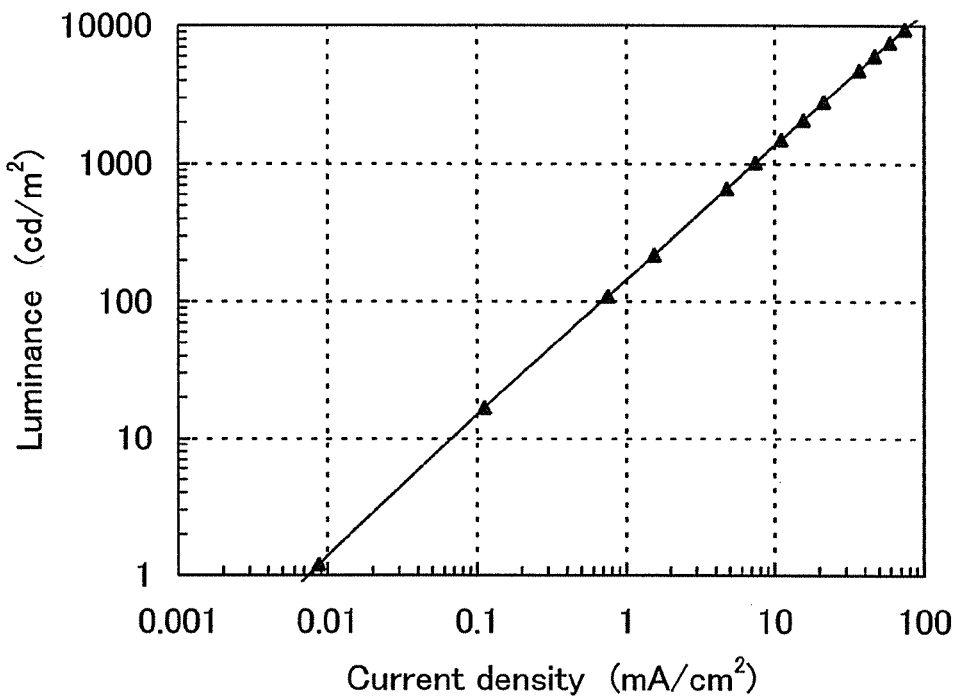
FIG. 20 is a graph showing current density vs. luminance characteristics of the light-emitting element fabricated in Example 2.
Figure 21:
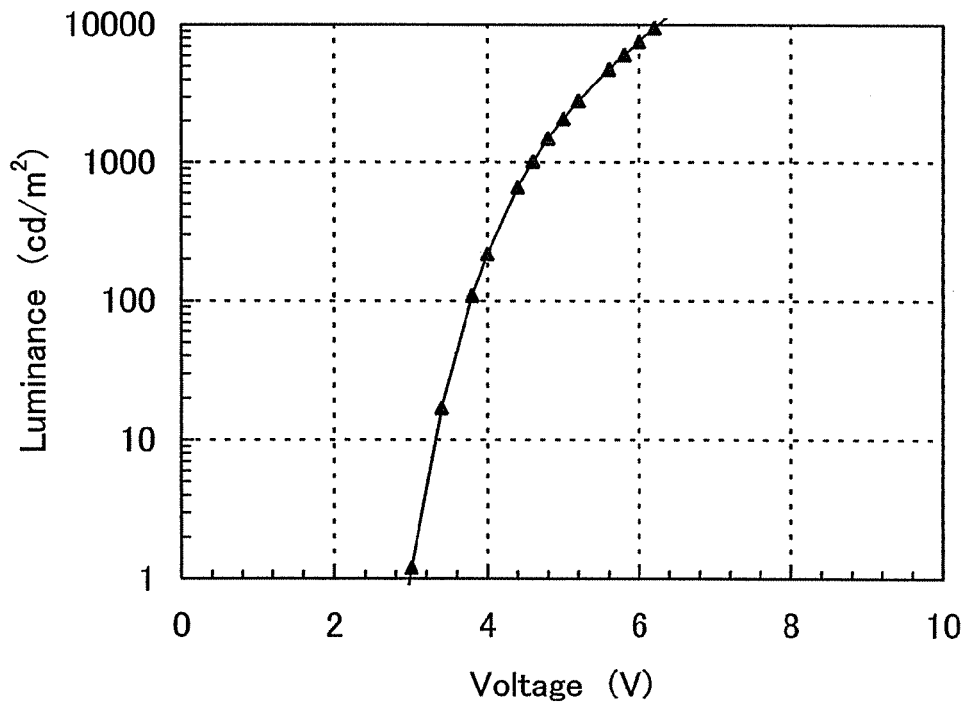
FIG. 21 is a graph showing voltage vs. luminance characteristics of the light-emitting element fabricated in Example 2.
Figure 22:
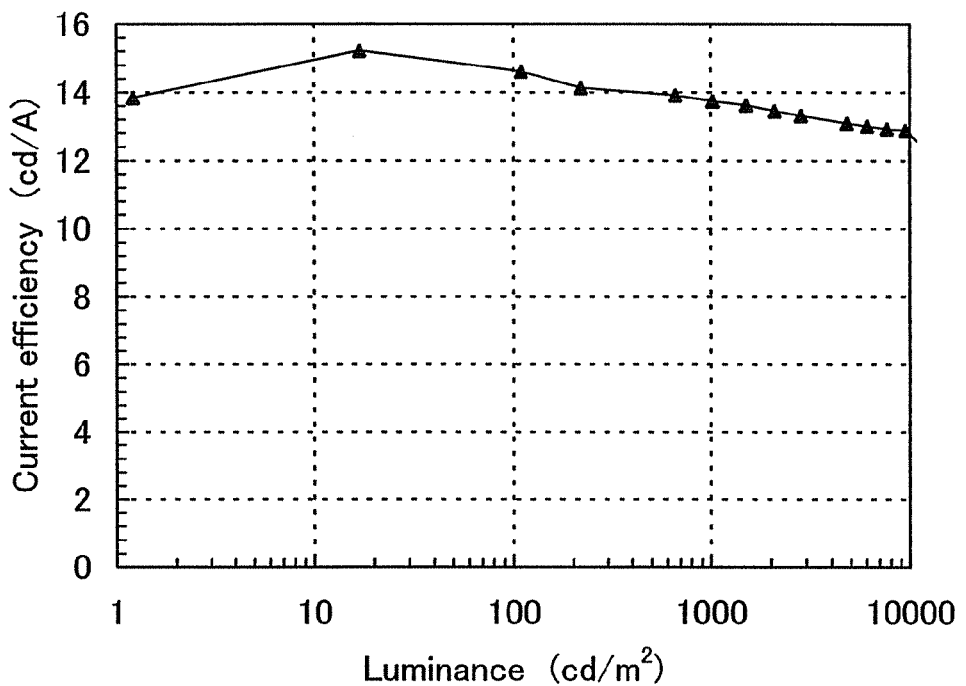
FIG. 22 is a graph showing luminance vs. current efficiency characteristics of the light-emitting element fabricated in Example 2.
Figure 23:
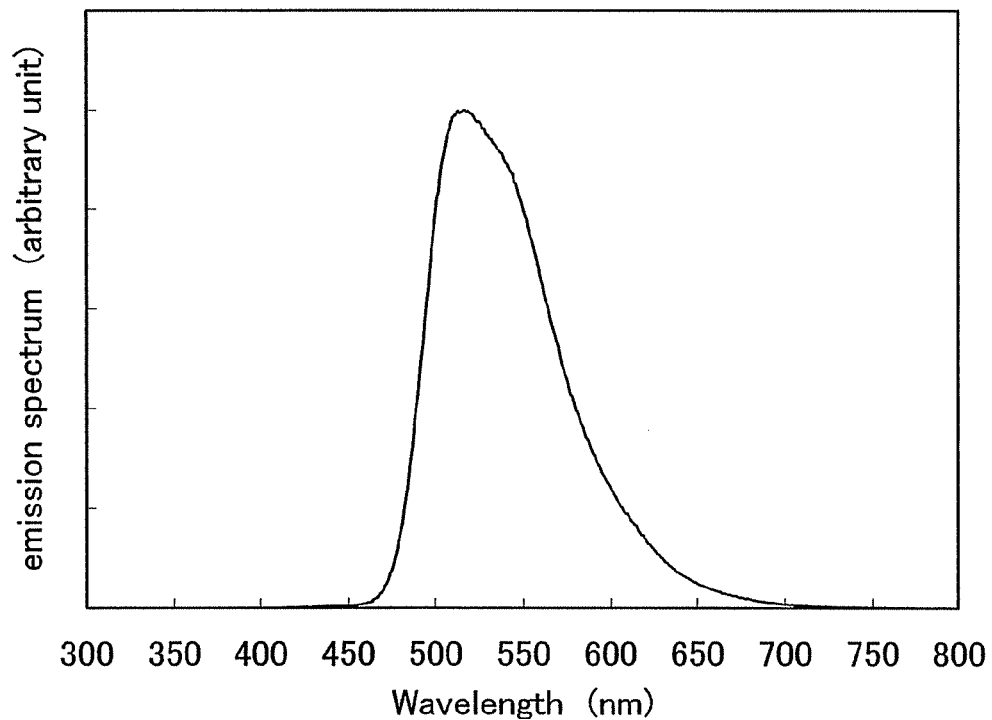
FIG. 23 is a graph showing an emission spectrum of the light-emitting element fabricated in Example 2.
Figure 24:
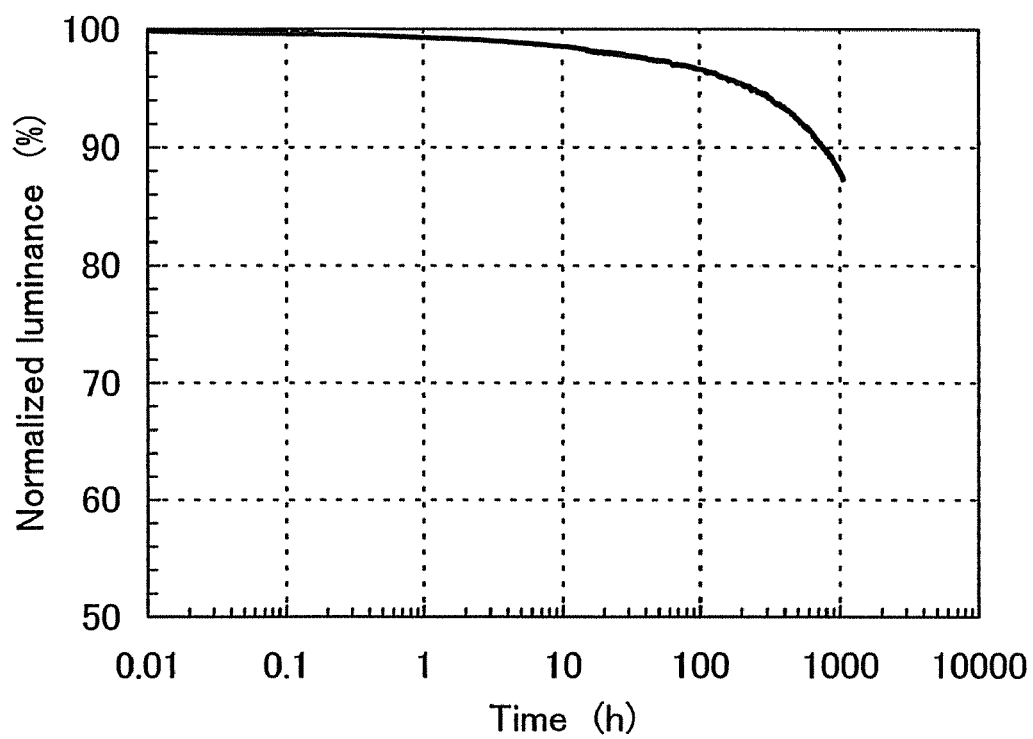
FIG. 24 is a graph showing time dependence of normalized luminance of the light-emitting element formed in Example 2.

FIG. 20 shows the current density vs. luminance characteristics of the light-emitting element 2. FIG. 21 shows the voltage vs. luminance characteristics of the light-emitting element 2. FIG. 22 shows the luminance vs. current efficiency characteristics of the light-emitting element 2. FIG. 23 shows the emission spectrum of the light-emitting element 2 at a current supply of 1 mA. FIG. 24 shows time dependence of normalized luminance of the light-emitting element 2 with 5000 cd/m² as the initial luminance.

The emission color of the light-emitting element 2 was located at the CIE chromaticity coordinates of (x=0.30, y=0.61) at the luminance of 4780 cd/m², and was green. In addition, the voltage and current density of the light-emitting element 2 at the luminance of 4780 cd/m² were 5.6 V and 36.5 mA/cm² respectively. Current efficiency, external quantum efficiency, and power efficiency of the light-emitting element 2 at the luminance of 4780 cd/m² were 13 cd/A, 3.8% and 7.3 μm/W respectively. The light-emitting element 2 had high efficiency and low power consumption. In addition, the peak of the wavelength was 517 nm as seen from FIG. 23.

From the result shown in FIG. 24, the light-emitting element 2 exhibited 88% of the initial luminance even 1000 hours after application of voltage, and was proved to have long lifetime.

Accordingly, a light-emitting element having long lifetime can be provided by applying the present invention.

Example 3

Figure 25:
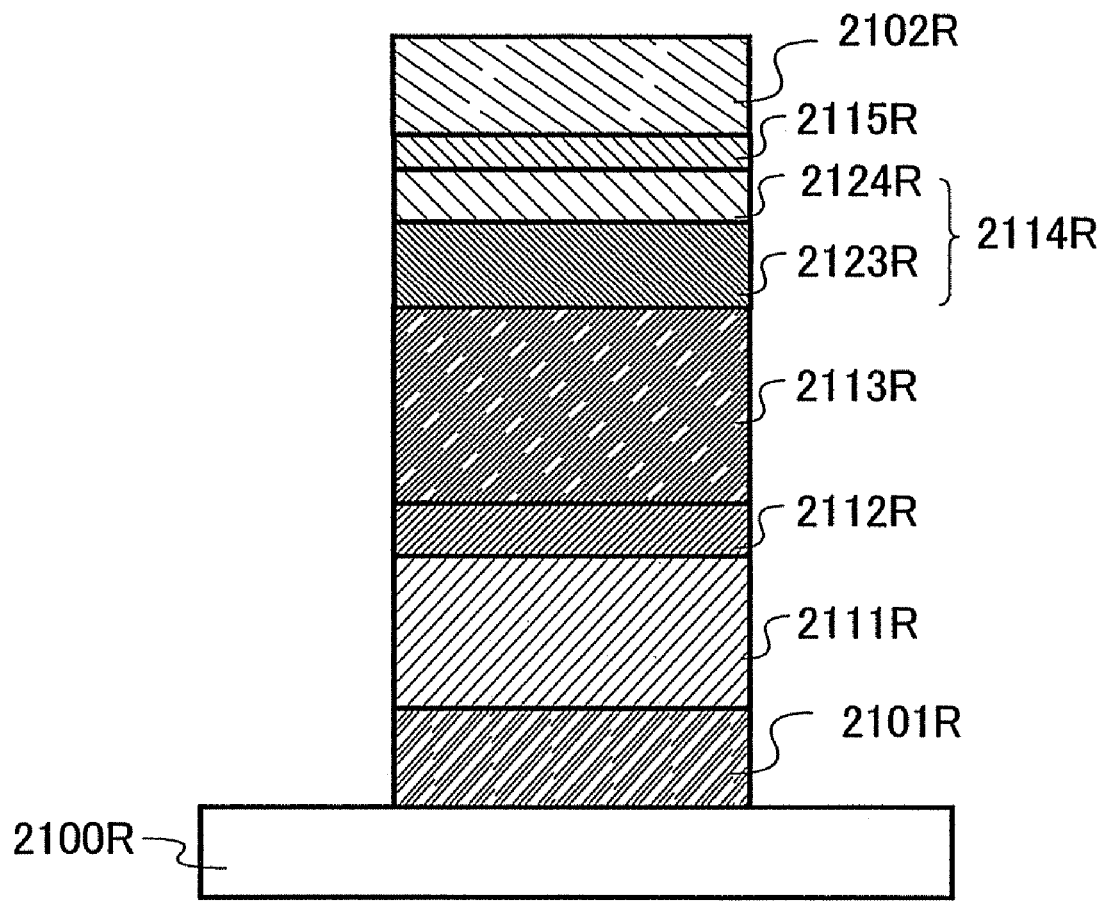
FIG. 25 illustrates a light-emitting element of Example 3.

Example 3 will specifically describe a light-emitting element used in a light-emitting device of the present invention as an example with reference to FIG. 25. Structural formulae of materials used in Example 3 are shown below. Note that the structural formulae of the materials used in Example 1 and Example 2 are omitted.

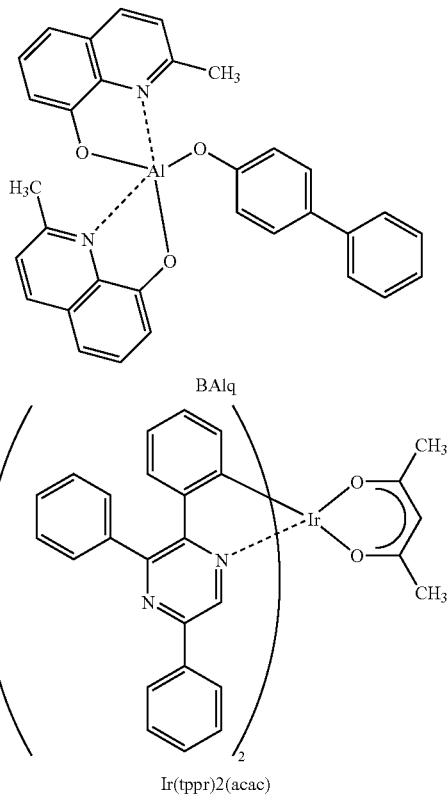

BAlq

Ir(tppr)2(acac)

(Light-Emitting Element 3)

Next, the substrate having the first electrode 2101R was fixed to a substrate holder provided in a vacuum deposition apparatus in such a way that the surface of the first electrode 2101R faced downward, and then the pressure was reduced to about $10^{-4}$ Pa. Then, 4,4'-bis[N-(1-naphthyl)-N-phenylamino]biphenyl (abbreviation: NPB) and molybdenum(VI) oxide were co-deposited over the first electrode 2101R, whereby a layer 2111R containing a composite material was formed. The deposition rate was controlled so that the thickness of the layer 2111R could be 50 nm and the weight ratio of NPB to molybdenum(VI) oxide could be 4:1 (=NPB: molybdenum oxide). Note that the co-deposition method is an evaporation method in which evaporation is performed using a plurality of evaporation sources at the same time in one treatment chamber.

Next, a hole-transporting layer 2112R was formed by depositing 4,4'-bis[N-(1-naphthyl)-N-phenylamino]biphenyl (abbreviation: NPB) to a thickness of 10 nm by an evaporation method using resistance heating.

Then, a light-emitting layer 2113R was formed over the hole-transporting layer 2112R. The light-emitting layer 2113R includes NPB as an organic compound having a hole-transporting property; bis(2-methyl-8-quinolinolato)(4-phenylphenolato)aluminum(III) (abbreviation: BAlq) as an organic compound having an electron-transporting property; and (acetylacetonato)bis(2,3,5-triphenylpyrazinato)iridium (III) (abbreviation Ir(tppr)$_2$(acac)) as a pyrazine-based organometallic complex. The light-emitting layer 2113R was formed by co-evaporation such that the mass ratio is NPB: BAlq: Ir(tppr)$_2$(acac)=0.1:1:0.06. The thickness was 50 nm.

Then, an electron-transporting layer 2114R was formed over the light-emitting layer 2113R by an evaporation method using resistance heating. First, tris(8-quinolinolato)aluminum (abbreviation: Alq) was formed to a thickness of 10 nm as a first electron-transporting layer 2123R. Then, bathophenanthroline (abbreviation: BPhen) was deposited to a thickness of 20 nm over the first electron-transporting layer 2123R to form a second electron-transporting layer 2124R.

Then, an electron-injecting layer 2215R was formed by depositing lithium fluoride (LiF) to a thickness of 1 nm over the electron-transporting layer 2114R.

Finally, a second electrode 2102R was formed by depositing aluminum to a thickness of 200 nm by an evaporation method using resistance heating. In this manner, a light-emitting element 3 was formed.

The thus obtained light-emitting element 3 was put into a glove box containing a nitrogen atmosphere so that the light-emitting element was sealed from atmospheric air. Then, the operating characteristics of the light-emitting element 3 were measured. Note that the measurement was conducted at room temperature (atmosphere kept at 25° C.).

Figure 26:
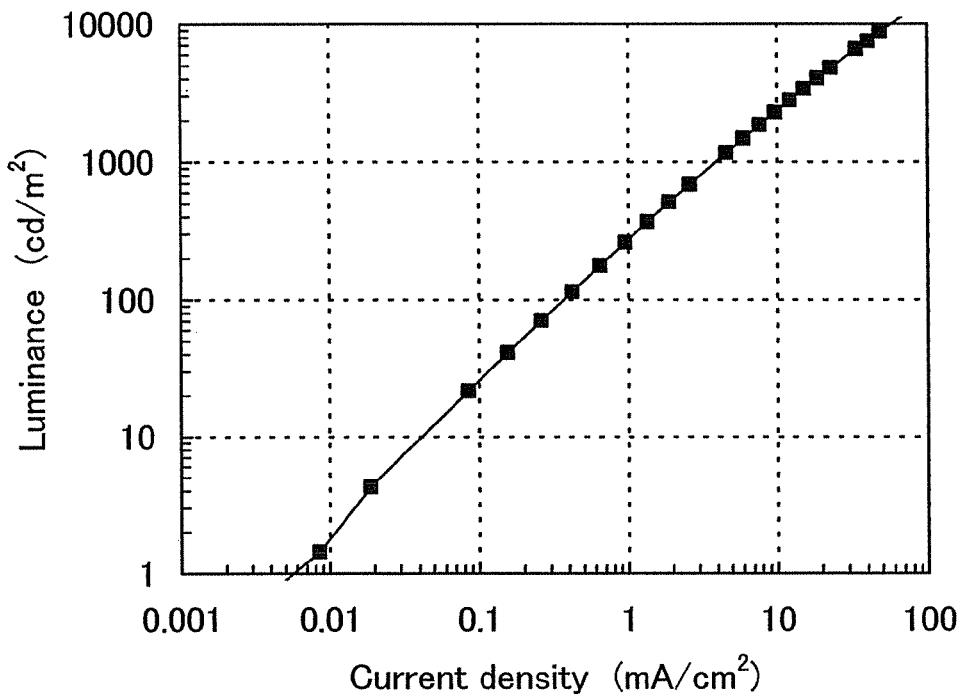
FIG. 26 is a graph showing current density vs. luminance characteristics of the light-emitting element fabricated in Example 3.
Figure 27:
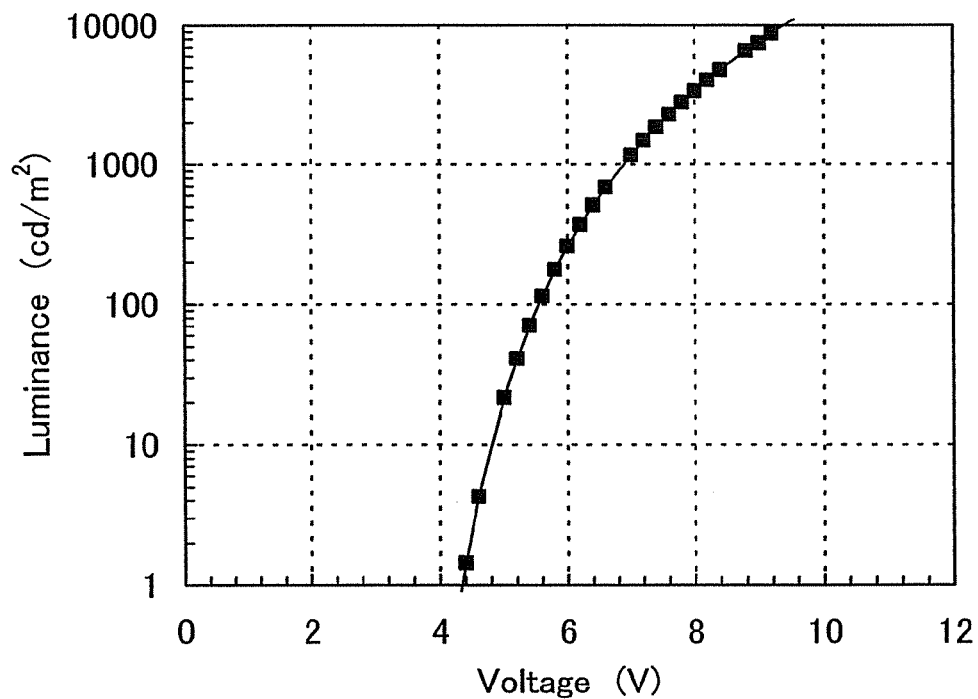
FIG. 27 is a graph showing voltage vs. luminance characteristics of the light-emitting element fabricated in Example 3.
Figure 28:
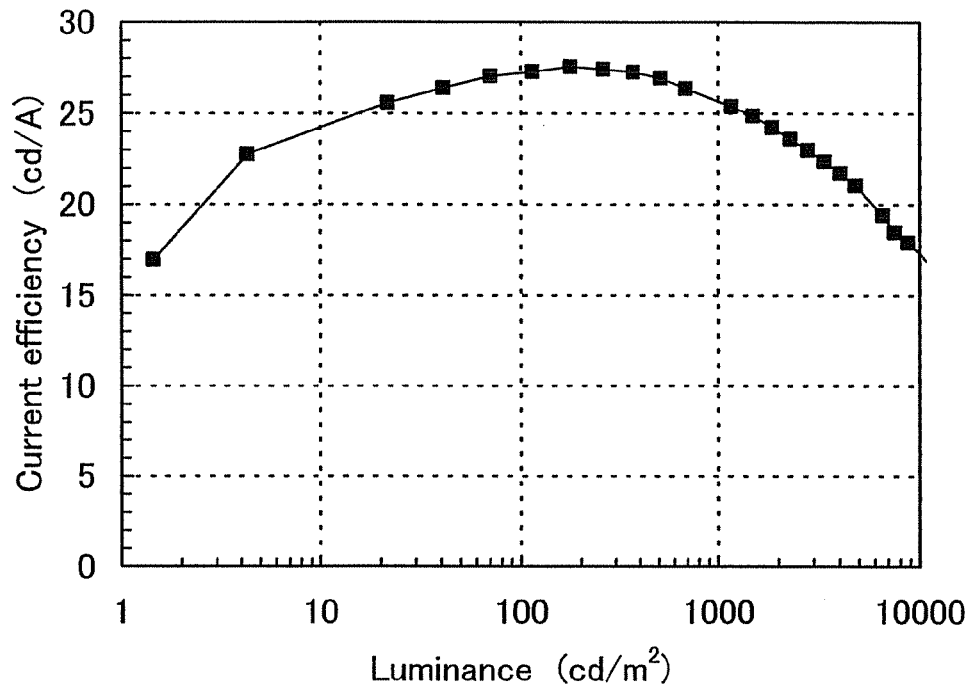
FIG. 28 is a graph showing luminance vs. current efficiency characteristics of the light-emitting element fabricated in Example 3.
Figure 29:
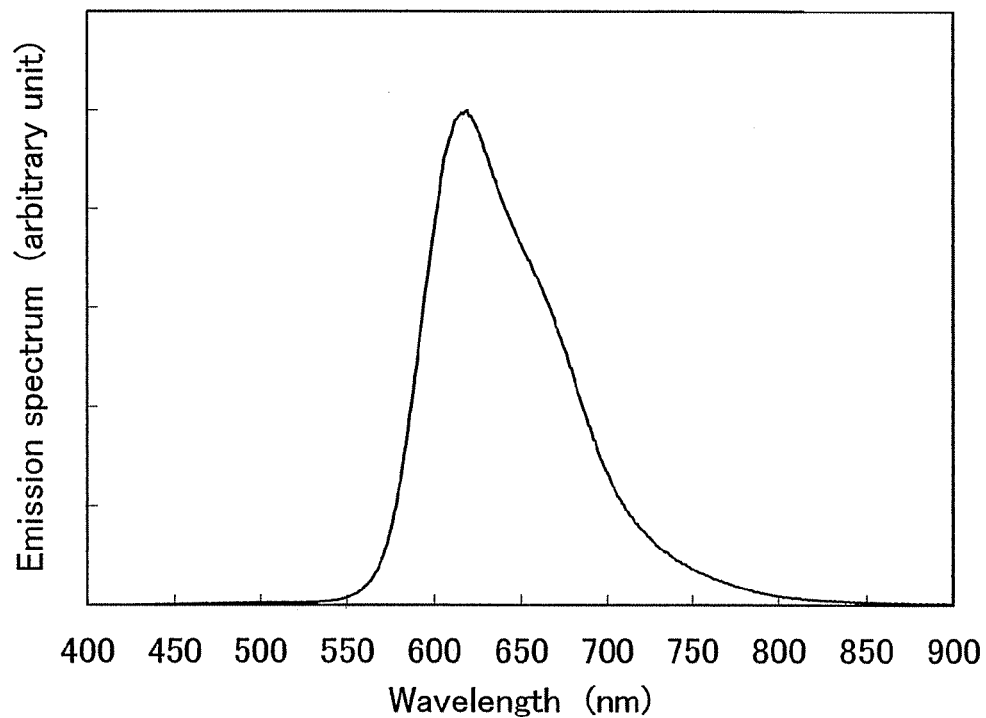
FIG. 29 is a graph showing an emission spectrum of the light-emitting element fabricated in Example 3.
Figure 30:
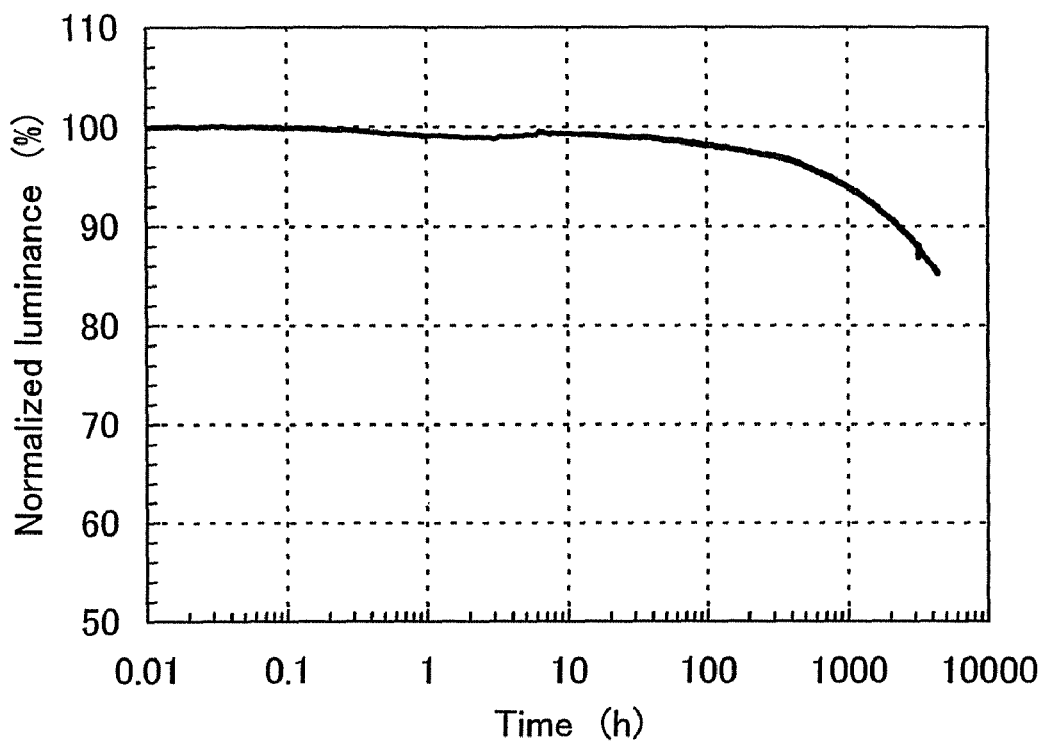
FIG. 30 is a graph showing time dependence of normalized luminance of the light-emitting element formed in Example 3.

FIG. 26 shows the current density vs. luminance characteristics of the light-emitting element 3. FIG. 27 shows the voltage vs. luminance characteristics of the light-emitting element 3. FIG. 28 shows the luminance vs. current efficiency characteristics of the light-emitting element 3. FIG. 29 shows the emission spectrum of the light-emitting element 3 at a current supply of 1 mA. FIG. 30 shows time dependence of normalized luminance of the light-emitting element 3 with 1000 cd/m$^2$ as the initial luminance.

The emission color of the light-emitting element 3 was located at the CIE chromaticity coordinates of (x=0.65, y=0.35) at the luminance of 1160 cd/m$^2$, and was red. In addition, the voltage and current density of the light-emitting element 3 at the luminance of 1160 cd/m$^2$ were 7.0 V and 4.59 mA/cm$^2$, respectively. The current efficiency, external quantum efficiency, and power efficiency of the light-emitting element 3 at the luminance of 1160 cd/m$^2$ were 25 cd/A, 20% and 11 μm/W respectively. The light-emitting element 3 had high efficiency and low power consumption. In addition, the peak of the wavelength was 619 nm as seen from FIG. 29.

From the result shown in FIG. 30, the light-emitting element 3 exhibited 94% of the initial luminance even 1000 hours after application of voltage, and was proved to have long lifetime.

Accordingly, a light-emitting element having long lifetime can be provided by applying the present invention.

This application is based on Japanese Patent Application serial no. 2007-077833 filed with Japan Patent Office on Mar. 23, 2007, the entire contents of which are hereby incorporated by reference.

What is claimed is:

1. A light-emitting device comprising:
a first light-emitting element, a second light-emitting element, and a third light-emitting element which emit light having different color from each other;
the first light-emitting element comprising:
a first anode;
a first cathode; and
a first light-emitting layer and a second light-emitting layer between the first anode and the first cathode,
wherein the first light-emitting layer includes a first light-emitting substance and a first organic compound, and the second light-emitting layer includes the first light-emitting substance and a second organic compound,
wherein the first light-emitting layer is in contact with the first anode side of the second light-emitting layer, and
wherein the first organic compound is an organic compound having a hole-transporting property and the second organic compound is an organic compound having an electron-transporting property,
the second light-emitting element comprising:
a second anode;
a second cathode; and
a third light-emitting layer and a layer for controlling carrier transfer between the second anode and the second cathode,
wherein the third light-emitting layer includes a second light-emitting substance,
wherein the layer for controlling carrier transfer includes a third organic compound and a fourth organic compound, and is provided between the third light-emitting layer and the second cathode,
wherein the third organic compound is an organic compound having an electron-transporting property and the fourth organic compound is an organic compound having an electron-trapping property;
wherein the third organic compound is included more than the fourth organic compound in the layer for controlling carrier transfer, and
wherein the layer for controlling carrier transfer is in direct contact with the third light-emitting layer,
the third light-emitting element comprising:
a third anode;
a third cathode; and
a fourth light-emitting layer,
wherein the fourth light-emitting layer includes a fifth organic compound, a sixth organic compound, and a third light-emitting substance,
wherein the fifth organic compound is an organic compound having a hole-transporting property, and the sixth organic compound is an organic compound having an electron-transporting property, and
wherein the third light-emitting substance is a substance which emits phosphorescence.

2. The light-emitting device according to claim 1, wherein the third light-emitting substance is an organometallic complex which emits phosphoresces, wherein a ligand of the organometallic complex is a ligand having a pyrazine skeleton, and wherein a central metal of the organometallic complex is an element belonging to Group 9 or an element belonging to Group 10.

3. The light-emitting device according to claim 2, wherein the central metal is iridium or platinum.

4. The light-emitting device according to claim 1, wherein the fifth organic compound is an aromatic amine compound or a carbazole derivative.

5. The light-emitting device according to claim 1, wherein the sixth organic compound is a heteroaromatic compound or a metal complex.

6. The light-emitting device according to claim 1, wherein a lowest unoccupied molecular orbital level of the fourth organic compound is lower than a lowest unoccupied molecular orbital level of the third organic compound by 0.3 eV or more.

7. The light-emitting device according to claim 1, wherein the second light-emitting substance is an organic compound which is different from the third organic compound.

8. The light-emitting device according to claim 1, wherein the third organic compound is a metal complex.

9. The light-emitting device according to claim 1, wherein the fourth organic compound is a coumarin derivative.

10. The light-emitting device according to claim 1, wherein an energy gap of the fourth organic compound is larger than an energy gap of the second light-emitting substance.

11. The light-emitting device according to claim 1, wherein an energy gap of the fourth organic compound is 3.0 eV or more.

12. The light-emitting device according to claim 1, wherein the third light-emitting layer has an electron-transporting property.

13. The light-emitting device according to claim 1,
wherein the third light-emitting layer includes the second light-emitting substance and a seventh organic compound,
wherein the seventh organic compound is included more than the second light-emitting substance, and
wherein the seventh organic compound has an electron-transporting property.

14. The light-emitting device according to claim 1, wherein a thickness of the layer for controlling carrier transfer is equal to or greater than 5 nm and equal to or less than 20 nm.

15. The light-emitting device according to claim 1,
wherein a highest occupied molecular orbital level (HOMO level) of the first organic compound is greater than or equal to −6.0 eV and less than or equal to −5.0 eV, and a lowest unoccupied molecular orbital level (LUMO level) of the first organic compound is greater than or equal to −3.0 eV and less than or equal to −2.0 eV, and
wherein a highest occupied molecular orbital level (HOMO level) of the second organic compound is greater than or equal to −6.0 eV and less than or equal to −5.0 eV, and a lowest unoccupied molecular orbital level (LUMO level) of the second organic compound is greater than or equal to −3.0 eV and less than or equal to −2.0 eV.

16. The light-emitting device according to claim 1, wherein the first organic compound and the second organic compound are each a tricyclic condensed aromatic compound, a tetracyclic condensed aromatic compound, a pentacyclic condensed aromatic compound, or a hexacyclic condensed aromatic compound.

17. The light-emitting device according to claim 1,
wherein a difference between a highest occupied molecular orbital level of the first organic compound and a highest occupied molecular orbital level of the second organic compound is 0.3 eV or less, and
wherein a difference between a lowest unoccupied molecular orbital level of the first organic compound and a lowest unoccupied molecular orbital level of the second organic compound is 0.3 eV or less.

18. The light-emitting device according to claim 1, wherein the first light-emitting element emits a blue light, the second light emitting element emits a green light, and the third light emitting element emits a red light.

19. The light-emitting device according to claim 1, wherein the light-emitting device is applied to an electronic device selected from the group consisting of a video camera, a digital camera, a goggle display, a navigation system, a car audio component stereos, an audio component stereo), a computer, a game machine, a mobile computer, a mobile phone, a portable game machine, an electronic book and image reproducing devices provided with a recording medium.

\* \* \* \* \*